(12) United States Patent
Choi et al.

(10) Patent No.: US 7,615,783 B2
(45) Date of Patent: Nov. 10, 2009

(54) THIN FILM TRANSISTOR ARRAY SUBSTRATE USING LOW DIELECTRIC INSULATING LAYER AND METHOD OF FABRICATING THE SAME

(75) Inventors: Joon-Hoo Choi, Seoul (KR); Wan-Shick Hong, Seoul (KR); Dae-Jin Kwon, Seongnam (KR); Kwan-Wook Jung, Suwon (KR); Sang-Gab Kim, Seoul (KR); Kyu-Ha Jung, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/436,073

(22) Filed: May 17, 2006

(65) Prior Publication Data

US 2006/0209223 A1 Sep. 21, 2006

Related U.S. Application Data

(62) Division of application No. 10/083,261, filed on Feb. 25, 2002, now Pat. No. 7,095,460.

(30) Foreign Application Priority Data

Feb. 26, 2001 (KR) ................................ 2001-9675
Sep. 28, 2001 (KR) .............................. 2001-60442

(51) Int. Cl.
*H01L 51/30* (2006.01)
(52) U.S. Cl. ................................ 257/59; 257/E51.006
(58) Field of Classification Search .......... 257/E51.005, 257/E51.006, 57, 59
See application file for complete search history.

(56) References Cited

U.S. PATENT DOCUMENTS 5,053,844 A 10/1991 Murakami et al.

(Continued)

FOREIGN PATENT DOCUMENTS

JP 64-044920 2/1989

(Continued)

OTHER PUBLICATIONS

Wolf et al. Silicon Processing for the VLSI Era. Lattice Press, vol. 1, 2nd Ed., p. 791.*

(Continued)

*Primary Examiner*—Minh-Loan T Tran
*Assistant Examiner*—W. Wendy Kuo
(74) *Attorney, Agent, or Firm*—F. Chau & Associates, LLC

(57) ABSTRACT

A thin film transistor array substrate is provided. The substrate includes an insulating substrate, a first signal line formed on the insulating substrate, a first insulating layer formed on the first signal line, a second signal line formed on the first insulating layer while crossing over the first signal line, a thin film transistor connected to the first and the second signal lines, a second insulating layer formed on the thin film transistor, the second insulating layer having dielectric constant about 4.0 or less, and the second insulating layer having a first contact hole exposing a predetermined electrode of the thin film transistor, and a first pixel electrode formed on the second insulating layer while being connected to the predetermined electrode of the thin film transistor through the first contact hole.

9 Claims, 67 Drawing Sheets

U.S. PATENT DOCUMENTS

| | | | |
|---|---|---|---|
| 5,187,602 A | | 2/1993 | Ikeda et al. |
| 5,530,581 A | * | 6/1996 | Cogan ........................ 359/265 |
| 5,646,756 A | | 7/1997 | Dohjo et al. |
| 5,920,084 A | | 7/1999 | Gu et al. |
| 5,933,208 A | | 8/1999 | Kim |
| 6,033,979 A | * | 3/2000 | Endo .......................... 438/622 |
| 6,038,002 A | | 3/2000 | Song |
| 6,052,162 A | | 4/2000 | Shimada et al. |
| 6,055,028 A | | 4/2000 | Nishi et al. |
| 6,097,454 A | | 8/2000 | Zhang et al. |
| 6,100,947 A | | 8/2000 | Katayama |
| 6,133,976 A | | 10/2000 | Kimura |
| 6,159,871 A | * | 12/2000 | Loboda et al. .............. 438/786 |
| 6,163,356 A | * | 12/2000 | Song et al. .................. 349/152 |
| 6,166,794 A | | 12/2000 | Sung |
| 6,195,138 B1 | | 2/2001 | Shimada et al. |
| 6,207,480 B1 | * | 3/2001 | Cha et al. ................... 438/149 |
| 6,208,399 B1 | | 3/2001 | Ohta et al. |
| 6,222,595 B1 | | 4/2001 | Zhang et al. |
| 6,271,543 B1 | | 8/2001 | Ohtani et al. |
| 6,303,963 B1 | * | 10/2001 | Ohtani et al. ............... 257/350 |
| 6,323,918 B1 | | 11/2001 | Yoshioka et al. |
| 6,335,211 B1 | * | 1/2002 | Lee ............................. 438/22 |
| 6,335,554 B1 | * | 1/2002 | Yoshikawa .................. 257/316 |

FOREIGN PATENT DOCUMENTS

| | | |
|---|---|---|
| JP | 2132419 | 5/1990 |
| JP | 03-149884 | 6/1991 |
| JP | 7198614 | 8/1995 |
| JP | 8328040 | 12/1996 |
| JP | 09-223804 | 8/1997 |
| JP | 10-056009 | 2/1998 |
| JP | 10-135480 | 5/1998 |
| JP | 10-163174 | 6/1998 |
| JP | 10-170949 | 6/1998 |
| JP | 10-270710 | 10/1998 |
| JP | 10-288796 | 10/1998 |
| JP | 11-316382 | 11/1999 |
| JP | 2000-049157 | 2/2000 |
| JP | 2000049157 | 2/2000 |
| JP | 2000-214475 | 8/2000 |
| JP | 2001-051297 | 2/2001 |
| JP | 2001-166338 | 6/2001 |
| JP | 2002-353465 | 12/2002 |
| JP | 2005-506711 | 3/2005 |
| KR | 1019990065725 | 8/1999 |
| KR | 1020000045888 | 7/2000 |
| KR | 10-2001-0001362 | 1/2001 |
| KR | 100311530 | 9/2001 |
| KR | 1999-0083412 | 12/2002 |
| WO | WO 00/59023 | 10/2000 |
| WO | WO 0075979 | 12/2000 |
| WO | WO 01/61737 | 8/2001 |

OTHER PUBLICATIONS

English Abstract for Publication No. 03-149884.
English Abstract for Publication No. 09-223804.
English Abstract for Publication No. 1019990065725.
English Abstract for Publication No. 1999-0083412.
English Abstract for Publication No. 10-056009.
English Abstract for Publication No. 10-135480.
English Abstract for Publication No. 10-163174.
English Abstract for Publication No. 10-170949.
English Abstract for Publication No. 10-288796.
English Abstract for Publication No. 11-316382.
English Abstract for Publication No. 2000-049157.
English Abstract for Publication No. 1020000045888.
English Abstract for Publication No. 2000-214475.
English Abstract for Publication No. 2001-051297.
English Abstract for Publication No. 2001-166338.
English Abstract for Publication No. 100311530.
English Abstract for Publication No. 2005-506711.
English Abstract for Publication No. 2002-353465.
English Abstract for Publication No. 10-270710.
English Abstract for Publication No. 64-044920.
English Abstract for Publication No. 03-149884, Jun. 26, 1991.
English Abstract for Publication No. 09-223804, Aug. 26, 1997.
English Abstract for Publication No. 1019990065725, Aug. 5, 1999.
English Abstract for Publication No. 1999-0083412, Nov. 25, 1999.
English Abstract for Publication No. 10-056009, Feb. 24, 1998.
English Abstract for Publication No. 10-135480, May 22, 1998.
English Abstract for Publication No. 10-163174, Jun. 19, 1998.
English Abstract for Publication No. 10-170949, Jun. 26, 1998.
English Abstract for Publication No. 10-288796, Oct. 27, 1998.
English Abstract for Publication No. 11-316382, Nov. 16, 1999.
English Abstract for Publication No. 2000-049157, Feb. 18, 2000.
English Abstract for Publication No. 1020000045888, Jul. 25, 2000.
English Abstract for Publication No. 2000-214475, Aug. 4, 2000.
English Abstract for Publication No. 2001-051297, Feb. 23, 2001.
English Abstract for Publication No. 2001-166338, Jun. 22, 2001.
English Abstract for Publication No. 100311530, Sep. 26, 2001.
English Abstract for Publication No. 2005-506711, Mar. 3, 2005.
English Abstract for Publication No. 2002-353465, Dec. 6, 2002.
English Abstract for Publication No. 10-270710, Oct. 9, 1998.
English Abstract for Publication No. 64-044920, Feb. 17, 1989.
English Abstract for Publication No.: JP2132419.
English Abstract for Publication No.: JP7198614.
English Abstract for Publication No.: JP8328040.
English Abstract for Publication No.: JP2000049157.

* cited by examiner

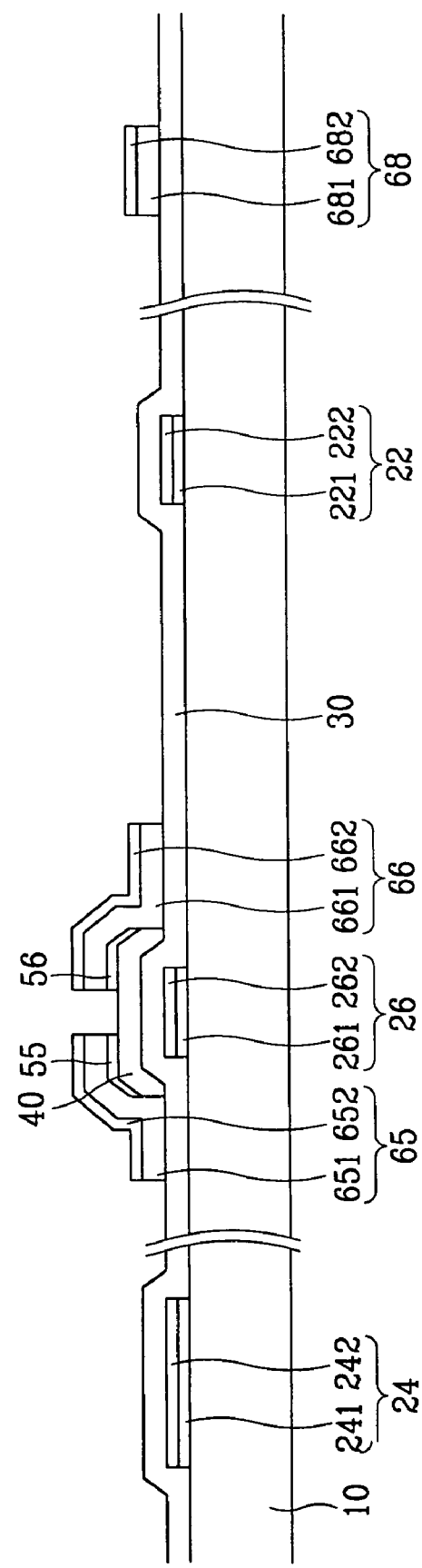

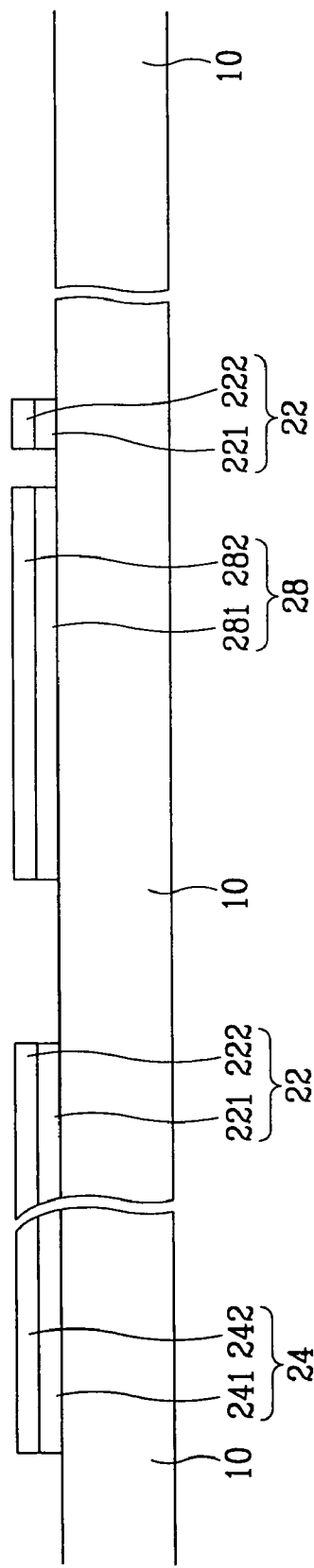

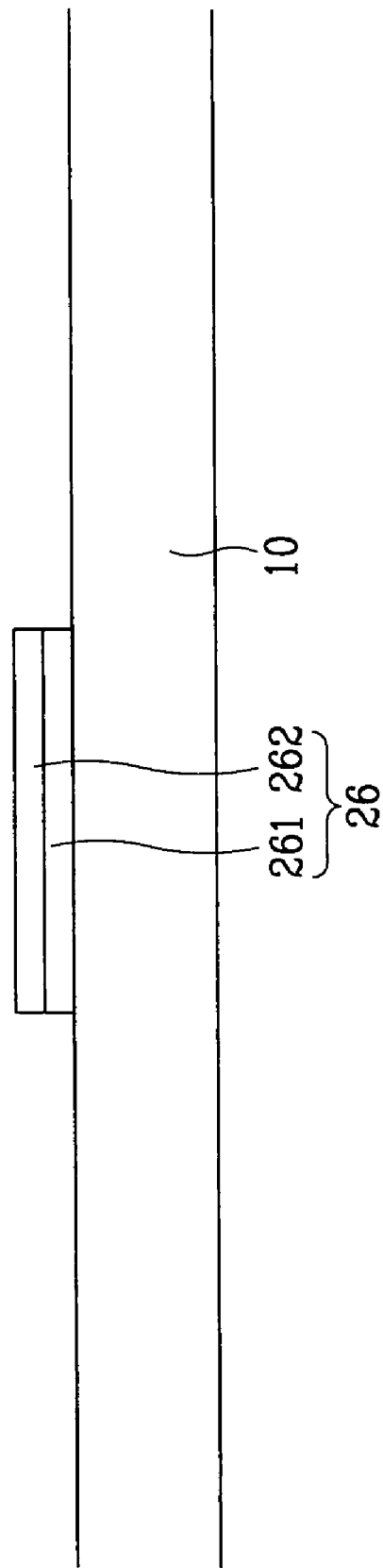

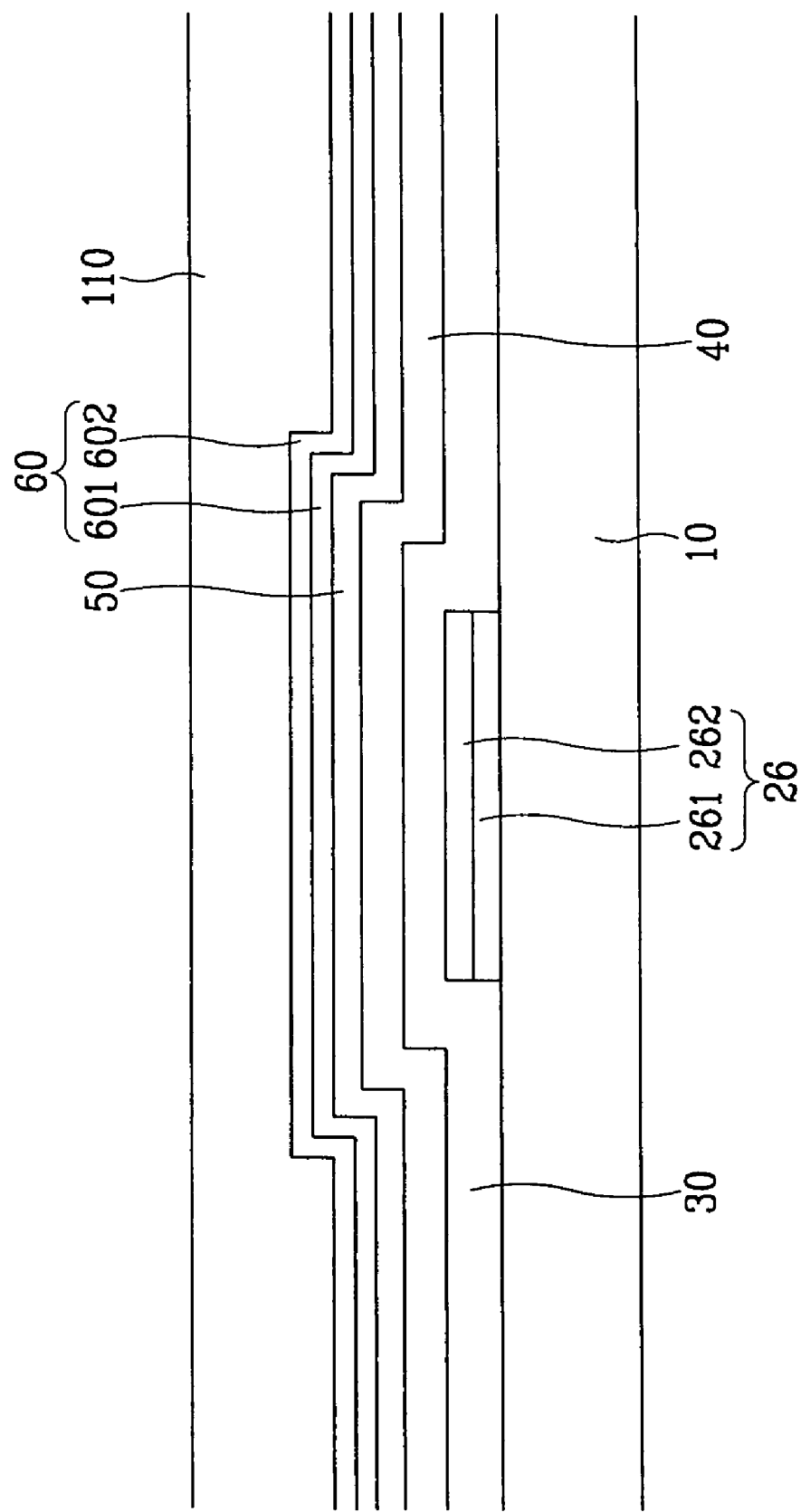

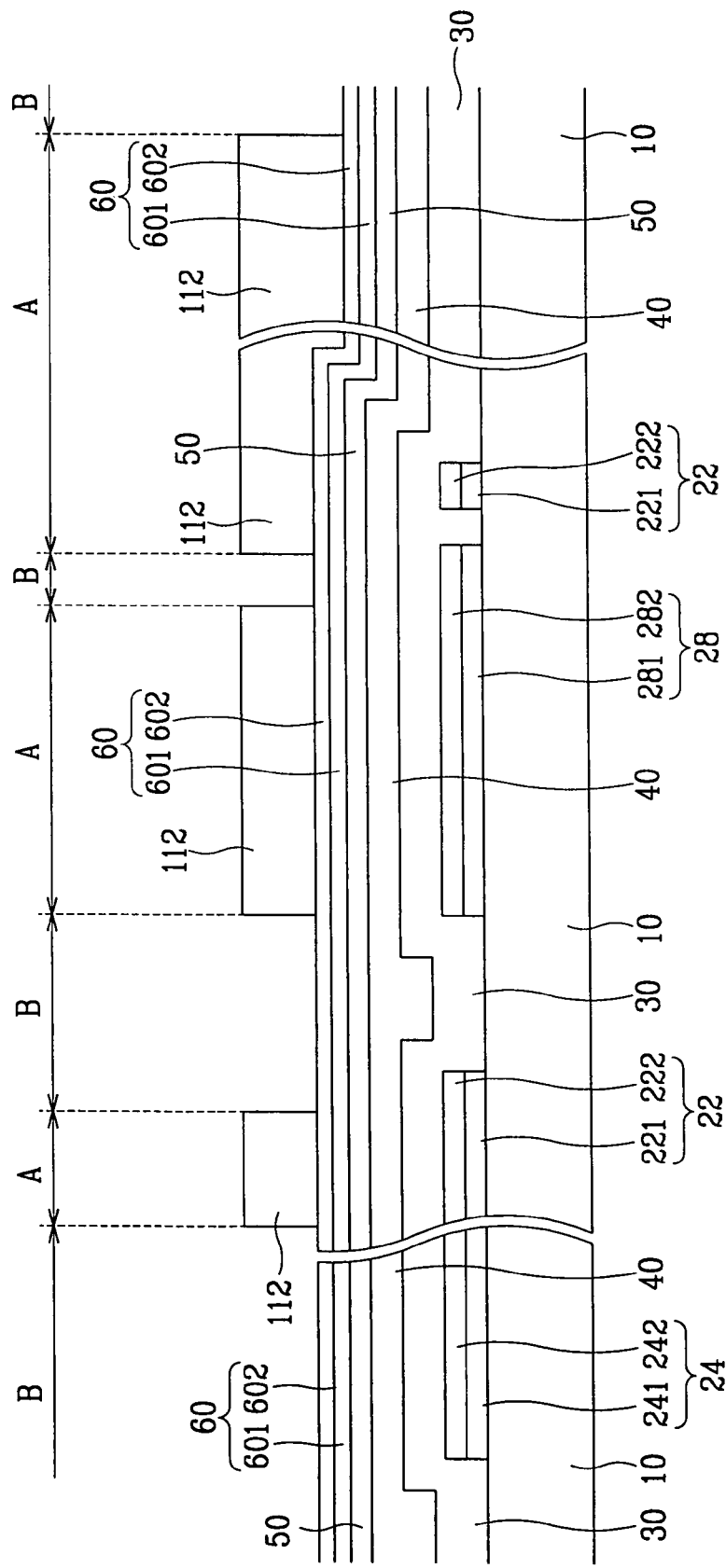

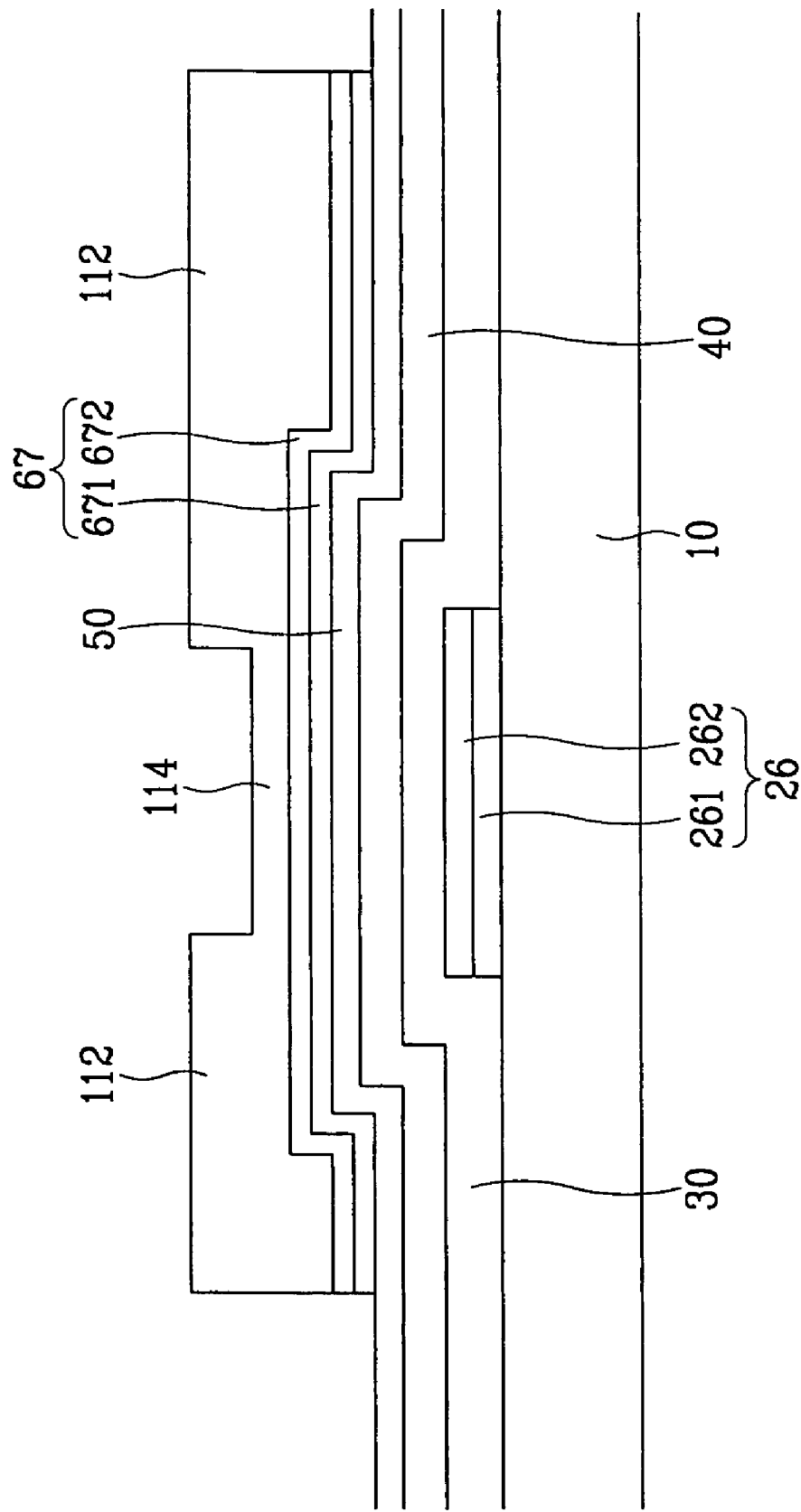

THIN FILM TRANSISTOR ARRAY SUBSTRATE USING LOW DIELECTRIC INSULATING LAYER AND METHOD OF FABRICATING THE SAME

CROSS-REFERENCE TO RELATED UNITED STATES APPLICATION

This application is a divisional of U.S. patent application Ser. No. 10/083,261, filed on Feb. 25, 2002 now U.S. Pat. No. 7,095,460.

BACKGROUND OF THE INVENTION (a) Field of the Invention

The present invention relates to a liquid crystal display and, more particularly a thin film transistor array substrate with a low dielectric insulating layer, and a method of fabricating the same.

(b) Description of the Related Art

Generally, a thin film transistor array substrate is used as a circuit substrate for independently driving the respective pixels in a liquid crystal display or an organic electroluminescence display. The thin film transistor array substrate has generally gate lines for carrying scanning signals, data lines for carrying picture signals, thin film transistors connected to the gate and the data lines, pixel electrodes connected to the thin film transistors, a gate insulating layer covering the gate lines, and a passivation layer covering the thin film transistors and the data lines. Each thin film transistor is formed with a gate electrode connected to the gate line, a channel-forming semiconductor layer, a source electrode connected to the data line, a drain electrode, a gate insulating layer, and a passivation layer. The thin film transistor functions as a switching circuit where the picture signal from the data line is transmitted to the pixel electrode in accordance with the scanning signal from the gate line.

Liquid crystal displays are now widely used by consumers and the larger the size and the higher the definition of the display, the more popular. However, signal deformation becomes a problem with the larger size and capacity of the displays due to increased parasitic capacitance. Furthermore, as demand for liquid crystal displays for notebook computers having reduced power consumption and increased demand for liquid crystal display TVs with increased brightness, the opening ratio of the liquid crystal displays need to be increased.

To increase the opening ratio, the pixel electrodes over the data line assembly have to be extended to overlap with the data line assembly. In such case, the parasitic capacitance between the pixel electrodes and the data lines is increased. To avoid increases in parasitic capacitance, there should be sufficient vertical spacing between the pixel electrodes and the data lines. To provide such spacing, a passivation layer is usually formed with an organic insulating film. However, there are problems associated with the formation of the passivation layer using the organic insulating film. First, the material cost is high because there is a large amount of material loss from the spin coating process. Second, the organic insulating film has limited thermostability. Third, the formation of layer using an organic insulating film involves high frequency of occurrence of impure particles. Fourth, the organic insulating film is weaker in adhesive strength with respect to the neighboring layers. Fifth, when pixel electrodes are formed on the passivation layer, there is a high chance of etching error. Accordingly, a need exists for a method and a thin film transistor array substrate having a high opening ratio but without the above problems.

SUMMARY OF THE INVENTION

A thin film transistor array substrate is provided, which includes: an insulating substrate; a first signal line formed on the insulating substrate; a first insulating layer formed on the first signal line; a second signal line formed on the first insulating layer while crossing over the first signal line; a thin film transistor connected to the first and the second signal lines; a second insulating layer formed on the thin film transistor, the second insulating layer having dielectric constant about 4.0 or less, and the second insulating layer having a first contact hole exposing a predetermined electrode of the thin film transistor; and a first pixel electrode formed on the second insulating layer while being connected to the predetermined electrode of the thin film transistor through the first contact hole.

According to an embodiment of the present invention, the first insulating layer includes a top layer and a bottom layer, the bottom layer has dielectric constant about 4 or less, and a top layer is a silicon nitride layer. The first pixel electrode is formed with an electrically conductive and optically opaque material. The second insulating layer has a pattern of protrusion and depression. The second insulating layer is formed with an a-Si:C:O layer or an a-Si:O:F layer. The a-Si:C:O layer is formed through plasma enhanced chemical vapor deposition (PECVD) using a gaseous material selected from the group consisting of $SiH(CH_3)_3$, $SiO_2(CH_3)_4$, $(SiH)_4O_4(CH_3)_4$, and $Si(C_2H_5O)_4$ and an oxide agent of $N_2O$ or $O_2$. The a-Si:O:F layer is formed through plasma enhanced chemical vapor deposition (PECVD) by introducing a material selected from the group consisting of $SiH_4$ and $SiF_4$ with $CF_4$ and $O_2$ added. Preferably, the second insulating layer has a dielectric constant of about 2 to about 4.

According to an embodiment of the present invention, the first signal line includes a first alloy layer and a second alloy layer, the first alloy layer is a Cr alloy layer or a Mo alloy layer and the second alloy layer is a Al alloy layer or a Ag alloy layer. The first pixel electrode is made of an optically transparent and electrically material. The transparent conductive material is indium tin oxide (ITO) or indium zinc oxide (IZO).

According to an embodiment of the present invention, the thin film transistor array substrate further includes: a third insulating layer formed on the first pixel electrode having dielectric constant about 4.0 or less, the third insulating layer having a second contact hole exposing a predetermined portion of the first pixel electrode; and a second pixel electrode formed on the third insulating layer, the third insulating layer is formed with an electrically conductive and optically opaque material while being connected to the predetermined portion of the first pixel electrode through the second contact hole; wherein the first pixel electrode is formed with an optically transparent and electrically conductive material, and the second pixel electrode has a predetermined opening portion capable of passing light transmitted through the first pixel electrode.

A thin film transistor array substrate is also provided, which includes: a data line assembly formed on an insulating substrate, the data line assembly including data lines; a plurality of color filters formed on the insulating substrate, each of the plurality of color filters including a red color filter, a green color filter, and a blue color filter; a buffer layer formed on the data line assembly and the color filters, the buffer layer having a first contact hole exposing a predetermined portion of the data line assembly; a gate line assembly formed on the buffer layer, the gate line assembly including gate lines crossing over the data lines while defining pixel regions, and gate electrodes connected to the gate lines; a gate insulating layer formed on the gate line assembly, the gate insulating layer having a second contact hole partially exposing the first contact hole; a semiconductor pattern formed on the gate insulating layer over the gate electrodes; and a pixel line assembly including pixel electrodes, drain electrodes and source electrodes, the source electrodes connected to the data lines through the first and the second contact holes, the pixel line assembly having a portion witch contacts the semiconductor pattern, the drain electrodes facing the source electrodes over the semiconductor pattern, and the pixel electrodes connected to the drain electrodes.

According to an embodiment of the present invention, the semiconductor pattern includes a first amorphous silicon layer with a predetermined band gap, and a second amorphous silicon layer with a band gap lower than the band gap of the first amorphous silicon layer.

According to an embodiment of the present invention, the thin film transistor array substrate further includes light absorption members formed at the same plane as the data lines with the same material as the data lines while being placed corresponding to the semiconductor pattern. The light absorption members are extended toward the gate lines. The buffer layer has dielectric constant about 4.0 or less. Preferably, the buffer layer has a dielectric constant of about 2 to about 4. The buffer layer is formed with an a-Si:C:O layer or an a-Si:O:F layer.

A thin film transistor array substrate for a liquid crystal display is also provided, which includes: an insulating substrate; a gate line assembly formed on the substrate, the gate line assembly including gate lines, gate electrodes, and gate pads; a gate insulating layer formed on the gate line assembly, the gate insulating layer having contact holes exposing the gate pads; a semiconductor pattern formed on the gate insulating layer; an ohmic contact pattern formed on the semiconductor pattern; a data line assembly formed on the ohmic contact pattern while having substantially the same shape as the ohmic contact pattern, the data line assembly including source electrodes, drain electrodes, data lines, and data pads; a passivation pattern formed on the data line assembly having dielectric constant about 4.0 or less, the passivation pattern having contact holes exposing the gate pads, the data pads, and the drain electrodes; and a transparent electrode pattern electrically connected to the gate pads, the data pads, and the drain electrodes.

According to an embodiment of the present invention, the thin film transistor array substrate further includes: storage capacitor lines formed at the same plane as the gate line assembly; a storage capacitor semiconductor pattern overlapped with the storage capacitor lines while being placed at the same plane as the semiconductor pattern; a storage capacitor ohmic contact pattern formed on the storage capacitor semiconductor pattern while having substantially the same outline as the storage capacitor semiconductor pattern; and a storage capacitor conductive pattern formed on the storage capacitor ohmic contact pattern while having substantially the same outline as the storage capacitor semiconductor pattern; wherein the storage capacitor conductive pattern is partially connected to the transparent electrode pattern. Preferably, the passivation pattern has a dielectric constant of about 2 to about 4. The passivation pattern is formed with an a-Si:C:O layer or an a-Si:O:F layer.

A method of fabricating a thin film transistor array substrate is also provided, the method includes the steps of: forming a gate line assembly, the gate line assembly including gate lines, gate electrodes connected to the gate lines, and gate pads connected to the gate lines; forming a gate insulating layer; forming a semiconductor layer; forming a data line assembly through depositing and patterning a conductive layer, the data line assembly including data lines crossing over the gate lines, data pads connected to the data lines, source electrodes connected to the data lines while being placed adjacent to the gate electrodes, and drain electrodes facing the source electrodes around the gate electrodes; forming a passivation layer having a dielectric constant about 4.0 or less; patterning the gate insulating layer together with the passivation layer to thereby form contact holes exposing the gate pads, the data pads, and the drain electrodes; and depositing and patterning a transparent conductive layer to thereby form subsidiary gate pads connected to the gate pads, subsidiary data pads connected to the data pads, and pixel electrodes connected to the drain electrodes.

According to an embodiment of the present invention, the passivation layer is formed through PECVD using a gaseous material selected from the group consisting of $SiH(CH_3)_3$, $SiO_2(CH_3)_4$ and $(SiH)_4O_4(CH_3)_4$ and an oxide agent of $N_2O$ or $O_2$. The passivation layer is formed through PECVD using a gaseous material selected from the group consisting of $SiH_4$ and $SiF_4$ with $CF_4$ and $O_2$ added. The data line assembly and the semiconductor layer are formed through photolithography using a photoresist pattern with a first portion having a predetermined thickness, a second portion having a thickness larger than the thickness of the first portion, and a third portion having a thickness smaller than the thickness of the first portion. The first photoresist pattern portion is placed between the source and the drain electrodes, and the second photoresist pattern portion is placed over the data line assembly. The step of forming the gate insulating layer includes the sub-steps of first depositing a CVD layer having dielectric constant about 4.0 or less, and second depositing a silicon nitride layer, the first and second sub-steps being performed in a vacuum state.

A method of fabricating a thin film transistor array substrate is also provided, the method includes the steps of: (a) forming a data line assembly on a substrate, the data line assembly including data lines; (b) forming color filters of red, green, and blue on the substrate; (c) forming a buffer layer having dielectric constant about 4.0 or less such that the buffer layer covers the data line assembly and the color filters; (d) forming a gate line assembly on the insulating layer, the gate line assembly including gate lines and gate electrodes; (e) forming a gate insulating layer such that the gate insulating layer covers the gate line assembly; (f) forming an ohmic contact pattern and a semiconductor pattern on the gate insulating layer while forming first contact holes at the gate insulating layer and the buffer layer such that the contact holes partially expose the data lines; (g) forming a pixel line assembly, the pixel line assembly including source and drain electrodes formed on the ohmic contact pattern at the same plane while being separated from each other, and pixel electrodes connected to the drain electrodes; and (h) dividing the ohmic contact pattern into two pattern parts through removing the portions of the ohmic contact pattern exposed between the source and the drain electrodes.

According to an embodiment of the present invention, the (f) step includes the sub-steps of: sequentially depositing an amorphous silicon layer and an impurities-doped amorphous silicon layer onto the gate insulating layer; forming a photoresist pattern such that the photoresist pattern has a first portion covering a predetermined area of the gate electrode with a predetermined thickness, and a second portion covering the remaining area except for the regions of first contact holes to be formed later with a thickness smaller than the thickness of the first portion; etching the impurities-doped amorphous silicon layer, the amorphous silicon layer, the gate insulating layer and the buffer layer using the first and second portions of the photoresist pattern as a mask to thereby form the first contact holes; removing the second portion of the photoresist pattern; etching the impurities-doped amorphous silicon layer and the amorphous silicon layer using the first portion of the photoresist pattern as a mask to thereby form the semiconductor pattern and the ohmic contact pattern; and removing the first portion of the photoresist pattern. Preferably, the buffer layer has a dielectric constant of about 2 to about 4.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 5B is a cross sectional view of the thin film transistor array substrate taken along the Vb-Vb' line of FIG. 5A;

FIGS. 10B and 10C are cross sectional views of the thin film transistor array substrate taken along the Xb-Xb' line and the Xc-Xc' line of FIG. 10A, respectively;

FIGS. 11A and 11B illustrate steps of fabricating the thin film transistor array substrate following the steps illustrated in FIGS. 10B and 10C;

FIGS. 12B and 12C are cross sectional views of the thin film transistor array substrate taken along the XIIb-XIIb' line and the XIIc-XIIc' line of FIG. 12A, respectively;

FIGS. 13A to 15B illustrate the steps of fabricating the thin film transistor array substrate following the step illustrated in FIG. 12A;

DETAILED DESCRIPTION OF PREFERRED EMBODIMENTS

Preferred embodiments of this invention will be explained with reference to the accompanying drawings.

Figure 1:
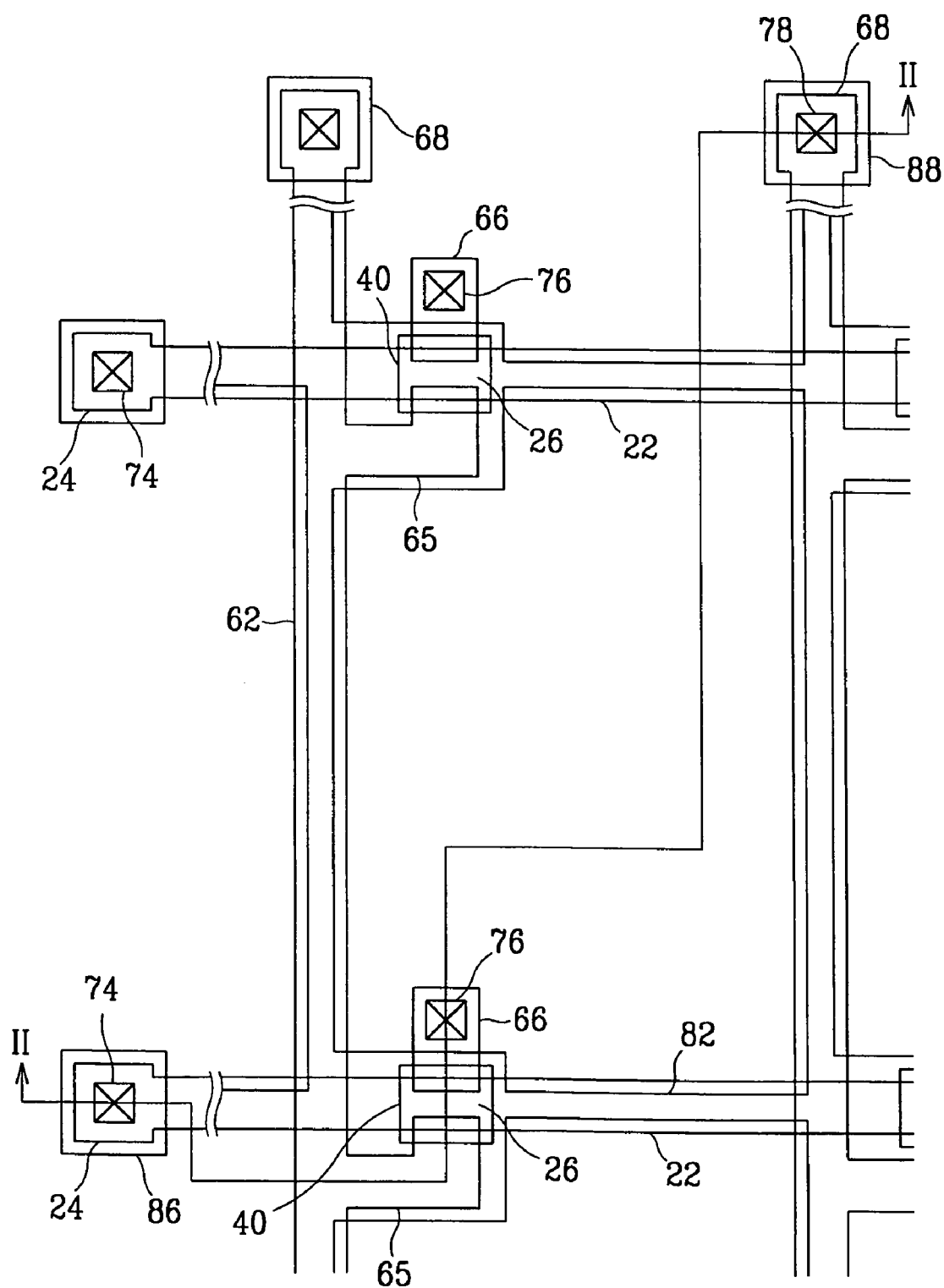
FIG. 1 is a plan view of a thin film transistor array substrate for a liquid crystal display according to a preferred embodiment of the present invention.
Figure 2:
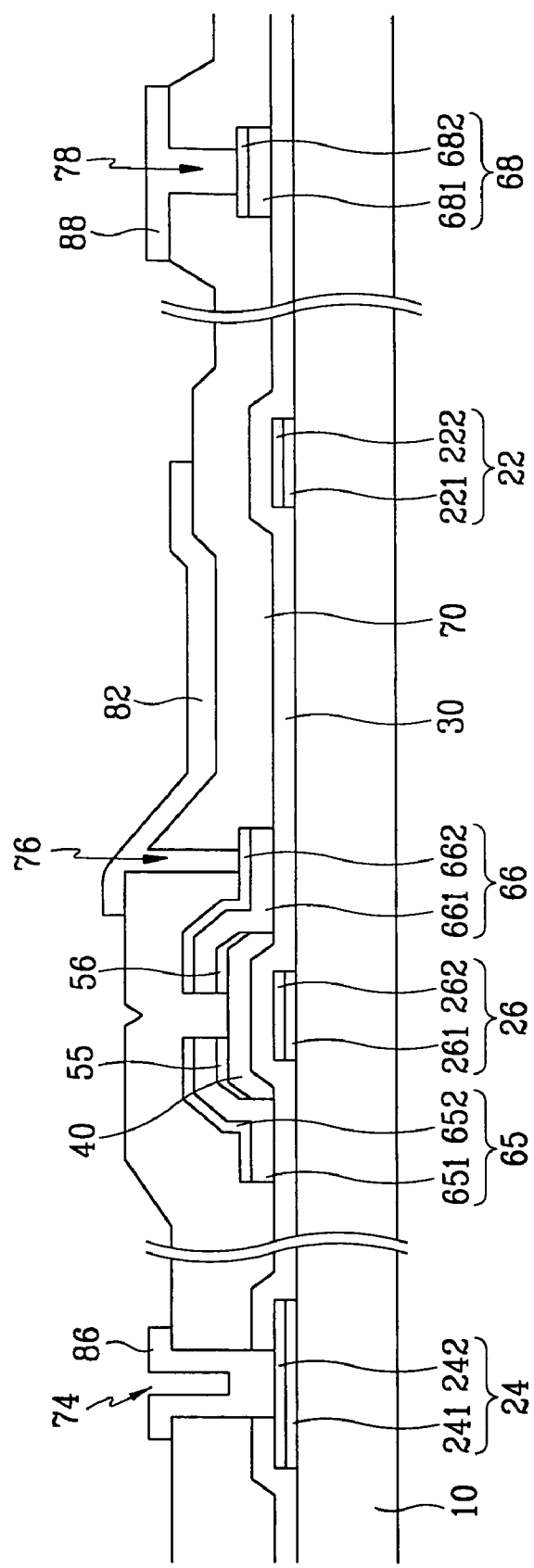
FIG. 2 is a cross sectional view of the thin film transistor array substrate taken along the II-II' line of FIG. 1.

FIG. 1 is a plan view of a thin film transistor array substrate for a liquid crystal display according to a first preferred embodiment of the present invention, and FIG. 2 is a cross sectional view of the thin film transistor array substrate taken along the II-II line of FIG. 1.

A gate line assembly is formed on an insulating substrate 10 with a double-layered structure. The gate line assembly has first layers 221, 241, and 261 formed with chrome Cr alloy or Mo alloy, and second layers 222, 242 and 262 formed with aluminum Al or silver Ag alloy. The gate line assembly includes gate lines 22 proceeding in the horizontal direction, gate pads 24 connected to the gate lines 22 to receive gate signals from the outside and transmit the gate signals to the gate lines 22, and gate electrodes 26 connected to the gate lines 22 to function as parts of thin film transistors.

A gate insulating layer 30 is formed on the substrate 10 with silicon nitride SiNx to cover the gate line assembly.

A semiconductor layer 40 is formed on the gate insulating layer 30 over the gate electrodes 26 with amorphous silicon while having the shape of an island. Ohmic contact layers 55 and 56 are formed on the semiconductor layer 40 with silicide, or n$^+$ hydrogenated amorphous silicon where n-type impurities are doped at high concentration.

A data line assembly is formed on the ohmic contact layers 55 and 56 and the gate insulating layer 30 with a double-layered structure. The data line assembly has first layers 651, 661, and 681 formed with Cr alloy or Mo alloy, and second layers 652, 662, and 682 formed with Al alloy or Ag alloy. The data line assembly includes data lines 62 proceeding in the vertical direction, source electrodes 65 branched from the data lines 62 while being extended over the one-sided portion of the ohmic contact layer 55, data pads 68 connected to the one-sided ends of the data lines 62 to receive picture signals from the outside, and drain electrodes 66 separated from the source electrodes 65 around the gate electrodes 26 while being placed on the other-sided portion of the ohmic contact layer 56. The data lines 62 cross over the gate lines 22 while defining pixel regions.

A passivation layer 70 is formed with a low dielectric material on the data line assembly and the semiconductor layer 40. According to a preferred embodiment of the present invention, the low dielectric material is made of a layer of amorphous(a)-Si:C:O or a-Si:O:F formed by way of a plasma enhanced chemical vapor deposition (PECVD) process. The a-Si:C:O or a-Si:O:F layer has a dielectric constant of about 4 or less, preferably about 2 to about 4. As the passivation layer 70 has a lower dielectric constant, there is minimal or no parasitic capacitance, even if the passivation layer was thin. The passivation layer 70 also has good adhesion characteristics and step coverage characteristics in relation to other layers. Further, the passivation layer has excellent thermostabiliy compared to that based on a conventional organic insulating film. In addition, the layer of a-Si:C:O or a-Si:O:F exhibits an advantage in the processing time as the deposition rate or etching rate related thereto is faster by about four to about ten times as compared to the processing time of a conventional passivation layer such as a silicon nitride layer.

The passivation layer 70 has contact holes 76 and 78 for exposing the drain electrodes 66 and the data pads 68, respectively, and contact holes 74 for exposing the gate pads 24 together with the gate insulating layer 30. The contact holes 74 and 78 exposing the pads 24 and 68 can be formed with various shapes, for example, an angled shape or a circular shape. The area of the contact holes 74 and 78 is about 2 mm×60 μm or less, preferably in the range of about 0.5 mm×15 μm to about 2 mm×60 μm.

Pixel electrodes 82 are formed on the passivation layer 70 at the pixel regions while being electrically connected to the drain electrodes 66 through the contact holes 76. Furthermore, subsidiary gate and data pads 86 and 88 are formed on the passivation layer 70 while being connected to the gate and the data pads 24 and 68, respectively, through the contact holes 74 and 78, respectively. The pixel electrodes 82 and the subsidiary gate and data pads 86 and 88 are made of a transparent conductive material such as indium tin oxide (ITO) or indium zinc oxide (IZO).

As shown in FIGS. 1 and 2, the pixel electrodes 82 are partially overlapped with the gate lines 22 to form storage capacitors (not shown). In case a storage capacitance is shorter than required, a storage capacitor line assembly (not shown) can be additionally formed at the same plane as the gate line assembly.

The pixel electrodes 82 are partially overlapped with the data lines 62 while optimizing opening ratios. Even if the overlapping of the pixel electrodes 82 and the data lines 62, as the passivation layer 70 has a low dielectric property, the parasitic capacitance between the pixel electrodes 82 and the data lines 62 is extremely small.

A method of fabricating the thin film transistor array substrate will be now explained with reference to FIG. 3A to 7B.

Figure 3A:
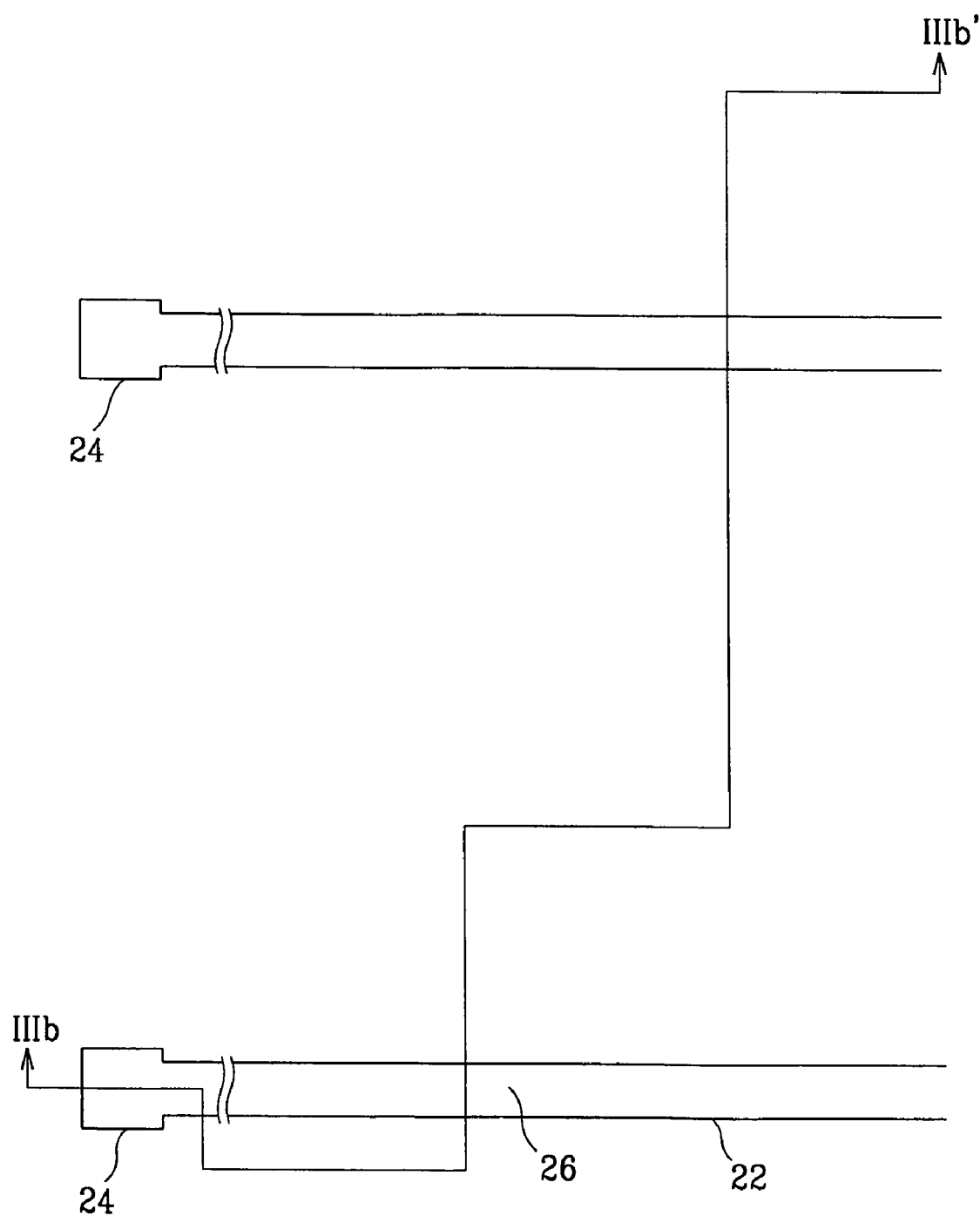
FIGS. 3A, 4A, 5A, and 6A sequentially illustrate the steps of fabricating the thin film transistor array substrate shown in FIG. 1.
Figure 3B:
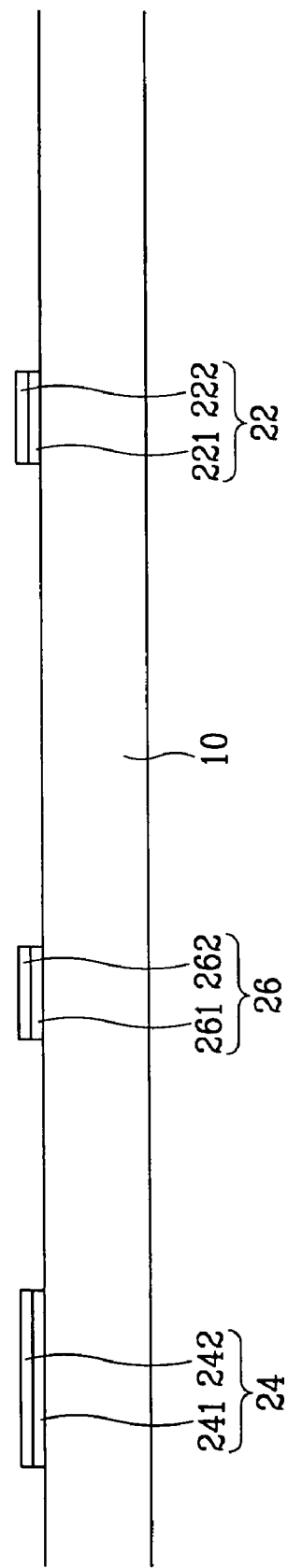
FIG. 3B is a cross sectional view of the thin film transistor array substrate taken along the IIIb-IIIb' line of FIG. 3A.

Referring to FIGS. 3A and 3B, a Cr alloy or a Mo alloy layer is deposited onto a substrate 10 to form a first layer 221, 241, and 261 for a gate line assembly, and an Al alloy or a Ag alloy layer is formed onto the first layer to form a second layer 222, 242, and 262 for the gate line assembly. The first and second layers are patterned to thereby form a gate line assembly proceeding in the horizontal direction. The gate line assembly includes gate lines 22, gate electrodes 26, and gate pads 24.

In case the first layer 221, 241, and 261 is formed with a Mo alloy and the second layer 222, 242 and 262 with a Ag alloy, the two layers are etched with a Ag alloy etching materials where phosphoric acid, nitric acid, acetic acid, and deionized water are mixed together. Therefore, the double-layered gate line assembly can be formed through only one etching process. As the etching ratio of the Ag alloy by way of a mixture of phosphoric acid, nitric acid, acetic acid, and deionized water is greater than that of the Mo alloy, a tapering angle of about 30° required for the gate line assembly can be obtained.

Figure 4A:
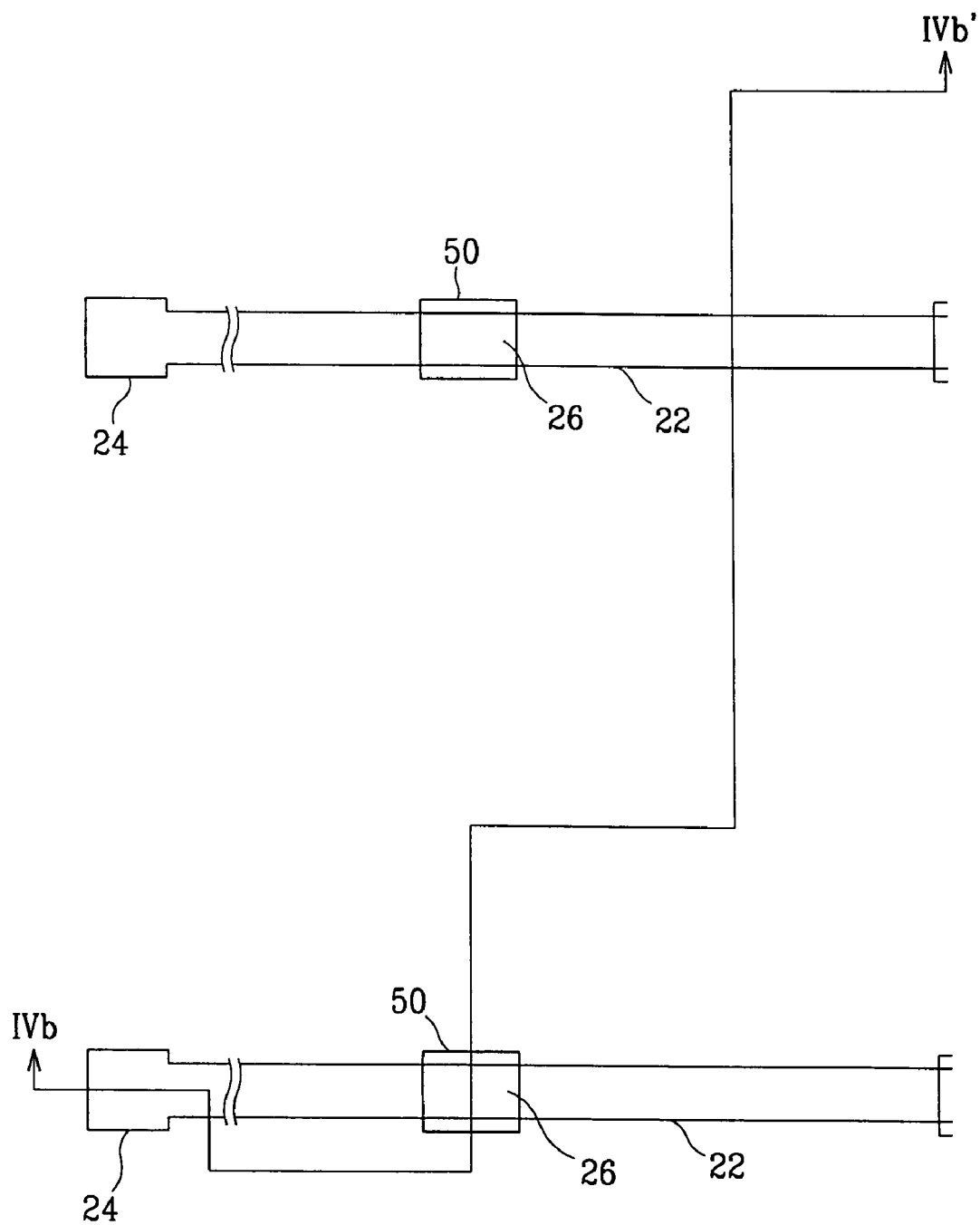
Figure 4B:
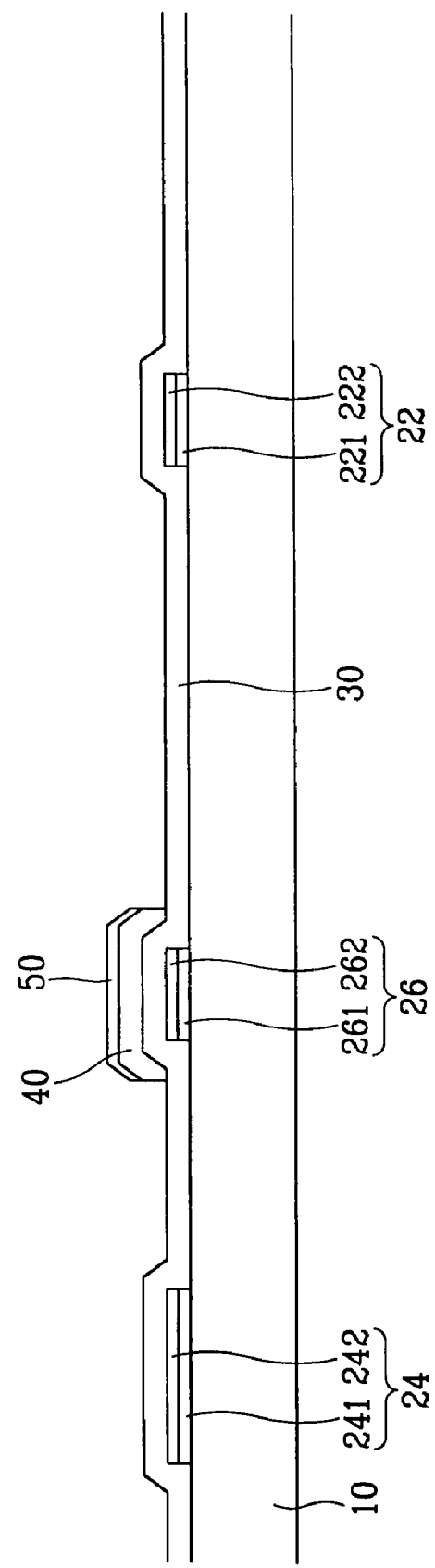
FIG. 4B is a cross sectional view of the thin film transistor array substrate taken along the IVb-IVb' line of FIG. 4A.

Thereafter, referring to FIGS. 4A and 4B, a gate insulating layer 30, a semiconductor film (not shown) and a doped amorphous silicon film (not shown) are sequentially deposited onto the substrate 10. According to an embodiment of the present invention, the gate insulating layer 30 is preferably formed of a silicon nitride, and the semiconductor film is preferably formed of an amorphous silicon. The semiconductor film and the doped amorphous silicon-film are etched through photolithography to thereby form a semiconductor layer 40 having an island shape and an ohmic contact layer 50 on the gate insulating layer 30 over the gate electrode 26.

Figure 5A:
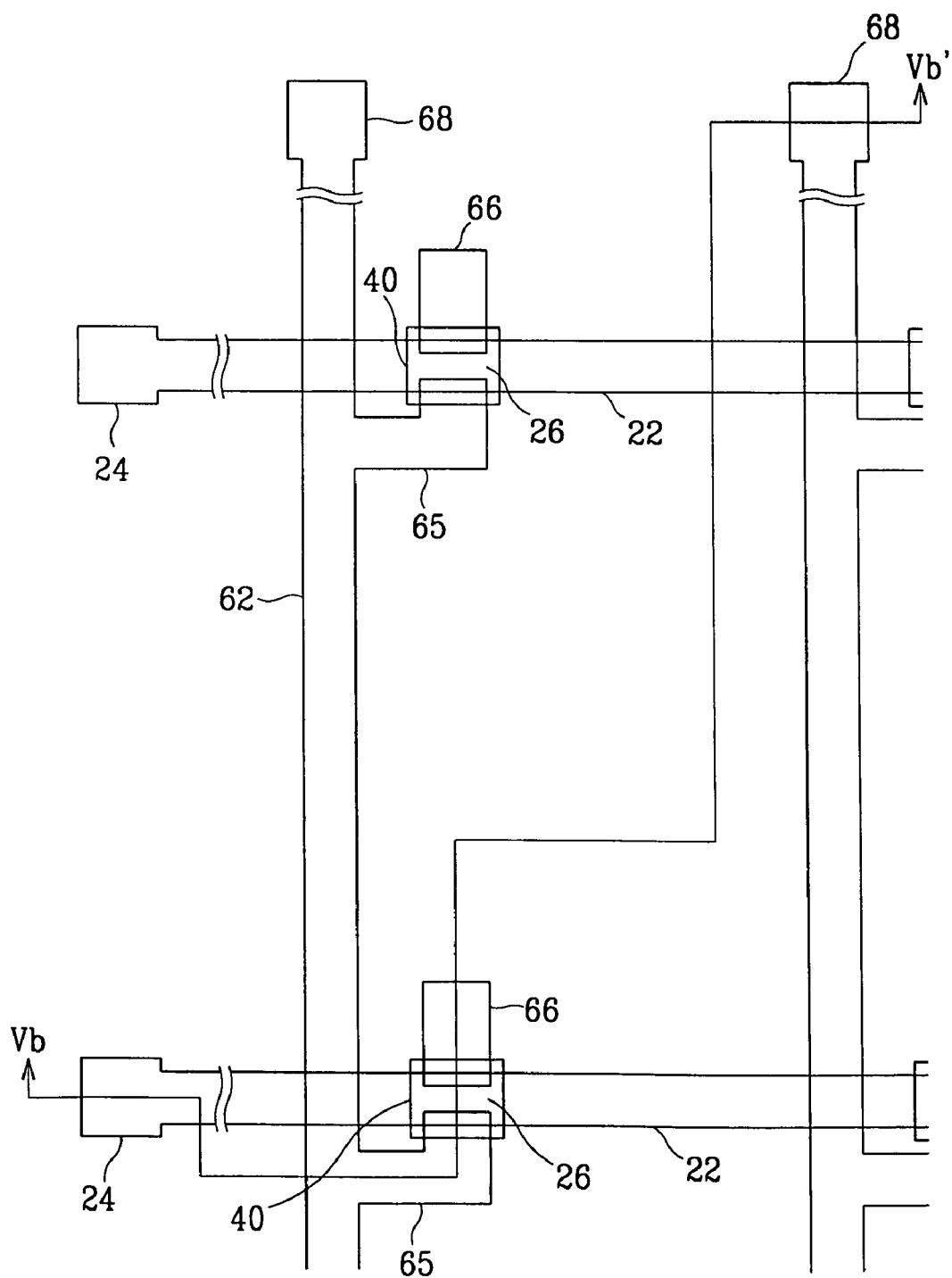

Referring to FIGS. 5A and 5B, a Cr alloy (not shown) layer or a Mo alloy layer (not shown) is deposited onto the gate insulating layer 30 and the ohmic contact layer 50 to form first layers 651, 661, and 681 for a data line assembly, and an Al alloy layer or a Ag alloy layer is formed onto the first layers 651, 661, and 681 to form second layers 652, 662, and 682 for the data line assembly. The first layers 651, 661, and 681 and the second layers 652, 662, and 682 are patterned through photolithography to thereby form a data line assembly. The data line assembly includes data lines 62 proceeding in the vertical direction while crossing over the gate lines 22, source electrodes 65 branched from the data lines 62 while being extended over the gate electrodes 26, data pads 68 connected to one-sided ends of the data lines 62 to receive picture signals from the outside, and drain electrodes 66 separated from the source electrodes 65 around the gate electrodes 26 while facing the source electrode 65.

The ohmic contact layer 50 exposed through the data line assembly is then etched, and divided into two portions 55 and 56 around the gate electrode 26 while exposing the semiconductor layer 40. The exposed portion of the semiconductor layer 40 preferably includes oxygen plasma to stabilize the surface thereof.

Figure 6A:
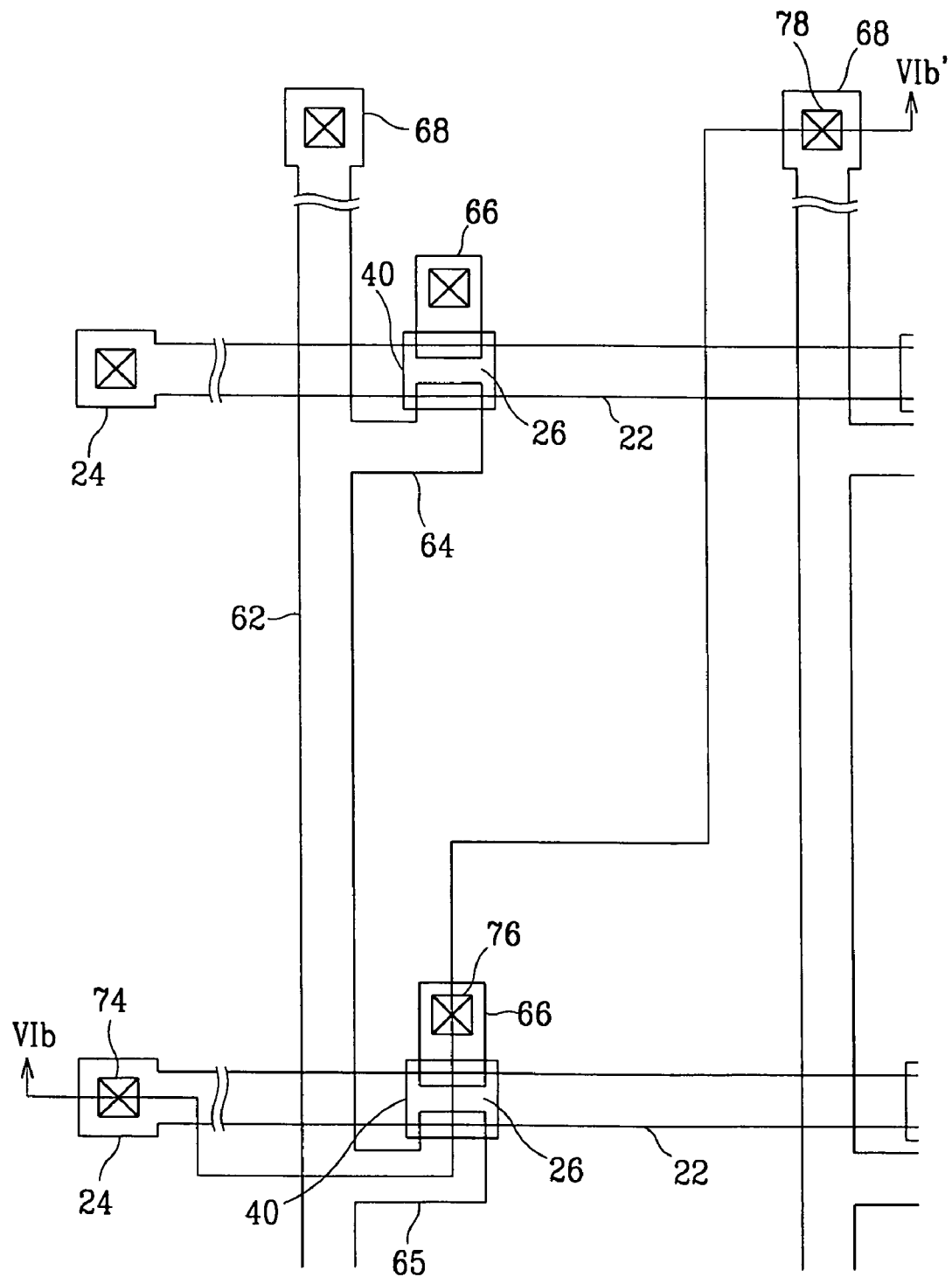
Figure 6B:
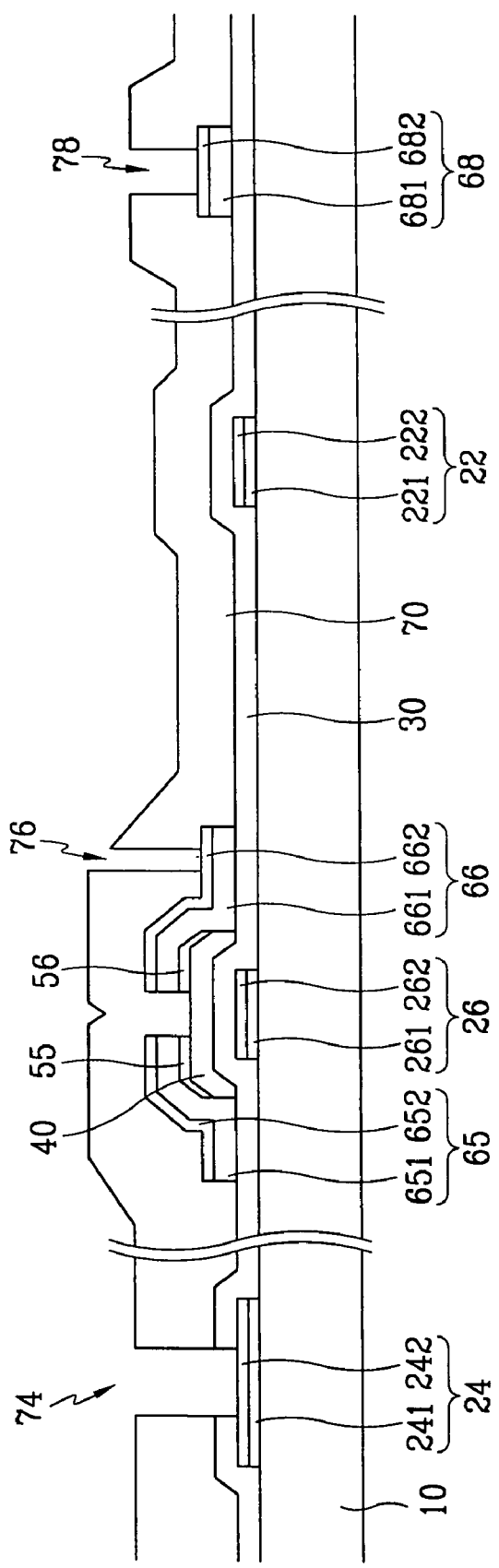
FIG. 6B is a cross sectional view of the thin film transistor array substrate taken along the VIb-VIb' line of FIG. 6A.

Referring to FIGS. 6A and 6B, an a-Si:C:O or a-Si:O:F layer is grown through a chemical vapor deposition (CVD) process to thereby form a passivation layer 70. In the case of the a-Si:C:O layer, the deposition thereof is made by using a gaseous material such as $SiH(CH_3)_3$, $SiO_2(CH_3)_4$, $(SiH)_4O_4$ $(CH_3)_4$, and $Si(C_2H_5O)_4$ as a basic source while introducing a mixture of an oxide agent such as $N_2O$ or $O_2$, and Ar or He. In the case of the a-Si:O:F layer, the deposition thereof is made while introducing a mixture of $SiH_4$ or $SiF_4$ with $O_2$. In this case, $CF_4$ is added thereto as a subsidiary source for fluorine.

Thereafter, the passivation layer 70 is patterned together with the gate insulating layer 30 to thereby form first contact holes 76, second contact holes 74, and third contact holes 78 for exposing the gate pads 24, the drain electrodes 66, and the data pads 68, respectively. The patterning process is processed until the second layer 242 of the gate pads 24, the second layer 662 of the drain electrodes 662, and the second layer 682 of the data pads are exposed. The first, second, and third contact holes 76, 74, and 78 can be formed with an angled or circular shape. The area of the contact holes 74 and 78 exposing the pads 24 and 68 is about 2 mm×60 μm or less, preferably in the range of about 0.5 mm×15 μm to about 2 mm×60 μm.

Finally, referring back to in FIGS. 1 and 2, an ITO or IZO layer is deposited, and etched through photolithography to thereby form pixel electrodes 82, subsidiary gate pads 86, and subsidiary data pads 88. The pixel electrodes 82 are connected to the drain electrodes 66 through the first contact holes 76. The subsidiary gate and data pads 86 and 88 are connected to the gate and data pads 24 and 68 through the second and third contact holes 74 and 78, respectively. According to an embodiment of the present invention, a nitrogen gas is preferably used for pre-heating the substrate 10 before forming the ITO or IZO layer. This is to prevent a metallic oxide layer from being formed on the gate pads 24, the drain electrodes 66, and the data pads 68 exposed through the contact holes 74, 76 and 78.

According to an embodiment of the present invention, the passivation layer 70 is formed through depositing a low dielectric material based on a-Si:C:O or a-Si:O:F by way of PECVD. In this way, parasitic capacitance is minimal while the opening ratio is optimized. Furthermore, the rate of deposition and patterning processes is quicker and processing time is reduced.

Figure 7:
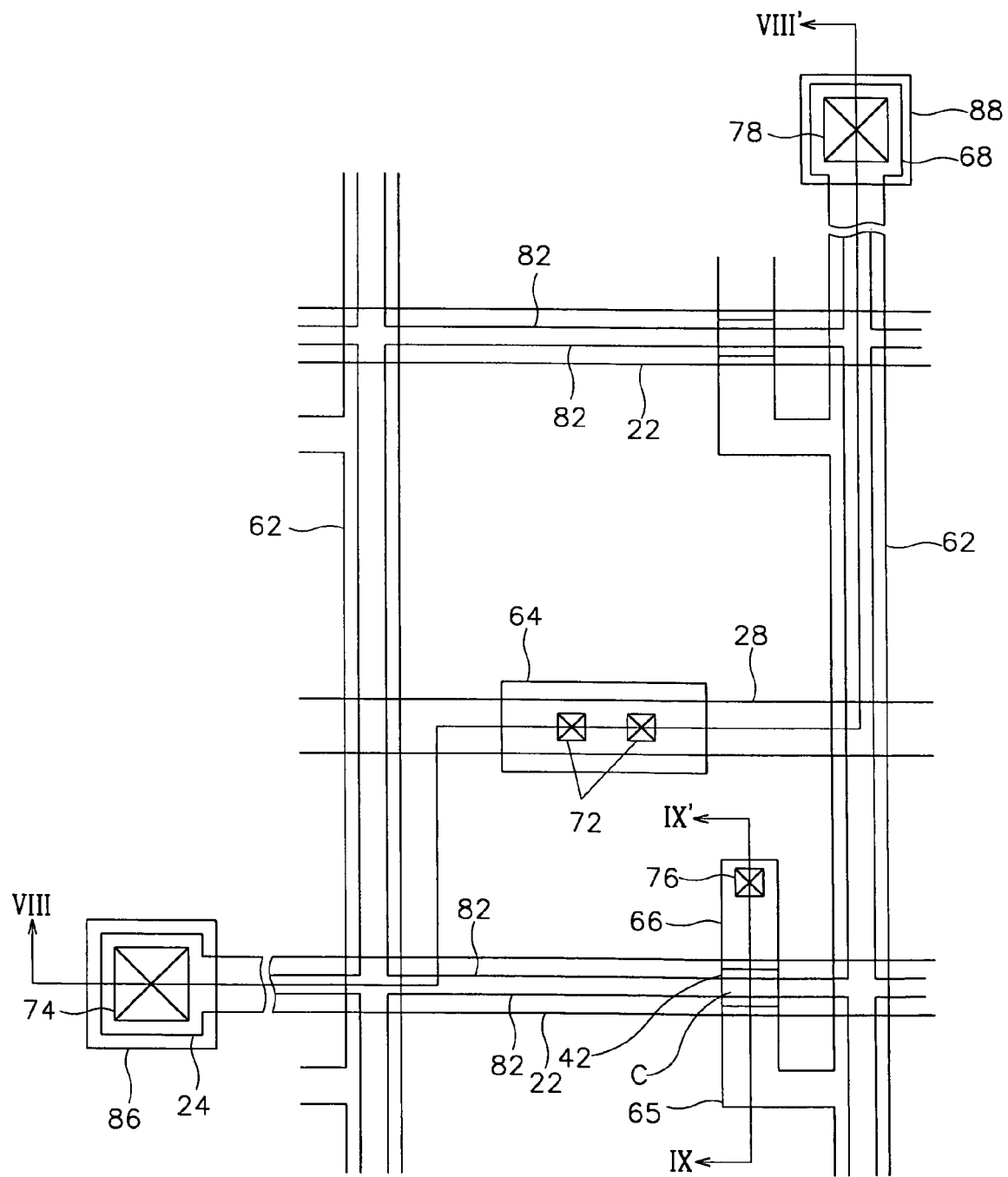
FIG. 7 is a plan view of a thin film transistor array substrate for a liquid crystal display according to another preferred embodiment of the present invention.
Figure 8:
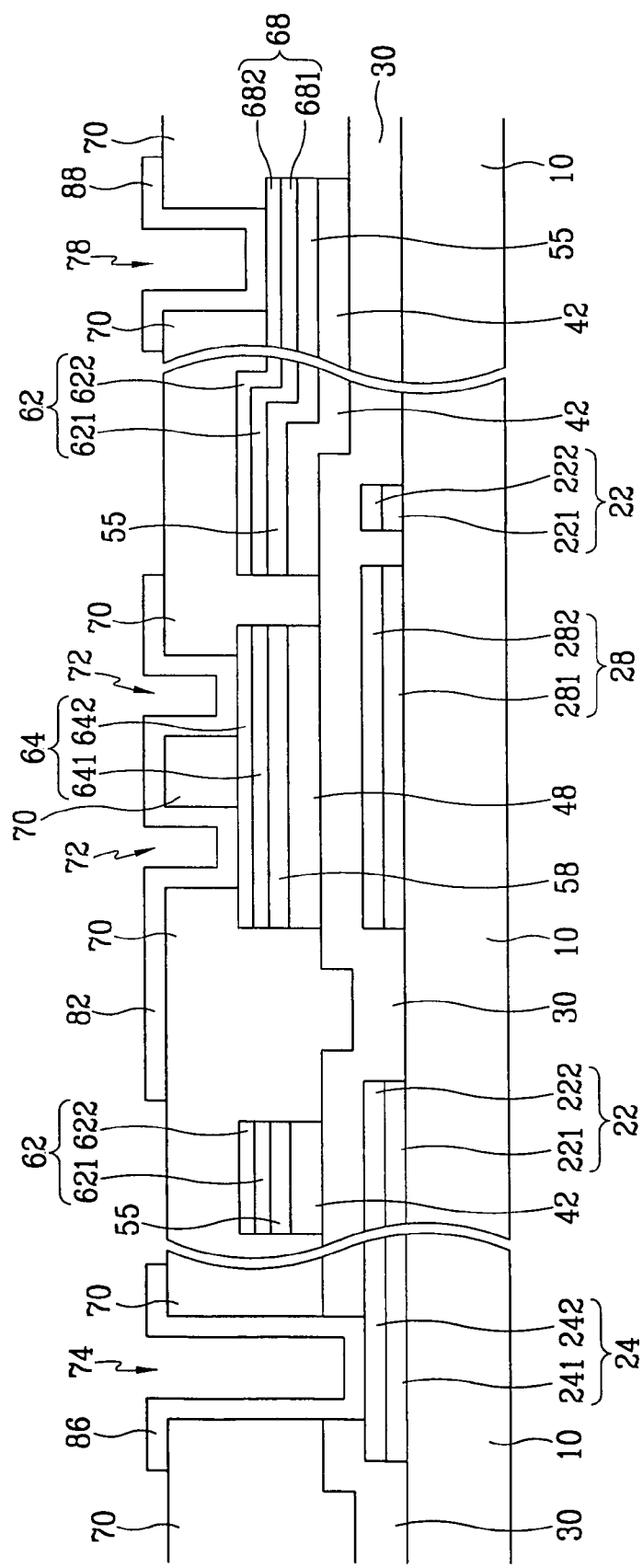
FIGS. 8 and 9 are cross sectional view of the thin film transistor array substrate taken along the VIII-VIII' line and the IX-IX' line of FIG. 7, respectively.
Figure 9:
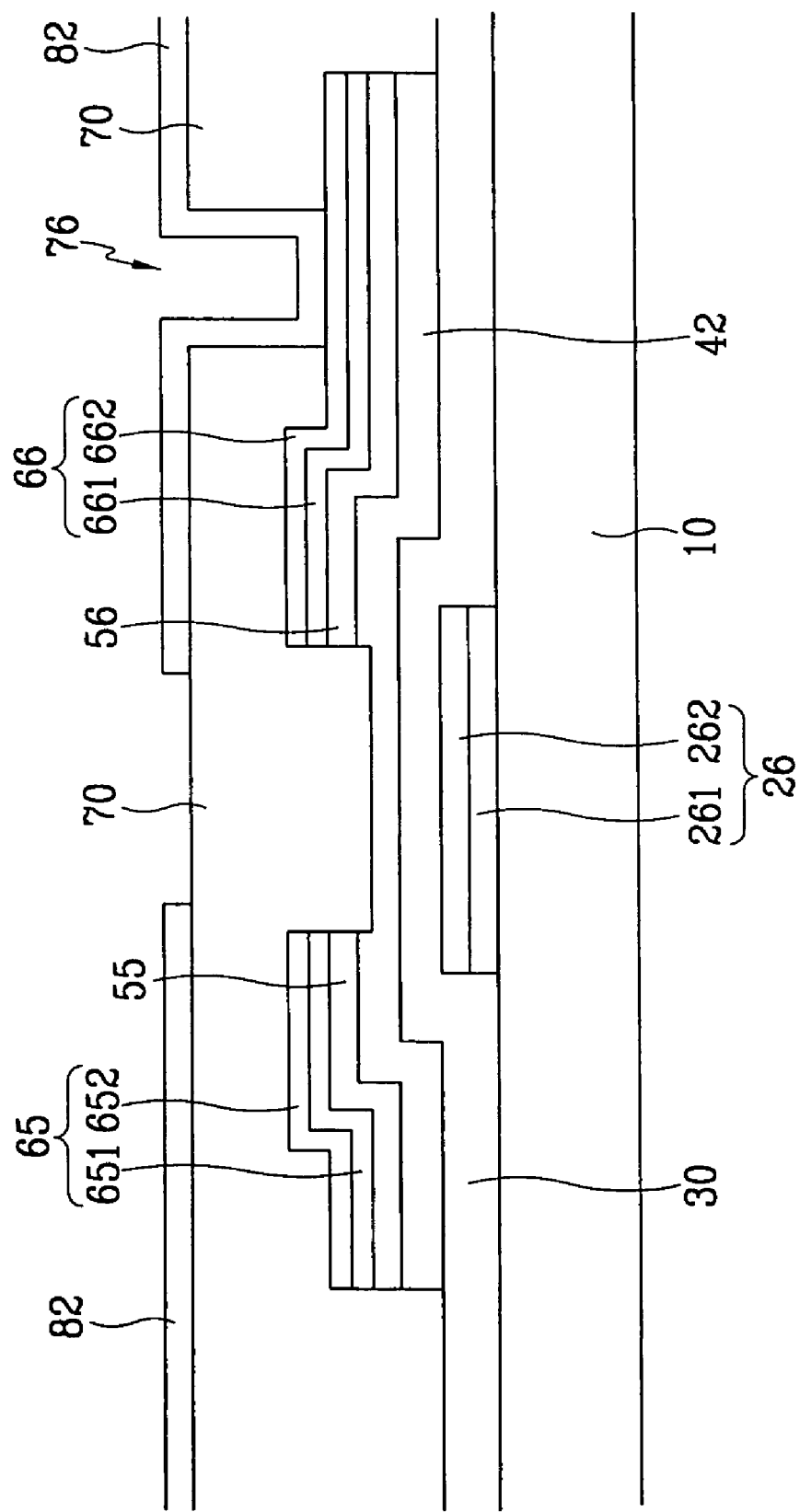

FIG. 7 is a plan view of a thin film transistor array substrate for a liquid crystal display according to a second preferred embodiment of the present invention, and FIGS. 8 and 9 are cross sectional views of the thin film transistor array substrate taken along the VIII-VIII' line and the IX-IX' line of FIG. 7.

A gate line assembly is formed on an insulating substrate 10 with a double-layered structure. The gate line assembly has first layers 221, 241, and 261 formed with Cr alloy or Mo alloy, and second layers 222, 242, and 262 formed with Al alloy or Ag alloy. The gate line assembly includes gate lines 22, gate pads 24, and gate electrodes 26.

Storage capacitor lines 28 are formed on the substrate 10 while proceeding parallel to the gate lines 22. The storage capacitor lines 28 also have a first layer 281, and a second layer 282. The storage capacitor lines 28 are overlapped with storage capacitor conductive patterns 64 connected to pixel electrodes 82 to thereby form storage capacitors (not shown) for improving storage capacity of the pixel. If the storage capacity is sufficient accruing to the overlapping of the pixel electrodes 82 and the gate lines 22, the storage capacitor lines 28 can be omitted. A common electrode voltage is usually applied to the storage capacitor lines 28.

A gate insulating layer 30 is formed on the gate line assembly and the storage capacitor lines 28 with silicon nitride SiNx.

Semiconductor patterns 42 and 48 are formed on the gate insulating layer 30 with hydrogenated amorphous silicon. First to third ohmic contact patterns 55, 56, and 58 are formed on the semiconductor patterns 42 and 48 with amorphous silicon where n-type impurities such as phosphorous P are doped at high concentration.

A data line assembly is formed on the first to third ohmic contact patterns 55, 56, and 58 with Cr alloy or Mo alloy with a double-layered structure. The data line assembly has first layers 621, 641, 651, 661, and 681, and second layers 622, 642, 652, 662, and 682. The data line assembly includes data lines 62 proceeding in the vertical direction, data pads 68 connected to the one-sided ends of the data lines 62 to receive picture signals from the outside, and source electrodes 65 branched form the data lines 62. The data line assembly further includes drain electrodes 66 separated from the source electrodes 65 around the gate electrodes 26 or the channel portions C, and the storage capacitor conductive patterns 64 are placed over the storage capacitor lines 28. In case the storage capacitor lines 28 are absent, the storage capacitor conductive patterns 64 are also omitted.

According to an embodiment of the present invention, the data lines assembly can be formed with a single-layered structure having an Al layer or a Ag layer.

The first to third ohmic contact patterns 55, 56, and 58 lower the contact resistance between the underlying semiconductor patterns 42 and 48 and the overlying data line assembly while having the same outline as the data line assembly. That is, the first ohmic contact patterns 55 have substantially the same shape as the data lines 62, the data pads 68, and the source electrodes 65. The second ohmic contact patterns 56 have substantially the same shape as the drain electrodes 66. The third ohmic contact patterns 58 have substantially the same shape as the storage capacitor conductive patterns 64.

Meanwhile, the semiconductor patterns 42 and 48 have substantially the same shape as the data line assembly and the ohmic contact patterns 55, 56, and 58 except for the channel portions C. Specifically, the semiconductor patterns 48 have substantially the same shape as the storage capacitor conductive patterns 64 and the third ohmic contact patterns 58, but the semiconductor patterns 42 are slightly differentiated from the relevant components of the data line assembly and the ohmic contact patterns. For example, the source and the drain electrodes 65 and 66 are separated from each other at the channel portions C, and the first and the second ohmic contact patterns 55 and 56 are also separated from each other at those portions. However, the semiconductor patterns 42 continuously proceed toward those portions to thereby form channels for the thin film transistors.

A passivation layer 70 is formed with a low dielectric material on the data line assembly. According to an embodiment of the present invention, the low dielectric film is made of a-Si:C:O or a-Si:O:F formed by way of a PECVD process. As the low dielectric material has a dielectric constant of about 4 or less, the problem of parasitic capacitance is minimal or nonexistent, even if the thickness of the passivation layer 70 is thin. Furthermore, the passivation layer 70 has good contact characteristics and good step coverage characteristics in relation to other layers, and the thermostability thereof is excellent compared to a conventional organic insulating layer. In addition, the rate of deposition and patterning is faster by about four to about ten times compared to that of a conventional silicon nitride layer.

The passivation layer 70 has contact holes 76, 78, and 72 exposing the drain electrodes 66, the data pads 68, and the storage capacitor conductive patterns 64. Furthermore, the passivation layer 70 has contact holes 74 exposing the gate pads 24 together with the gate insulating layer 30.

Pixel electrodes 82 are formed on the passivation layer 70 to receive picture signals from the data lines 62 through the thin film transistors. According to an embodiment of the present invention, the pixel electrodes 82 are formed with a transparent conductive material such as indium tin oxide (ITO) or indium zinc oxide (IZO). The pixel electrodes 82 are physico-electrically connected to the drain electrodes 66 to receive picture signals. The pixel electrodes 82 are overlapped with the neighboring gate and data lines 22 and 62 to enhance the opening ratio. Alternatively, the overlapping can be omitted. The pixel electrodes 82 are connected to the storage capacitor conductive patterns 64 through the contact holes 72 to transmit picture signals therethrough. Meanwhile, subsidiary gate and data pads 86 and 88 are connected to the gate and the data pads 24 and 68 through the contact holes 74 and 78, respectively. The subsidiary gate and data pads 86 and 88 serve to enhance an adhesive relation between the gate and the data pads 24 and 68 and external circuits (not shown) and to protect the gate and data pads 24 and 68, but can be selectively introduced.

A method of fabricating the thin film transistor array substrate using four masks will be now explained with reference to FIGS. 10A to 17C.

Figure 10A:
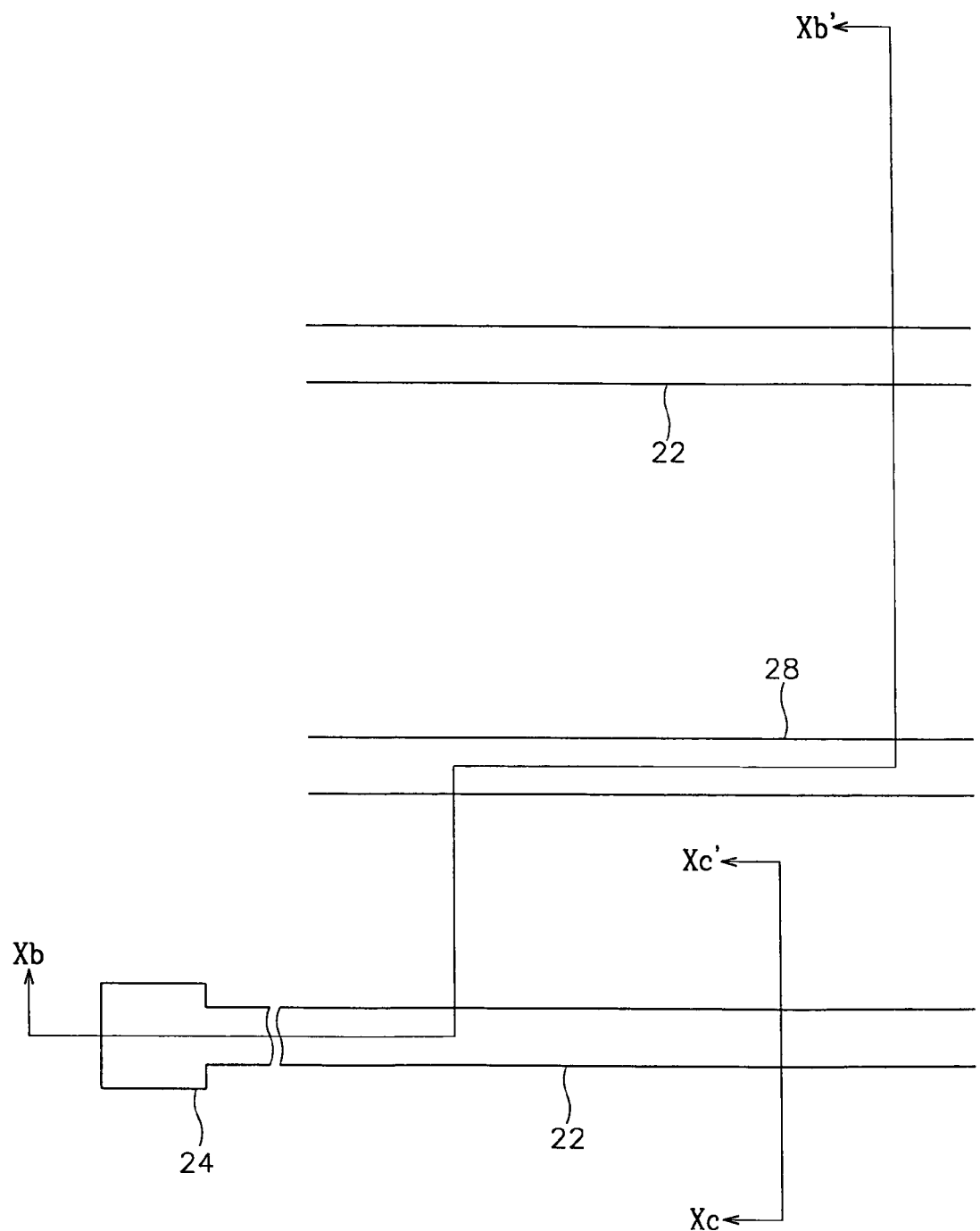
FIG. 10A illustrates the first step of fabricating the thin film transistor array substrate shown in FIG. 7.

Referring to FIGS. 10A to 10C, a Cr alloy layer or Mo alloy layer is deposited onto a substrate 10 to form first layers 221, 241, 261, and 281 for a gate line assembly, and an Al alloy layer or a Ag alloy layer is formed onto the first layers 221, 241, 261, and 281 to form second layers 222, 242, 262, and 282 for the gate line assembly. The first layers 221, 241, 261, and 281 and the second layers 222, 242, 262, and 282 are patterned by photolithography to thereby form a gate line assembly, and storage capacitor lines 28. The gate line assembly includes gate lines 22, gate pads 24, and gate electrodes 26.

Figure 11A:
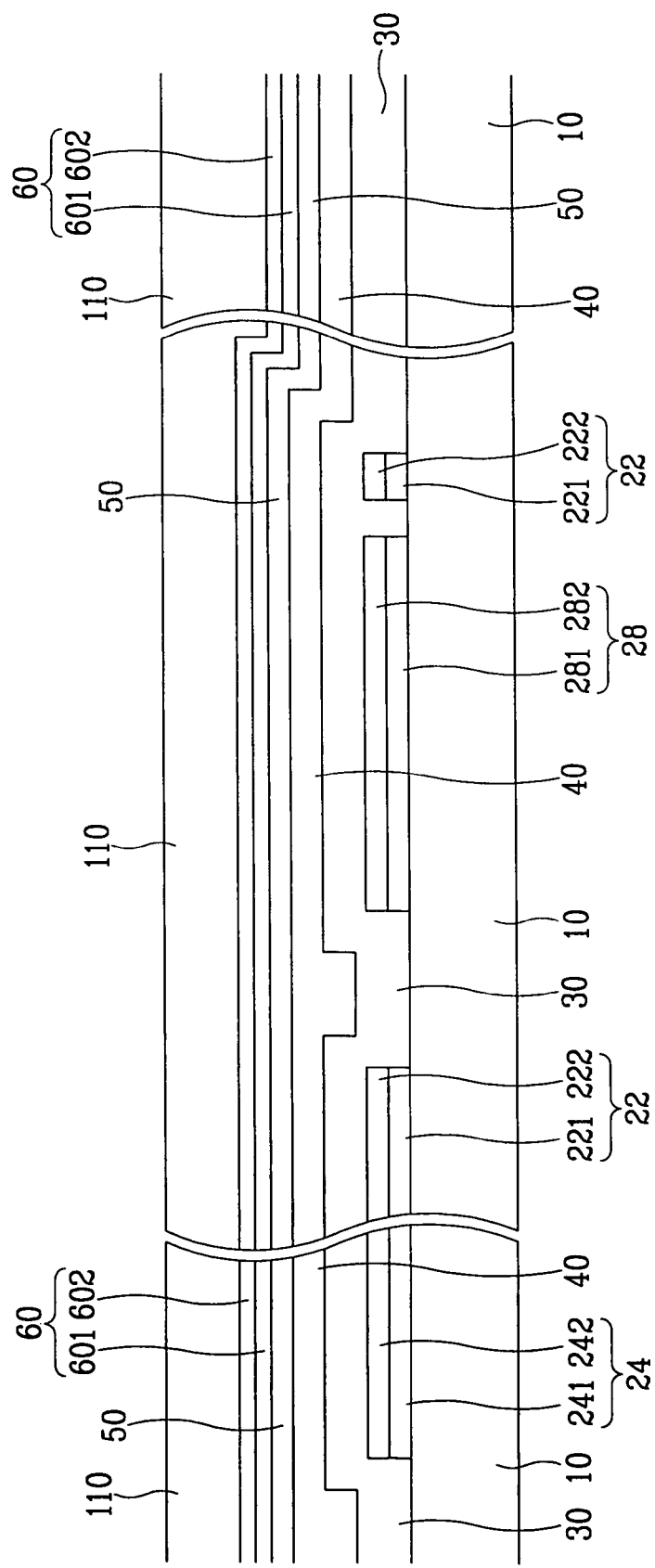

Thereafter, referring to FIGS. 11A and 11B, a gate insulating layer 30, a semiconductor layer 40, and an ohmic contact layer 50 are sequentially deposited onto the substrate 10 through chemical vapor deposition. According to an embodiment of the present invention, the gate insulating layer 30, the semiconductor layer 40, and the ohmic contact layer 50 have a thickness of about 1500-5000 Å, about 500-2000 Å, and about 300-600 Å, respectively. A Cr alloy or Mo alloy first conductive layer 601 and an Al alloy or Ag alloy second conductive layer 602 are deposited onto the ohmic contact layer 50 through sputtering to thereby form a conductive layer 60. A photoresist film 110 is then coated onto the conductive layer 60 having a thickness of about 1-2 μm.

Figure 12A:
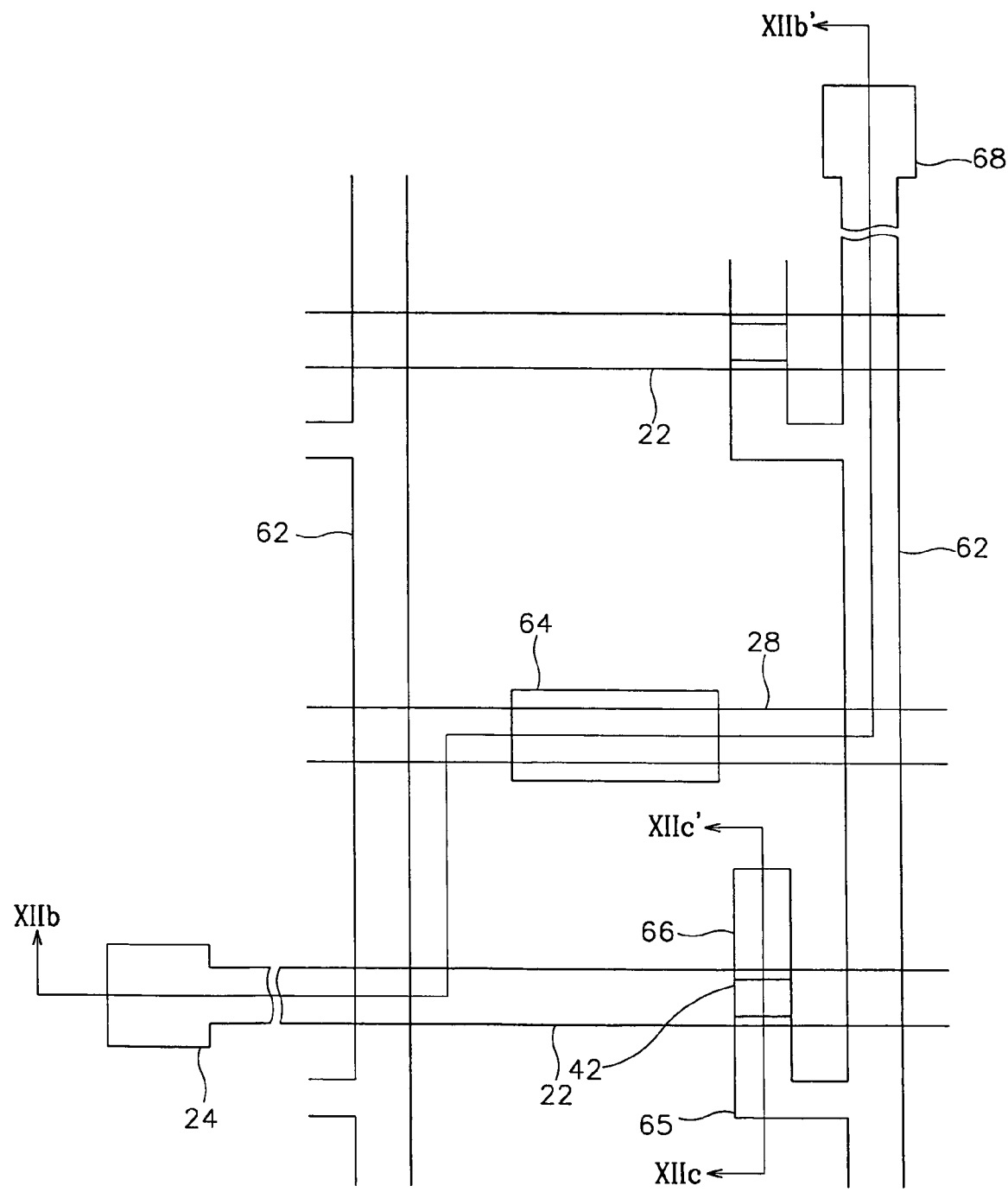
FIG. 12A illustrates the step of fabricating the thin film transistor array substrate following the step illustrated in FIG. 10A.
Figure 12C:
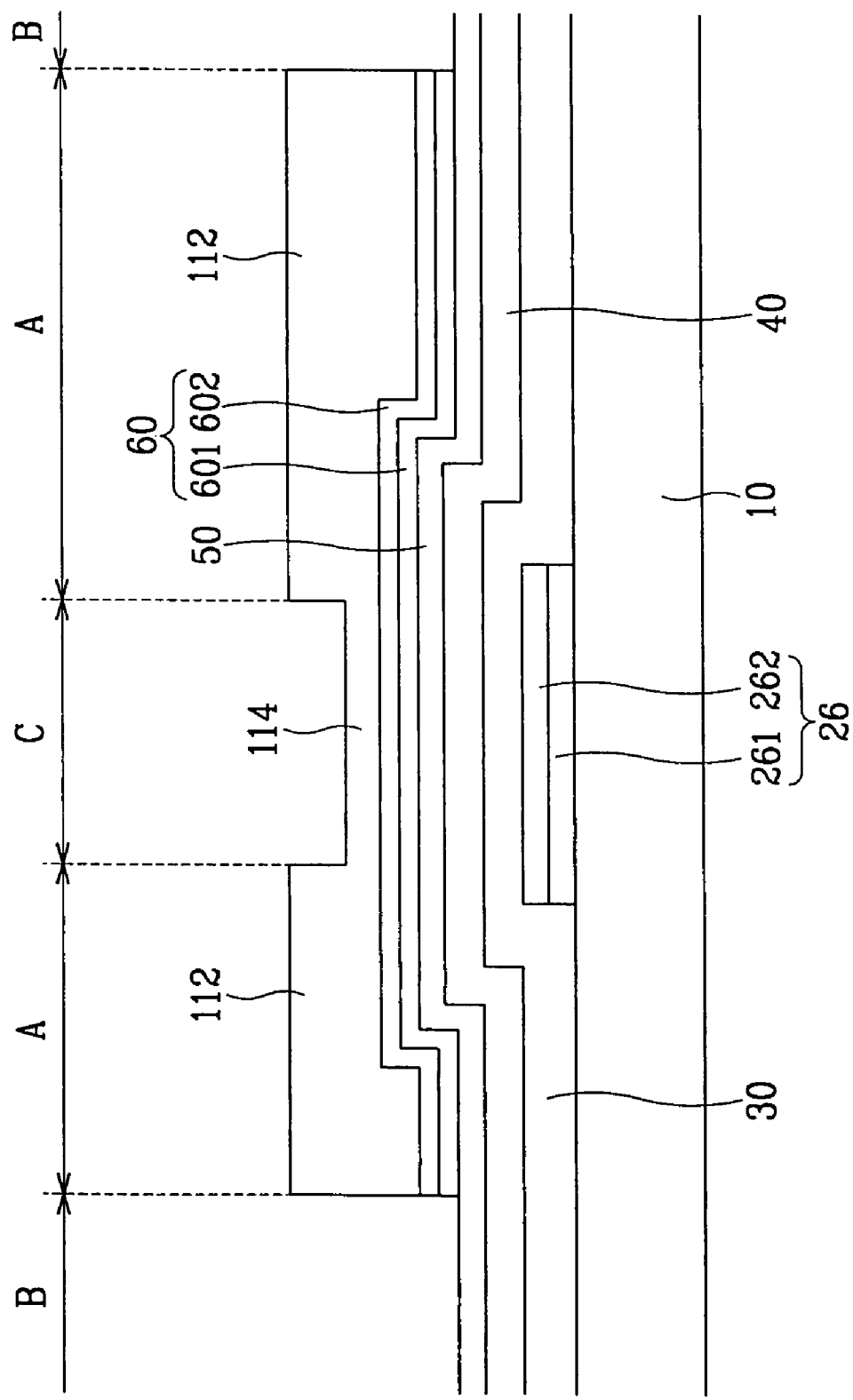

Referring to FIGS. 12B and 12C, the photoresist film 110 is exposed to light through a mask (not shown), and developed to thereby form a photoresist pattern. The photoresist pattern has a first portion 114 to be placed at a channel area C between source and drain electrodes 65 and 66, and a second portion 112 to be placed at a data line assembly area A. The first portion 114 has a thickness smaller than the second portion 112. A remaining portion B of the photoresist film is removed. The thickness ratio of the first photoresist portion 114 to the second photoresist portion 112 can be varied depending upon the processing conditions to be described below. It is preferable that the thickness ratio of the first portion 114 to the second portion 112 is about ½ or less. According to an embodiment of the present invention, the first portion 114 has a thickness of about 4000 Å or less.

To control light transmission at the A area, the mask can have a slit or lattice pattern. The mask is preferably made from an opaque or a semitransparent film. It is preferable that the width of the slit is smaller than the width of the light decomposition portion of the layer. In the case of a semitransparent film, thin films differentiated in light transmission or varied thickness can be used to control the light transmission.

When the light exposing process is made using such a mask, high molecules of the photoresist film 110 at the area directly exposed to the light are completely decomposed, those at the area exposed to light through a slit pattern or a semitransparent film are decomposed at some degree, and those at the area intercepted by an opaque film are not decomposed. When the photoresist film 110 is developed after exposing the light, the portion thereof where the high molecules are not decomposed is left over, and the portion where the high molecules are decomposed at some degree has a thickness smaller than the portion thereof where the high molecules are not decomposed. As exposing time is long, all of the molecules may be decomposed.

The portion 114 of the photoresist pattern having a relatively thin thickness can be formed using a photoresist film capable of reflow. The photoresist film is exposed to light using a usual mask with a transparent portion and an opaque portion, developed, and made the reflow such that it is partially flown toward the non-film portion.

The photoresist pattern 114, and the underlying conductive layer 60, ohmic contact layer 50 and semiconductor layer 40 are then etched. At this time, the data line assembly and the underlying layers are left over at the A area, only the semiconductor layer is left over at the C area, and the gate insulating layer 30 is exposed at the B area with the removal of the overlying layers 60, 50 and 40.

Figure 13A:
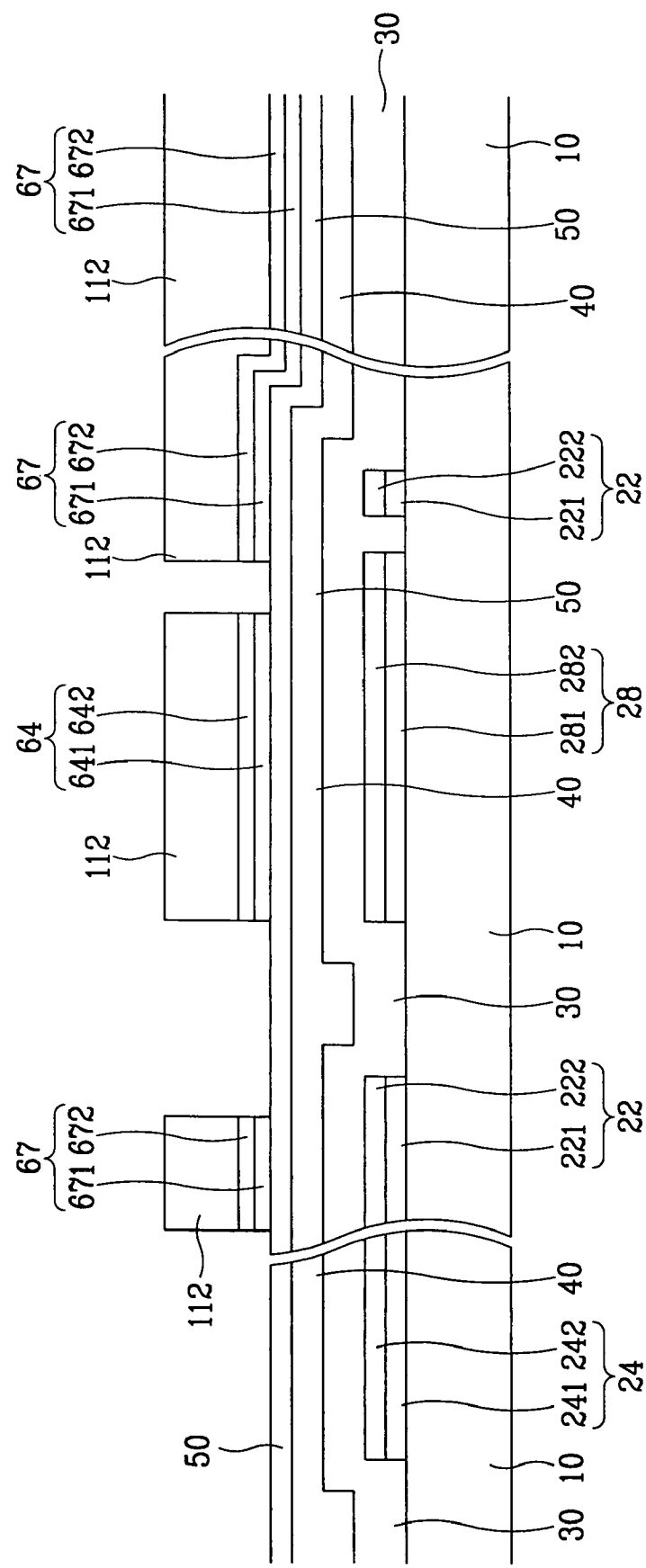

Referring to FIGS. 13A and 13B, the conductive layer 60 (in FIGS. 12B and 12C) exposed at the B area (in FIGS. 12B and 12C) is removed while exposing the underlying ohmic contact layer 50 using wet etching or dry etching. The etching condition is preferably established such that the conductive layer 60 (in FIGS. 12B and 12C) is etched while the photoresist pattern portions 112 and 114 being not nearly etched. However, in the case of dry etching, the photoresist pattern portions 112 and 114 (in FIGS. 12B and 12C) can be etched together. In this case, the first photoresist pattern portion 114 (in FIG. 12C) is formed to be so thick that the underlying conductive layer 60 cannot be exposed to the outside.

Consequently, as shown in FIGS. 13A and 13B, a source/drain conductive pattern 67 at the C area and a storage capacitor conductive pattern 64 at the B area are left over, and the conductive layer 60 at the B area is removed while exposing the underlying ohmic contact layer 50. At this time, the source/drain conductive pattern 67 has substantially the same shape as the data line assembly except that the source and the drain electrodes 65 and 66 are not yet separated from each other. In the case of dry etching, the photoresist pattern portions 112 and 114 are also etched by a predetermined thickness.

Figure 14A:
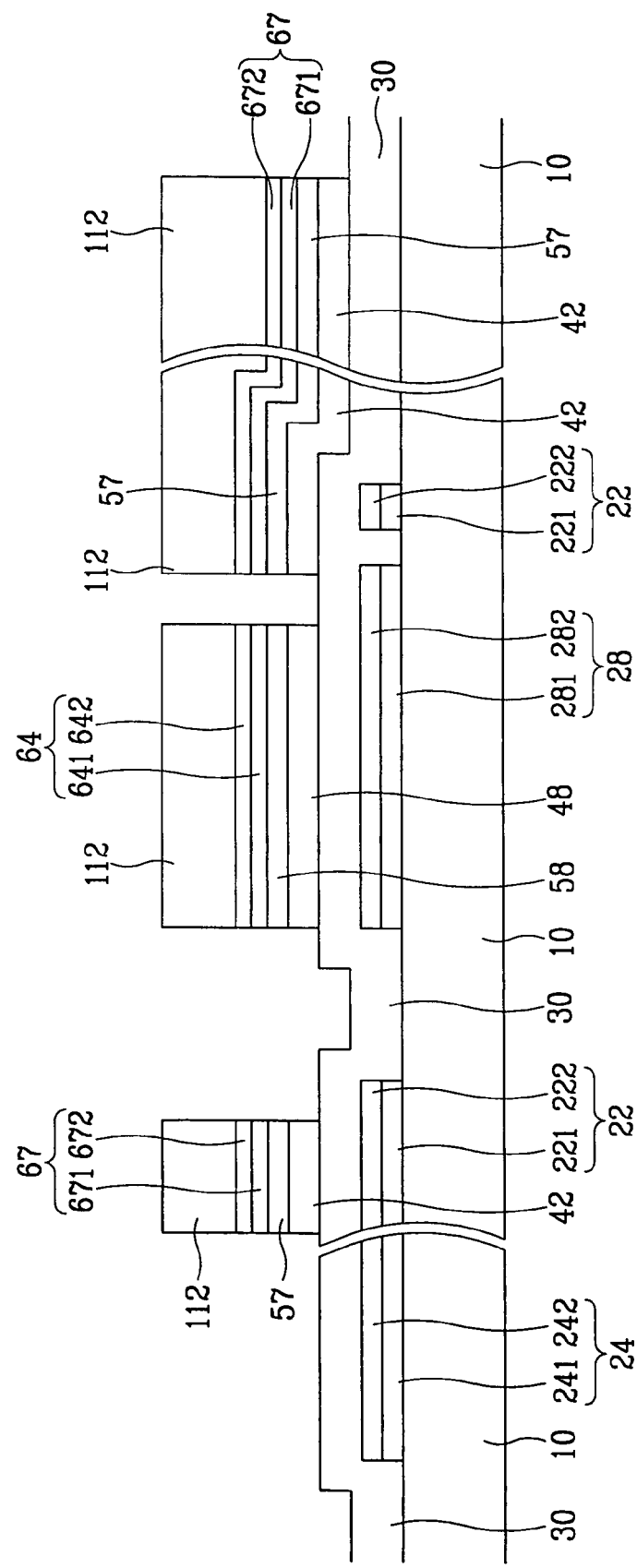
Figure 14B:
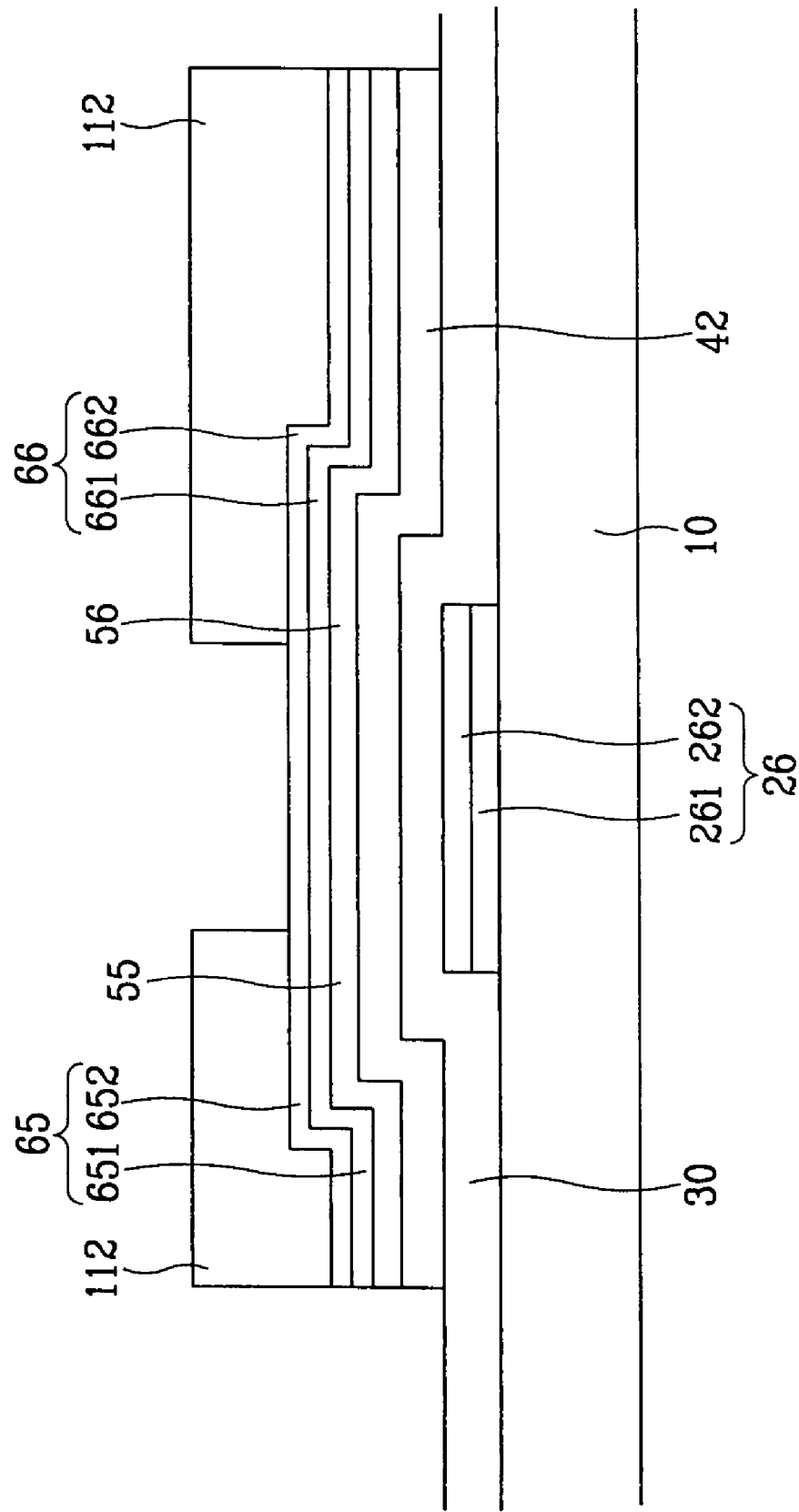

Thereafter, as shown in FIGS. 14A and 14B, the ohmic contact layer 50 at the B area and the underlying semiconductor layer 40 are simultaneously removed together with the first photoresist pattern portion 114 through dry etching. The etching should preferably be made such that the photoresist pattern portions 112 and 114, the ohmic contact layer 50, and the semiconductor layer 40 are simultaneously etched until the gate insulating layer 30 is exposed. Particularly, it is preferable that the etching ratios with respect to the photoresist pattern portions 112 and 114 and the semiconductor layer 40 should be established to be nearly the same. According to an embodiment of the present invention, a mixture of $SF_6$ and HCl or a mixture of $SF_6$ and $O_2$ is preferably used as an etchant. In case the etching ratios with respect to the photoresist pattern portions 112 and 114 and the semiconductor layer 40 are the same, the thickness of the first photoresist pattern portion 114 should be established to be the same or less than the sum in thickness of the semiconductor layer 40 and the ohmic contact layer 50.

Consequently, as shown in FIGS. 14A and 14B, the first photoresist pattern portion 114 at the C area is removed while exposing the source/drain conductive pattern 67, and the ohmic contact layer 50 and the semiconductor layer 40 at the B area are removed while exposing the underlying gate insulating layer 30. The second photoresist pattern portion 112 at the A area is also etched while being reduced in thickness. Furthermore, in this process, semiconductor patterns 42 and 48 are completely formed. The reference numerals 57 and 58 indicate the ohmic contact pattern under the source/drain conductive pattern 67, and the ohmic contact pattern under the storage capacitor conductive pattern 64.

Thereafter, the photoresist residue on the source/drain conductive pattern 67 is removed through ashing.

Figure 15A:
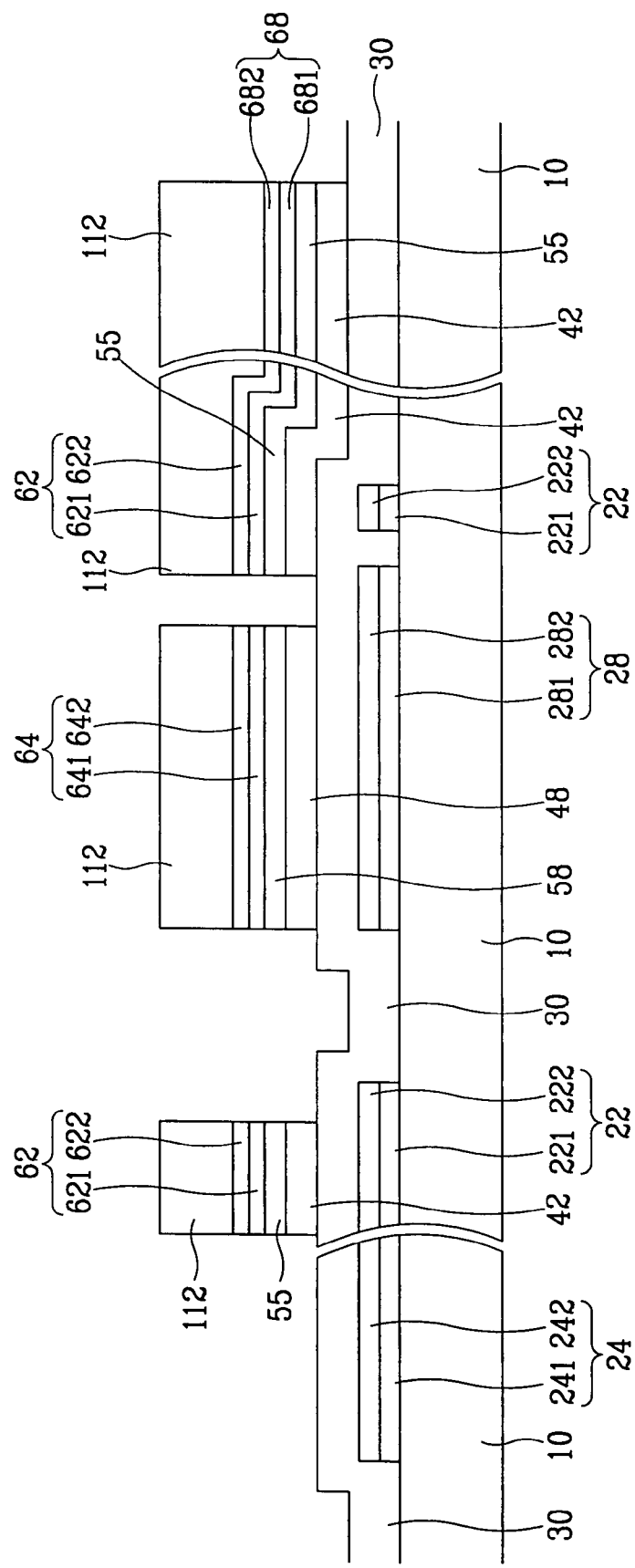
Figure 15B:
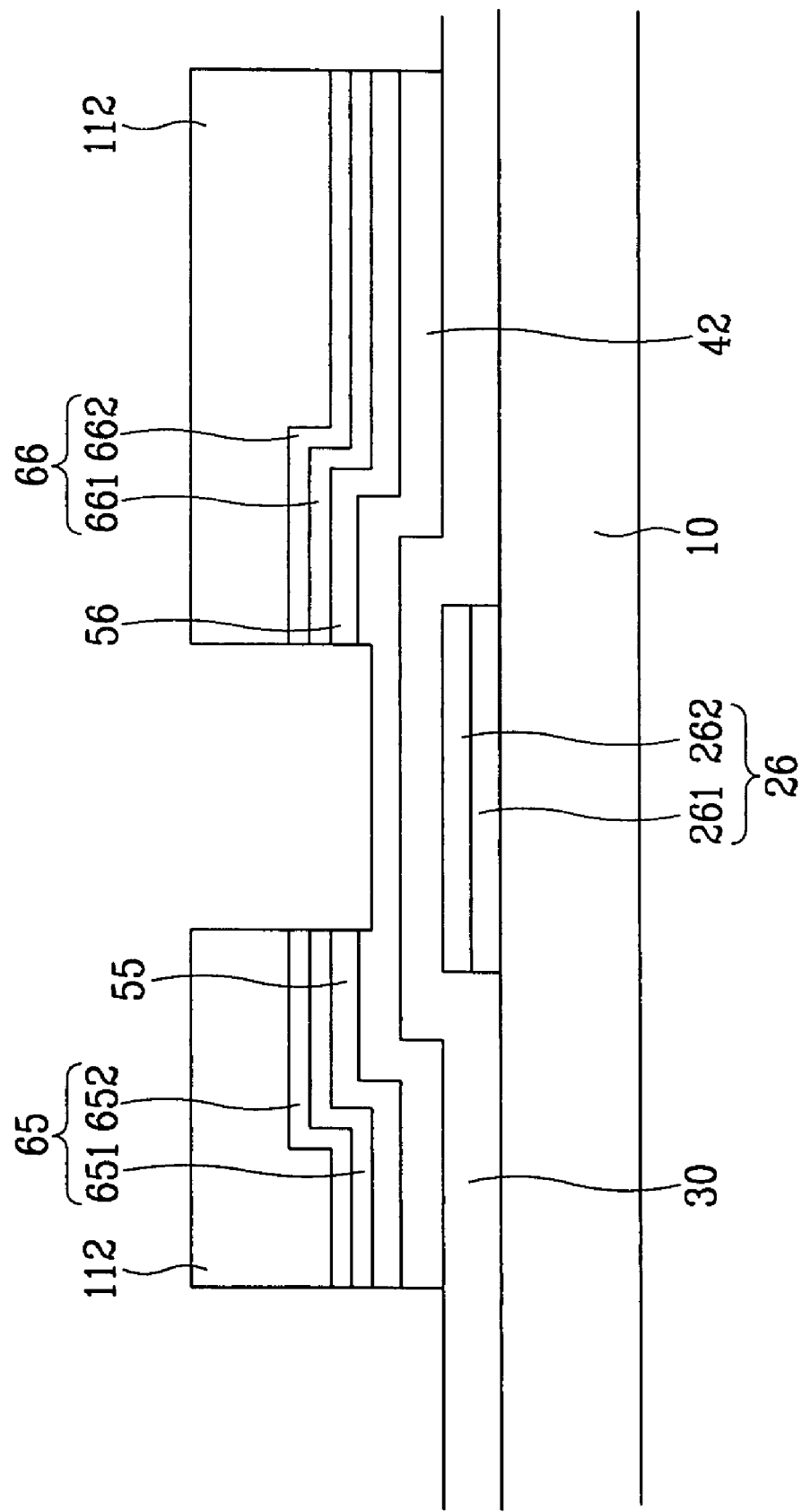

As shown in FIGS. 15A and 15B, the source/drain conductive pattern 67 at the C area and the underlying ohmic contact pattern 57 are removed through etching. Dry etching can be performed with respect to all of the source/drain conductive pattern 67 and the ohmic contact pattern 57. Alternatively, wet etching can be performed with respect to the source/drain conductive pattern 67, and dry etching with respect to the ohmic contact pattern 57. In the former case, the etching is preferably performed such that the etching selection ratios of the source/drain conductive pattern 67 and the ohmic contact pattern 57 are high. By contrast, in the latter case where the wet etching and the dry etching are alternated, the lateral side of the source/drain conductive pattern 67 suffering the wet etching is etched, whereas the ohmic contact pattern 57 is not etched. Consequently, a stepped area is developed in such case. A mixture of $CF_4$ and HCl or $CF_4$ and $O_2$ can be used for the etching gas. In the case of the mixture of $CF_4$ and $O_2$, the semiconductor pattern 42 is left over while having a uniform thickness. As shown in FIG. 15B, the semiconductor pattern 42 can be partially removed while being reduced in thickness. The second photoresist pattern portion 112 is also etched by a predetermined thickness. The etching is preferably performed such that the gate insulating layer 30 is not etched. The thickness of the second photoresist pattern portion 112 is so thick that the underlying data line assembly cannot be exposed to the outside through the etching.

Consequently, the source and the drain electrodes 65 and 66 are separated from each other while completely forming the data line assembly and underlying ohmic contact patterns 55, 56, and 58.

Finally, the second photoresist pattern portion 112 at the A area is removed. The removal of the second photoresist pattern portion 112 can be performed prior to the removal of the ohmic contact pattern 57 after the source/drain conductive pattern 67 is removed.

Figure 16A:
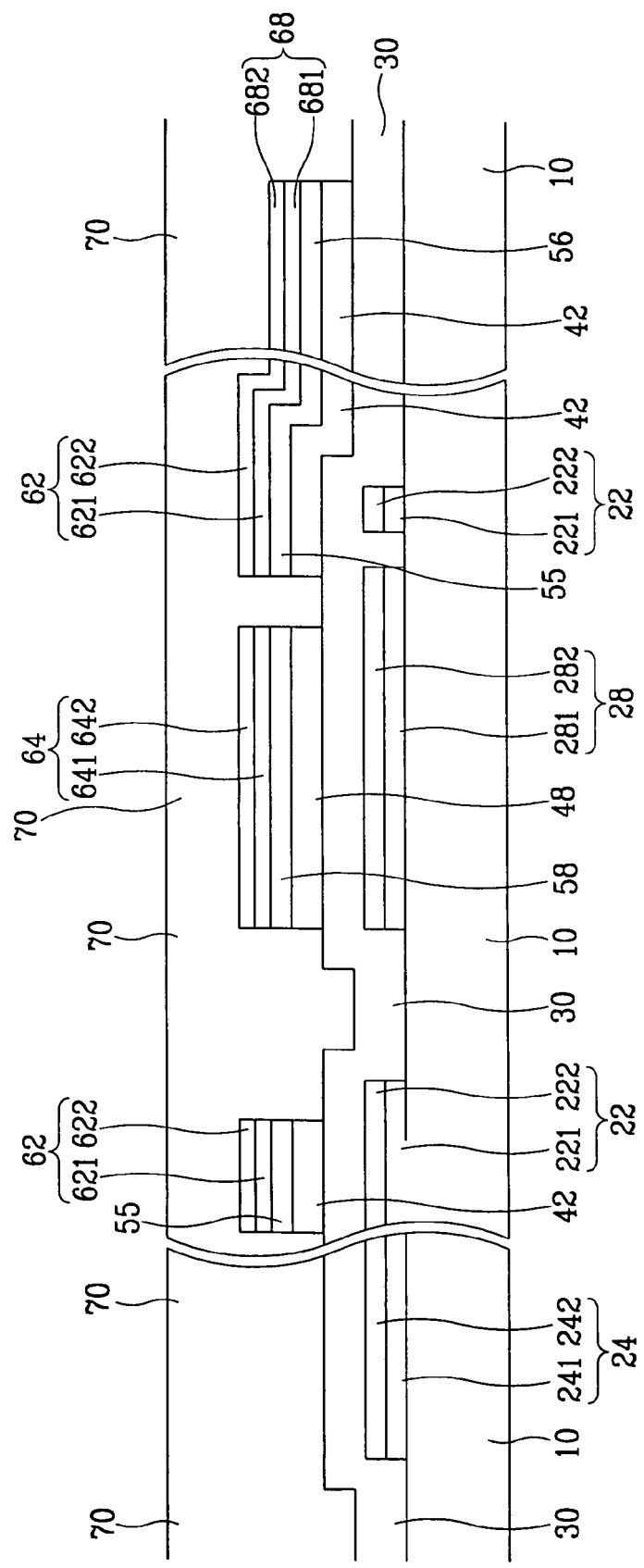
FIGS. 16A and 16B illustrate the step of fabricating the thin film transistor array substrate following the step illustrated in FIGS. 15A and 15B.
Figure 16B:
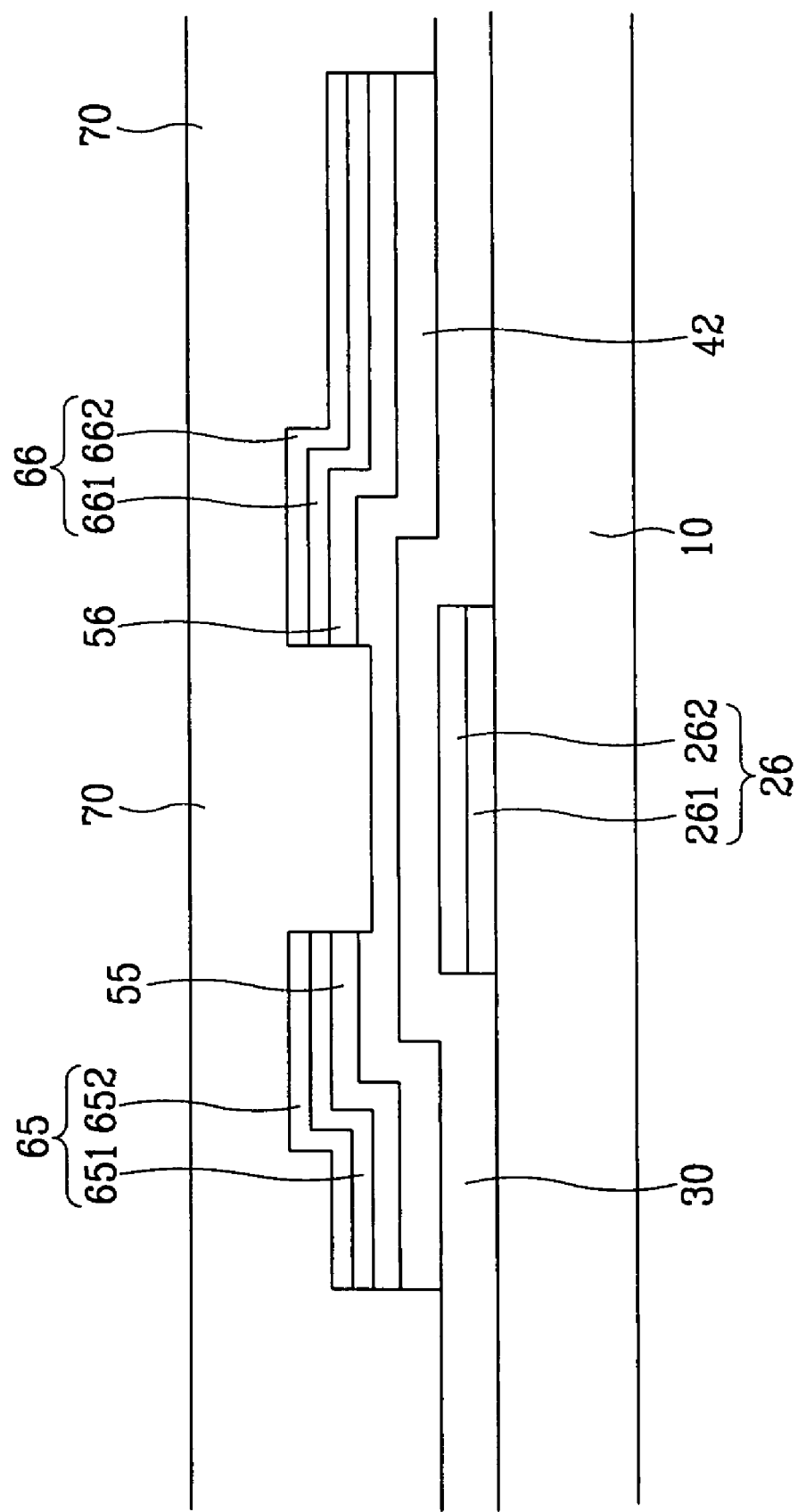

Thereafter, as shown in FIGS. 16A and 16B, an a-Si:C:O or a-Si:O:F layer is grown through chemical vapor deposition (CVD) to thereby form a passivation layer 70. For forming the a-Si:C:O layer, a gaseous material such as $SiH(CH_3)_3$, $SiO_2(CH_3)_4$, $(SiH)_4O_4(CH_3)_4$, and $Si(C_2H_5O)_4$ is used as a basic source while introducing a mixture of an oxide agent such as $N_2O$ and $O_2$, and Ar or He. Furthermore, for forming the a-Si:O:F layer, a gaseous material such as $SiH_4$ and $SiF_4$ with the addition of $O_2$ is introduced during the deposition process. At this time, $CF_4$ is added as a subsidiary source for fluorine.

Figure 17A:
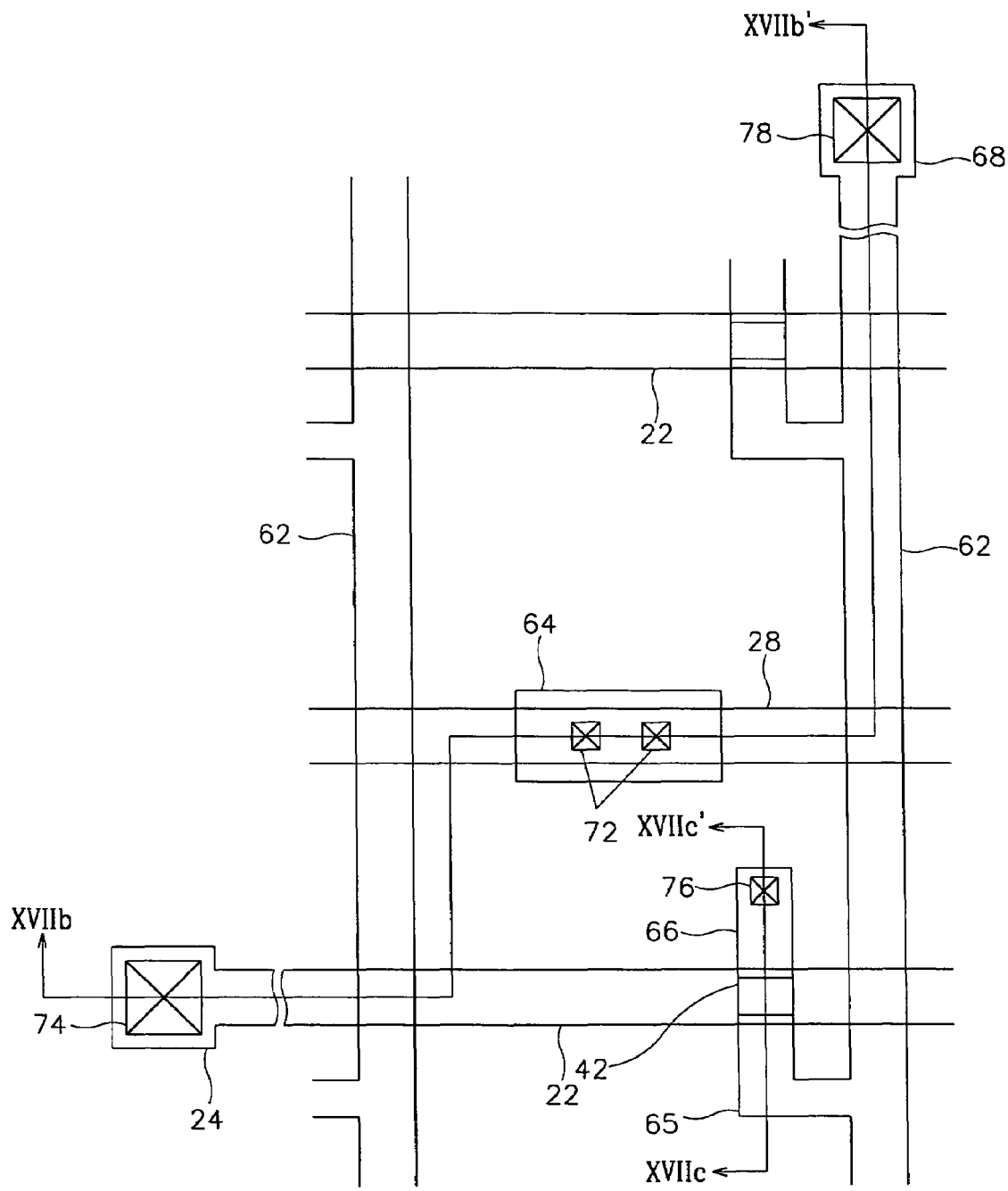
FIG. 17A illustrate the step of fabricating the thin film transistor array substrate following the step illustrated in FIGS. 16A and 16B.
Figure 17B:
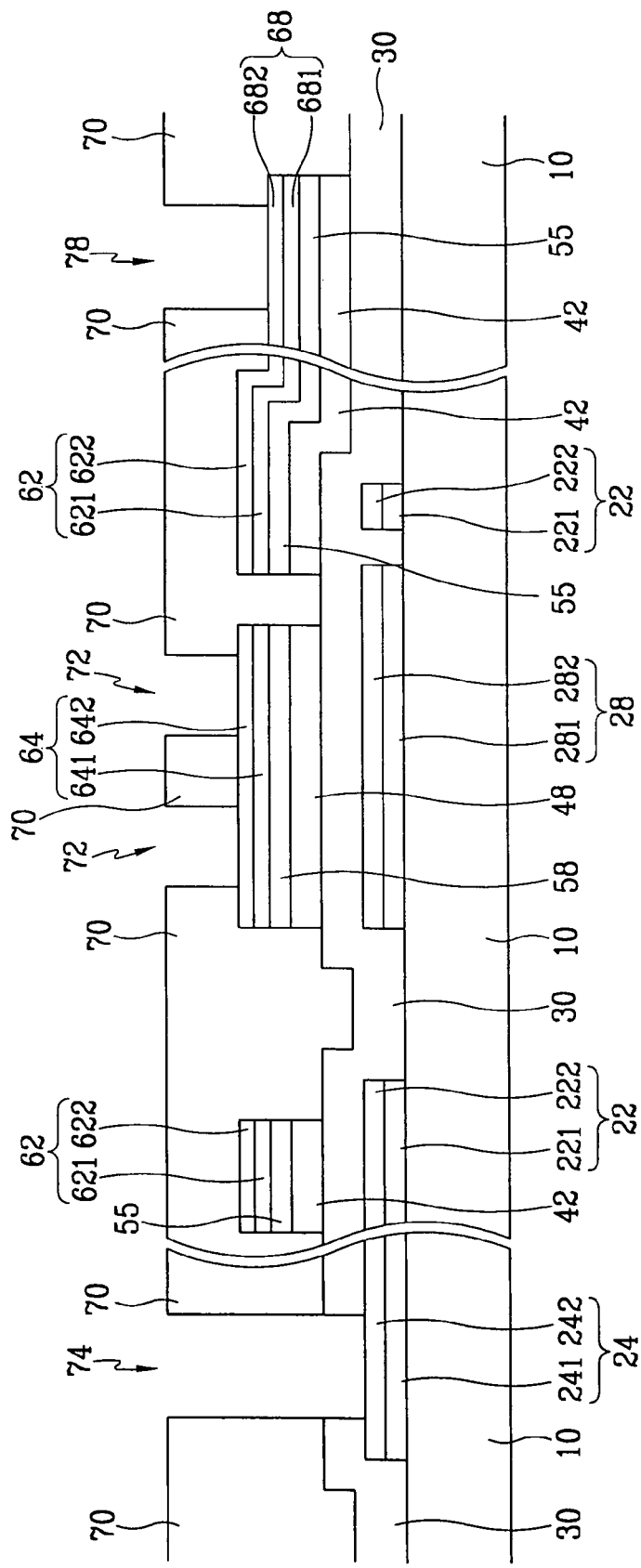
FIGS. 17B and 17C are cross sectional views of the thin film transistor array substrate taken along the XVIIb-XVIIb' line and the XVIIc-XVIIc' line of FIG. 17A, respectively.
Figure 17C:
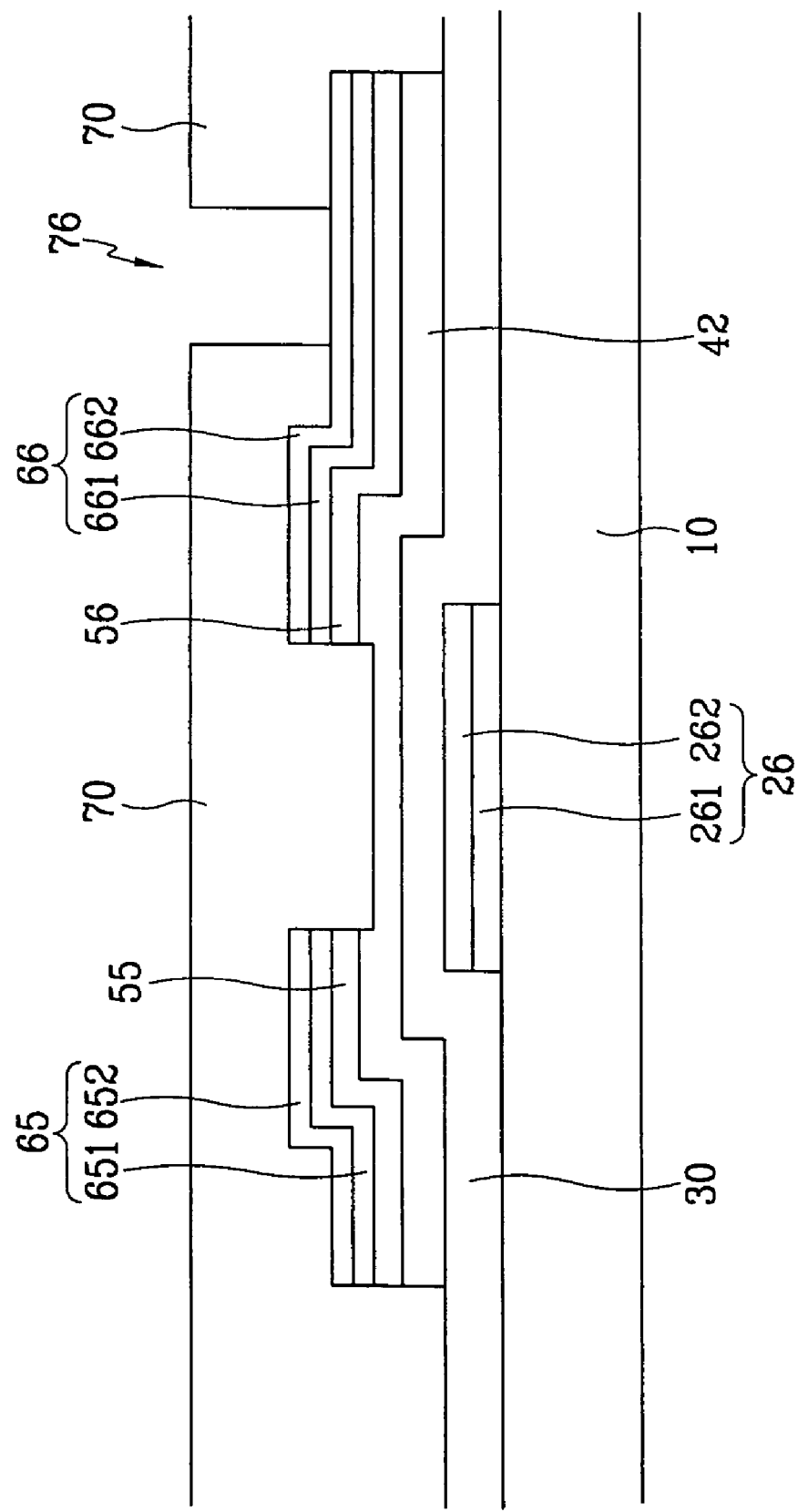

Thereafter, as shown in FIGS. 17A to 17C, the passivation layer 70 is etched through photolithography together with the gate insulating layer 30 to thereby form contact holes 76, 74, 78, and 72 for exposing the drain electrodes 66, the gate pads 24, the data pads 68, and the storage capacitor conductive patterns 64, respectively. The area of the contact holes 74 and 78 exposing the gate and data pads 24 and 68 is about 2 mm×60 μm or less, preferably in the range of about 0.5 mm×15 μm to about 2 mm×60 μm.

Finally, as shown in FIGS. 8 to 9, an ITO or IZO layer with a thickness of about 400 to about 500 Å is deposited, and etched through photolithography to thereby form pixel electrodes 82 connected to the drain electrodes 66 and the storage capacitor conductive patterns 64, subsidiary gate pads 86 connected to the gate pads 24, and subsidiary data pads 88 connected to the data pads 68.

In case the pixel electrodes 82, the subsidiary gate pads 86, and the subsidiary data pads 88 are formed with IZO, an etching solution is used to prevent the metallic material for the data line assembly or the gate line assembly exposed through the contact holes from being corroded during the etching process. The etching solution can be selected from $HNO_3$, $(NH_4)_2Ce(NO_3)_6$, or $H_2O$. Furthermore, to minimize the contact resistance at the contact area, it is preferable that IZO is deposited in the temperature range of from ambient temperature to about 200° C. The target material for the IZO layer preferably includes $In_2O_3$ and ZnO, and the content of ZnO is preferably in the range of about 15% to about 20%.

Meanwhile, a nitrogen gas is preferably used for pre-heating process before the deposition of ITO or IZO. This is to prevent a metallic oxide layer from being formed on the metallic layers such as the gate pads 24, the storage capacitor conductive patterns 64, the drain electrodes 66, and the data pads 68 exposed through the contact holes 72, 74, 76, and 78, respectively.

In this preferred embodiment, the data line assembly, and the underlying ohmic contact patterns, and semiconductor patterns are formed using only one mask, and the source and the drain electrodes 65 and 66 are also separated during that process. In this way, the processing steps can be simplified.

The low dielectric CVD layer such as the a-Si:C:O layer and the a-Si:O:F layer can be used as a buffer layer for separating color filters from thin film transistors in the array on color filter (AOC) structure where the thin film transistor array is formed on the color filters.

Figure 18:
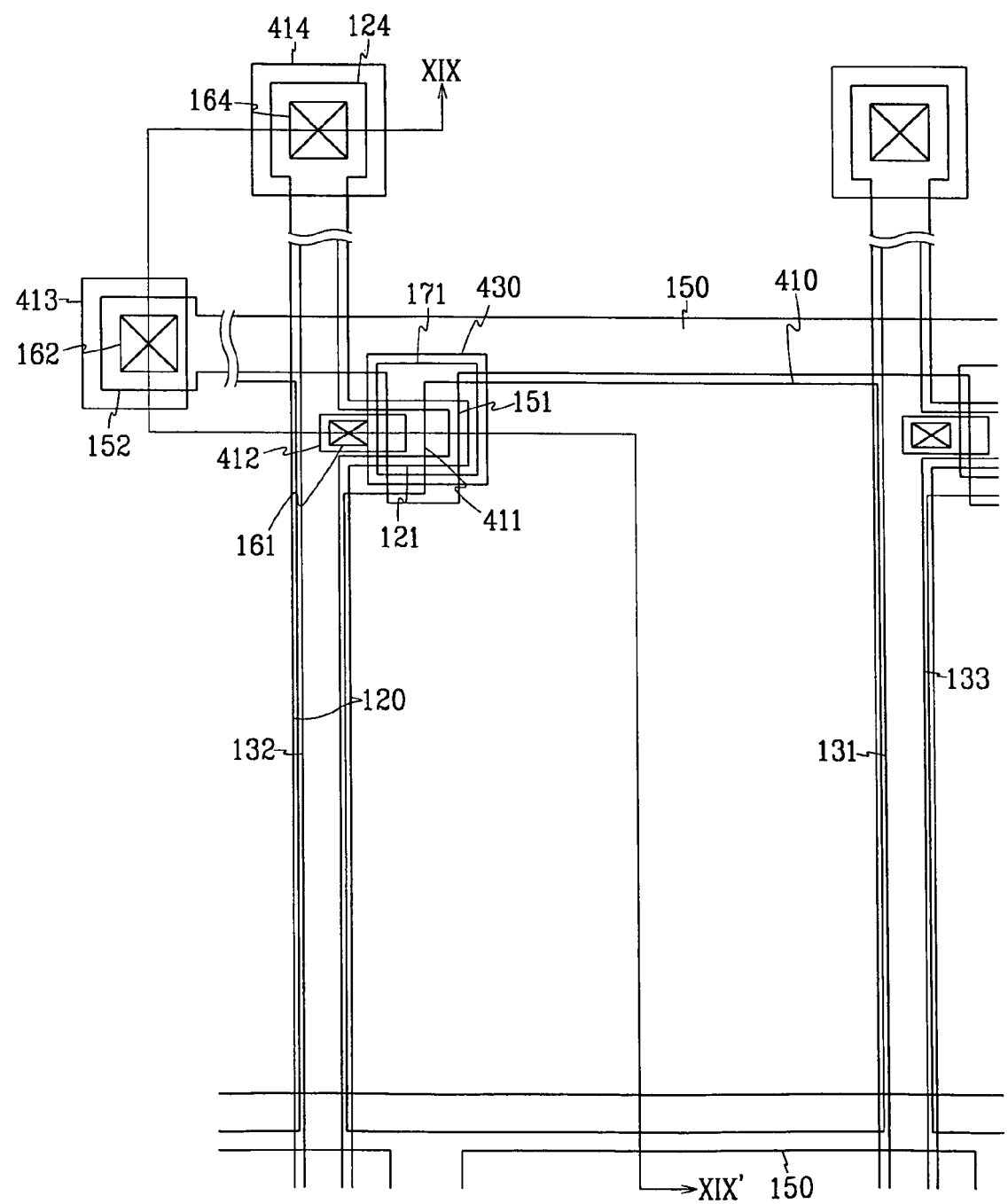
FIG. 18 is a plan view of a thin film transistor array substrate according to another preferred embodiment of the present invention.
Figure 19:
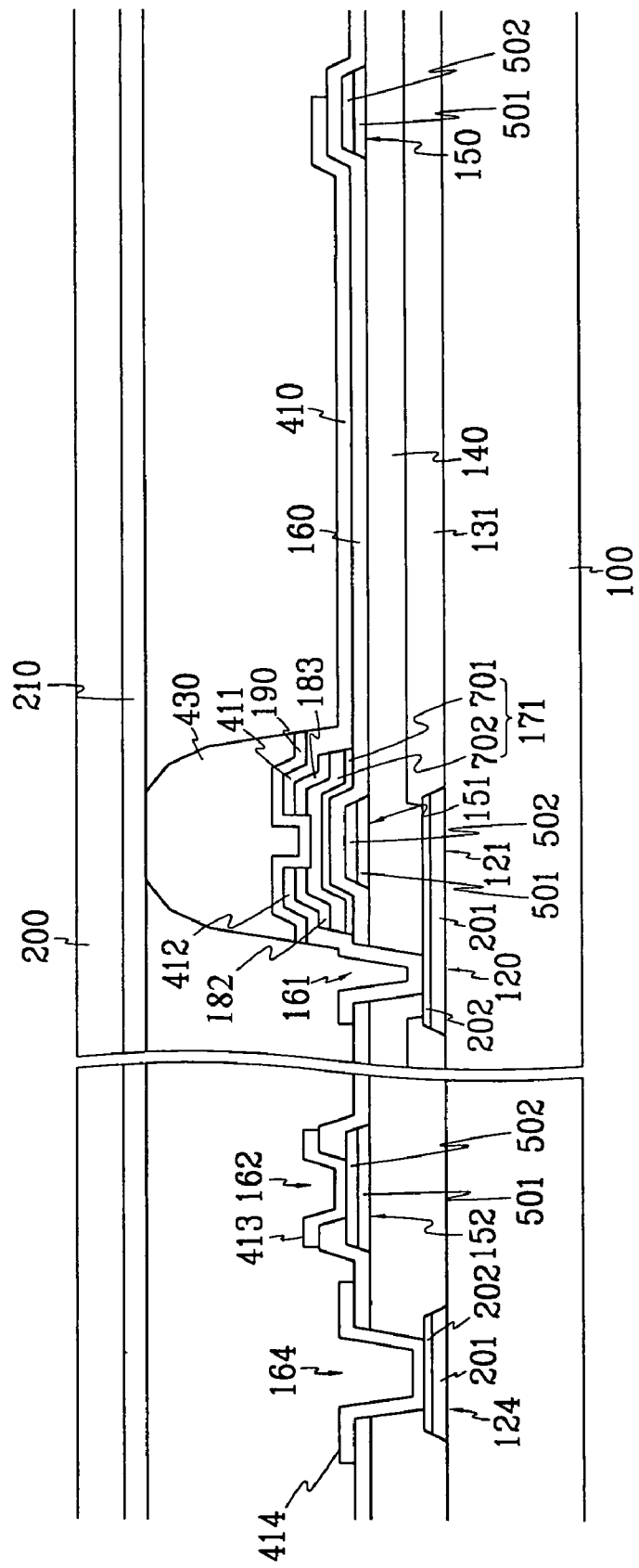
FIG. 19 is a cross sectional view of a thin film transistor array substrate taken along the XIX-XIX' line of FIG. 18.

FIG. 18 is a plan view of a thin film transistor array substrate according to a third preferred embodiment of the present invention, and FIG. 19 is a cross sectional view of the thin film transistor array substrate taken along the XIX-XIX' line of FIG. 18. A top substrate facing the thin film transistor array substrate being the bottom substrate is also illustrated in FIG. 19.

In the thin film transistor array substrate, a data line assembly is formed on an insulating substrate 100 with a double-layered structure. The data line assembly has a bottom layer 201 formed with copper, copper alloy, silver, silver alloy, aluminum, or aluminum alloy, and a top layer 202 formed with chrome, molybdenum, molybdenum alloy, chrome nitride, or molybdenum nitride.

The data line assembly includes data lines 120 proceeding in the vertical direction, data pads 124 connected to the data lines 120 to receive picture signals and transmit the picture signals to the data lines 120, and light absorption members 121 branched from the data lines 120 to intercept light incident upon semiconductor layer 170. The light absorption member 121 also functions as a black matrix for preventing light leakage. The light absorption members 121 can be independently formed in separation of the data lines 120.

Alternatively, the data line assembly may be formed with a single-layered structure using a conductive material such as copper, copper alloy, aluminum, aluminum alloy, molybdenum, molybdenum-tungsten alloy, chrome, and tantalum.

In the data line assembly having a double-layered structure, considering that pixel electrodes and subsidiary pads to be formed later are based on indium tin oxide (ITO), the bottom layer 201 thereof is formed with a low resistance material, and the top layer 202 thereof with a material having good contact characteristic with ITO. For instance, the bottom layer 201 of the data line assembly is formed with Al—Nd, and the top layer 202 thereof with CrNx.

In case the pixel electrodes and the subsidiary pads are based on indium zinc oxide (IZO), it is preferable that the data line assembly is formed with a single-layered structure using aluminum or aluminum alloy. As copper exhibits good contact characteristic with respect to IZO and ITO, the data line assembly can be also formed with a copper layer.

Color filters of red R, green G, and blue B 131 to 133 are formed at the substrate 100 such that the periphery thereof is overlapped with that of the data line assembly. The color filters 131 to 133 can entirely cover the data lines 120.

A buffer layer 140 is formed with a low dielectric material such as a-Si:C:O and a-Si:O:F on the data line assembly and the color filters 131 to 133. The deposition of the a-Si:C:O or a-Si:O:F layer is formed through plasma enhanced chemical vapor deposition (PECVD). The buffer layer 140 is provided to intercept outgassing from the color filters 131 to 133, and to prevent the color filters 131 to 133 from being damaged due to the thermal or plasma energy during the subsequent processing steps. Furthermore, as the buffer layer 140 separates the data line assembly from the thin film transistor array, it is advantageous that the buffer layer 140 has a low dielectric property and a large thickness. For this reason, the a-Si:C:O or a-Si:O:F layer suffering the PECVD is suitable for such a buffer layer. That is, the a-Si:C:O or a-Si:O:F layer exhibits a low dielectric property and a rapid deposition rate while involving lower cost compared to a conventional organic insulating material such as bisbenzocyclobutene (BCB) and perfluorocyclobutene (PFCB). Furthermore, the a-Si:O:C layer exhibits good insulating characteristic in the wide temperature range of from ambient temperature to about 400° C.

A gate line assembly is formed on the buffer layer 140 with a double-layered structure. The data line assembly has a bottom layer 501 formed with copper, copper alloy, silver, silver alloy, aluminum, or aluminum alloy, and a top layer 502 formed with chrome, molybdenum, molybdenum alloy, chrome nitride, or molybdenum nitride.

The gate line assembly includes gate lines 150 crossing over the data lines 120 while defining pixel regions, gate pads 152 connected to the gate lines 150 to receive scanning signals from the outside and transmit the scanning signals to the gate lines 150, gate electrodes 151 for thin film transistors being parts of the gate lines 150.

The gate lines 150 are overlapped with pixel electrodes 410 to form storage capacitors (not shown) for improving capacity of the pixel electric potential storage. In case capacity of the storage due to the overlapping of the pixel electrodes 410 and the gate lines 150 is not enough, a storage capacitor common electrode (not shown) can be additionally formed.

In case the gate line assembly is formed with a multiple-layered structure, one layer is formed with a low resistance material, and the other layer is formed with a material having good contact characteristic with other materials. For instance, layers of Al (or Al alloy)/Cr or Cu/Cr can be provided as the double-layered structure. Furthermore, to improve the contact characteristic, a chrome nitride layer or a molybdenum nitride layer can be additionally formed. According to an embodiment of the present invention, the gate line assembly can be formed with a single-layered structure using a low resistance material such as copper, aluminum and aluminum alloy.

A low temperature deposition gate insulating layer 160 is formed on the gate line assembly, and the buffer layer 140. The low temperature deposition gate insulating layer 160 can be formed with an organic insulating material, low temperature amorphous silicon oxide, or low temperature amorphous silicon nitride. As the color filters 131, 132, and 133 are formed at the bottom substrate, the gate insulating layer 160 is formed with a low temperature deposition insulating layer that can be deposited at lower temperatures of about 250° C. or less.

An island-shaped semiconductor layer 171 is formed on the gate insulating layer over the gate electrodes 151 with a double-layered structure. The semiconductor layer 171 has a bottom layer portion 701 formed with amorphous silicon exhibiting a relatively high band gap, and a top layer portion 702 formed with amorphous silicon exhibiting a band gap lower than the bottom layer portion 701. For instance, the band gap of the bottom layer portion 701 can be established to be about 1.9 eV to about 2.1 eV, and the band gap of the top layer portion 702 to be about 1.7 eV to about 1.8 eV. The thickness of the bottom layer portion 701 is established to be about 50 Å to about 200 Å, and the thickness of the top layer portion 702 to be about 1000 Å to about 2000 Å.

A band offset is formed between the top and the bottom semiconductor layer portions 702 and 701 differentiated in the band gap while corresponding to the difference in the band gap thereof. When a thin film transistor (TFT) is in an ON state, a channel is formed at the band offset region between the top and bottom semiconductor layer portions 702 and 701. As the respective band offset regions basically have the same atomic structure while accompanying with minimized device failures, it can be expected to obtain good TFT characteristics.

Alternatively, the semiconductor layer 171 can be formed with a single-layered structure.

Ohmic contact layers 182 and 183 are formed on the semiconductor layer 171 with amorphous silicon where n-type impurities such as phosphorous P are doped at high concentration, micro-crystalline silicon or metallic silicide while being separated from each other.

A pixel line assembly is formed on the ohmic contact layers 182 and 183 with ITO. The pixel line assembly includes source and drain electrodes 412 and 411, and pixel electrodes 410. The source electrodes 412 are connected to the data lines 120 through contact holes 161 formed at the gate insulating layer 160 and the buffer layer 140. The drain electrodes 411 are connected to the pixel electrodes 410 to receive picture signals from the thin film transistors and transmit them to the pixel electrodes 410. The pixel line assembly is formed with a transparent conductive material such as ITO and IZO.

Subsidiary gate and data pads 413 and 414 are formed at the same plane as the pixel line assembly while being connected to the gate and the data pads 152 and 124 through the contact holes 162 and 164, respectively. The subsidiary gate pads 413 directly contact the chrome top layer 502 of the gate pads 152, and the subsidiary data pads 414 also directly contact the chrome top layer 202 of the data pads 124. In case the gate pads 152 and the data pads 124 include a chrome nitride layer or a molybdenum nitride layer, it is preferable that the subsidiary gate pads 413 and the subsidiary data pads 414 contact the chrome nitride layer or the molybdenum nitride layer. The subsidiary gate and data pads 413 and 414 are provided to enhance the adhesive strength between the pads 152 and 124 and external circuits while protecting them. The pixel electrodes 410 are overlapped with the neighboring gate and data lines 150 and 120 to enhance the opening ratio. Alternatively, the overlapping can be omitted.

The ohmic contact layers 182 and 183 reduce the contact resistance between the source and drain electrodes 412 and 411 and the semiconductor layer 171. According to an embodiment of the present invention, the ohmic contact layers 182 and 183 can be formed of microcrystalline silicon or metallic silicide such as molybdenum, nickel, and chrome while a metallic silicide film remains.

A passivation layer 190 is formed on the source and the drain electrodes 412 and 411 to protect the thin film transistors. A photosensitive colored organic film 430 is formed on the passivation layer 190 while having a dark color for light absorption. The colored organic film 430 intercepts incident light upon the semiconductor layer 171. The colored organic film 430 is used as a spacer to maintain the distance between the bottom insulating substrate 100 and the top insulating substrate 200 while being controlled in height. The passivation layer 190 and the colored organic film 430 can be formed along the gate lines 150 and the data lines 120, and the organic film 430 can intercept light leaked at the peripheral area of the gate line assembly and the data line assembly.

In case the colored organic film 430 is designed to entirely cover the gap between the pixel electrodes and respective metallic layers, it is not necessary to provide a separate black matrix for light absorption at the top substrate.

Meanwhile, a common electrode 210 is formed at the entire surface of the top substrate 200 with ITO or IZO such that it generates electric fields together with the pixel electrodes 410.

A method of fabricating the thin film transistor array substrate will be now explained with reference to FIGS. 20A to 28B.

Figure 20A:
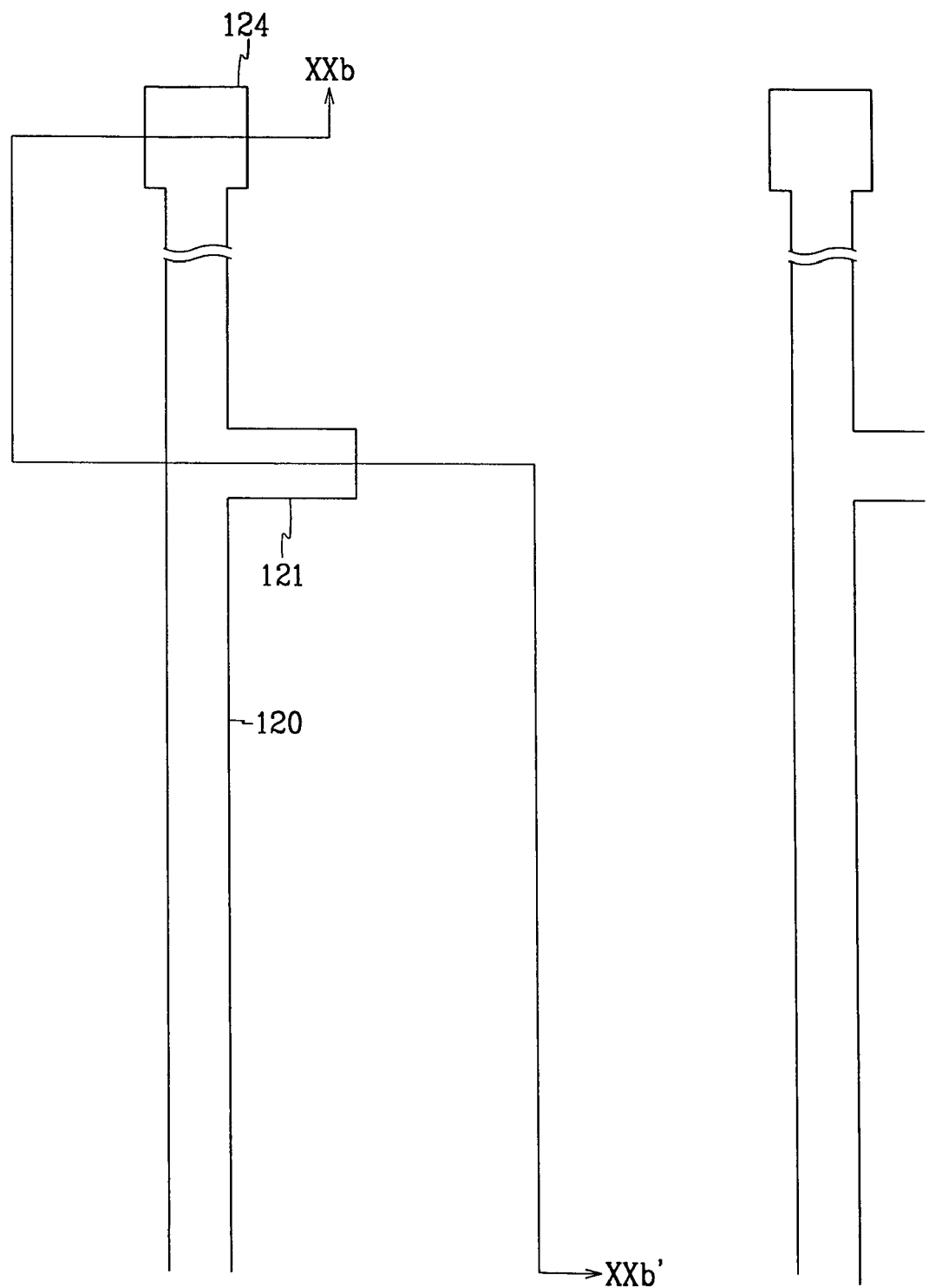
FIG. 20A illustrates the first step of fabricating the thin film transistor array substrate shown in FIG. 18.
Figure 20B:
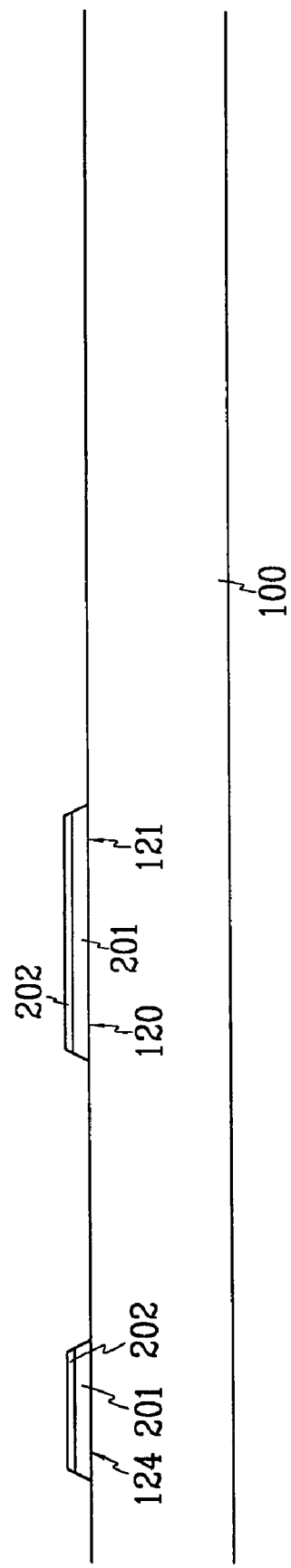
FIG. 20B is a cross sectional view of the thin film transistor array substrate taken along the XXb-XXb' line of FIG. 20A.

Referring to FIGS. 20A and 20B, a data line assembly is formed on a bottom insulating substrate 100 with a double-layered structure. For this purpose, a low resistance conductive material such as aluminum, aluminum alloy, copper, and copper alloy, and a conductive material having good contact characteristic with ITO such as chrome, molybdenum, titanium, chrome nitride, and molybdenum nitride are sequentially deposited onto the substrate 100 through sputtering, and dry or wet-etched through photolithography based on a mask. The resulting data line assembly has a bottom layer 201 and a top layer 202. The data line assembly includes data lines 120, data pads 124, and light absorption members 121.

Considering that a pixel line assembly 410 to 412 and subsidiary pads 413 and 414 to be formed layer would be based on indium tin oxide (ITO), the bottom layer 201 is formed with aluminum, aluminum alloy, copper, or copper alloy, and the top layer 202 with chrome, molybdenum, or titanium. By contrast, in case the pixel line assembly 410 to 412 and the subsidiary pads 413 are formed with indium zinc oxide (IZO), the data line assembly can be formed with a single-layered structure. For instance, the data line assembly can be formed with a single layer based on aluminum, aluminum alloy, copper, or copper alloy.

Figure 21A:
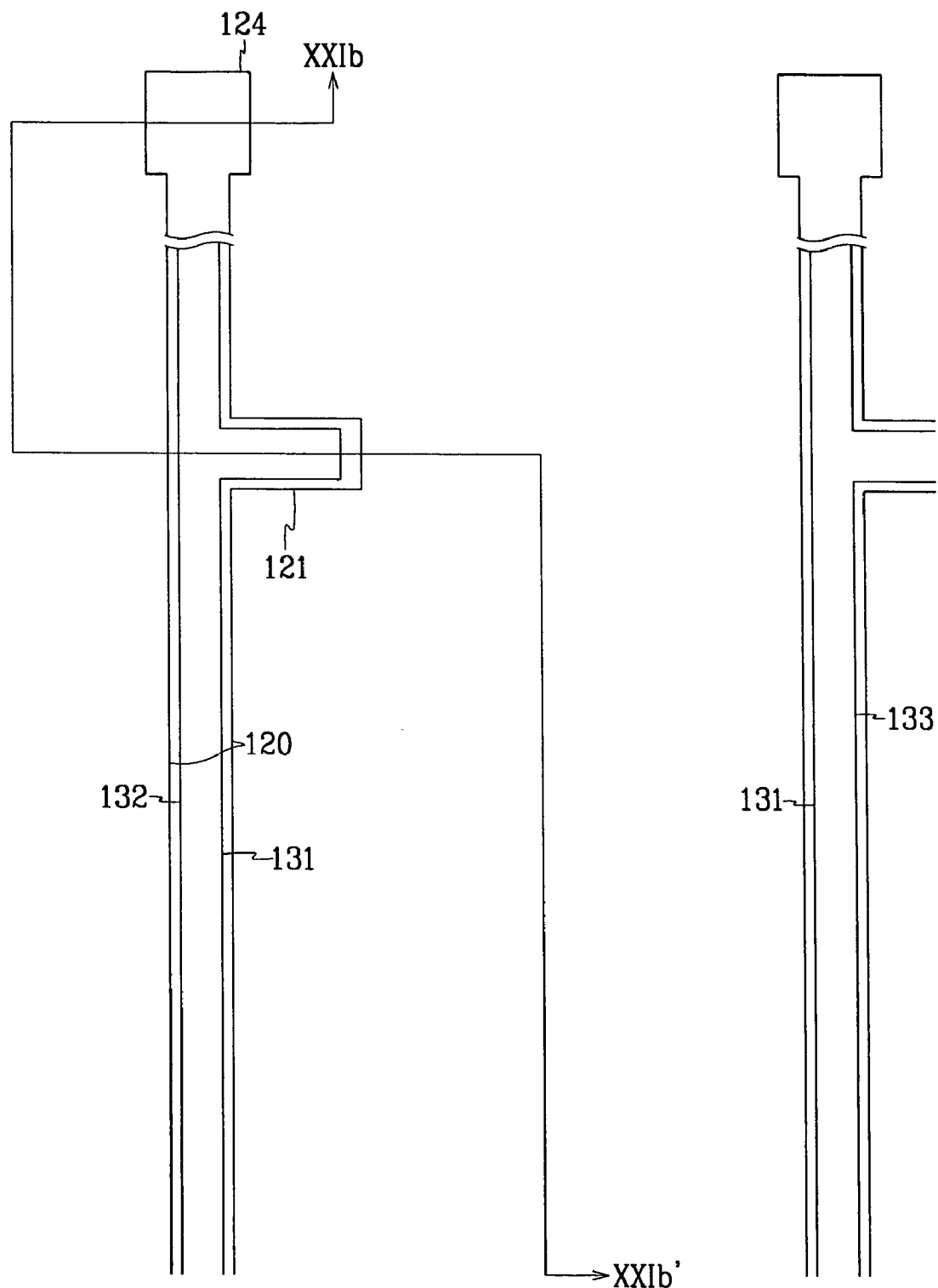
FIG. 21A illustrates the step of fabricating the thin film transistor array substrate following the step illustrated in FIG. 20A.
Figure 21B:
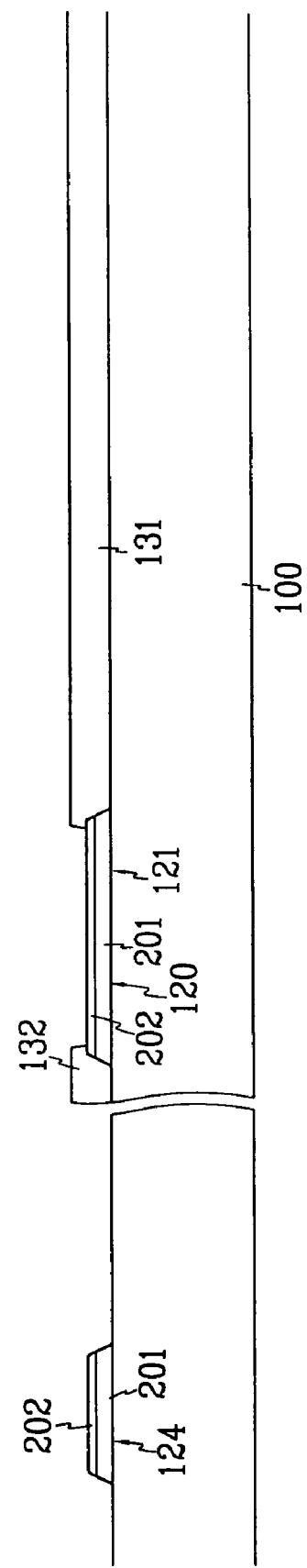
FIG. 21B is a cross sectional view of the thin film transistor array substrate taken along the XXIb-XXIb' line of FIG. 21A.

Thereafter, as shown in FIGS. 21A and 21B, photosensitive materials including pigments of red R, green G and blue B are sequentially coated onto the substrate 100 with the data line assembly, and patterned through photolithography to thereby form color filters 131 to 133 of red R, green G, and blue B. The RGB color filters 131 to 133 are preferably formed using three masks, but one skilled in the art can appreciate that a single mask can be used to form the RGB color filters 131 to 133. Furthermore, it is also possible that the RGB color filters 131 to 133 are formed through laser illumination or printing without any mask. According to an embodiment of the present invention, it is preferable that the peripheral portions of the RGB color filters 131 to 133 are overlapped with the data lines 120.

Figure 22A:
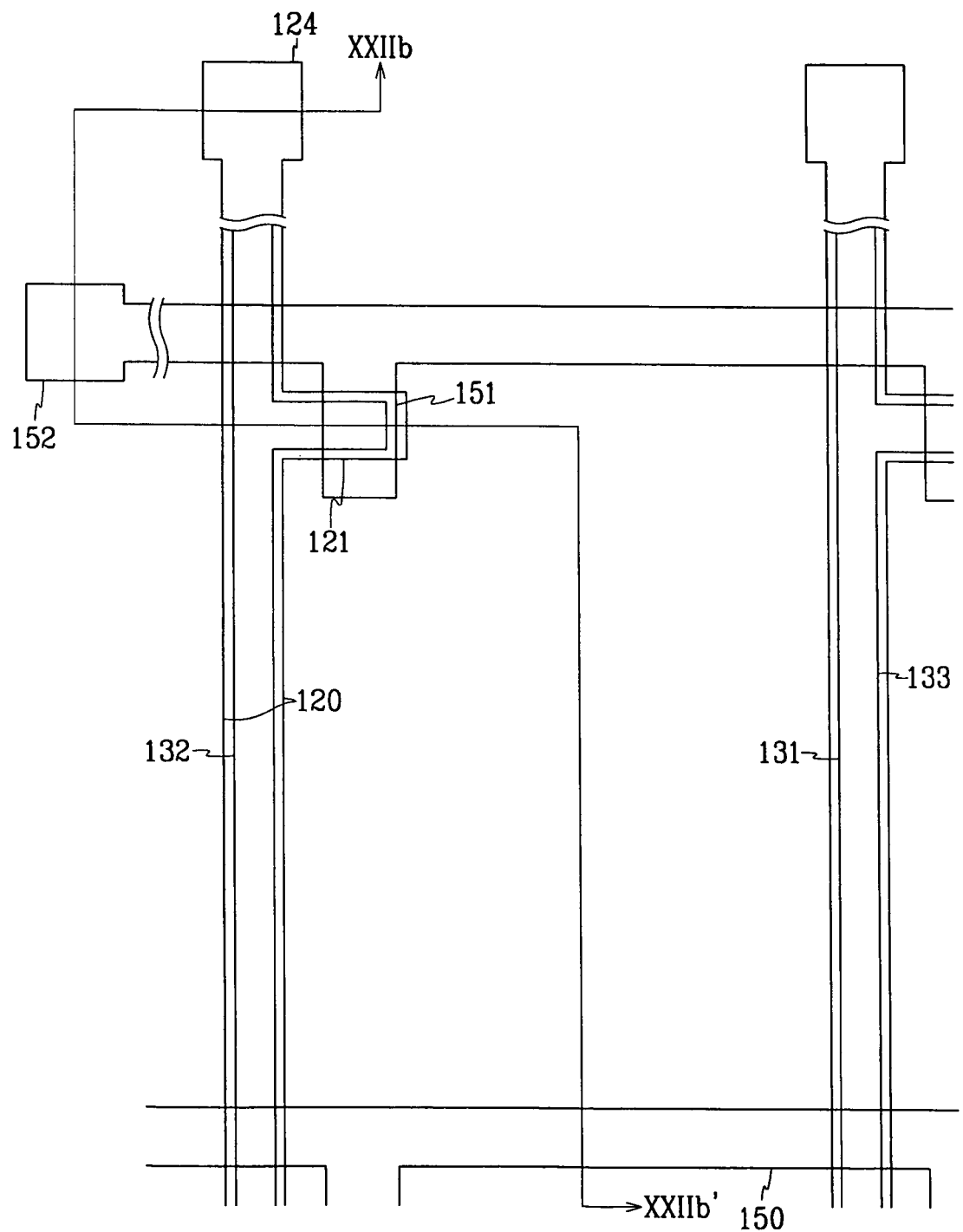
FIG. 22A illustrates the step of fabricating the thin film transistor array substrate following the step illustrated in FIG. 21A.
Figure 22B:
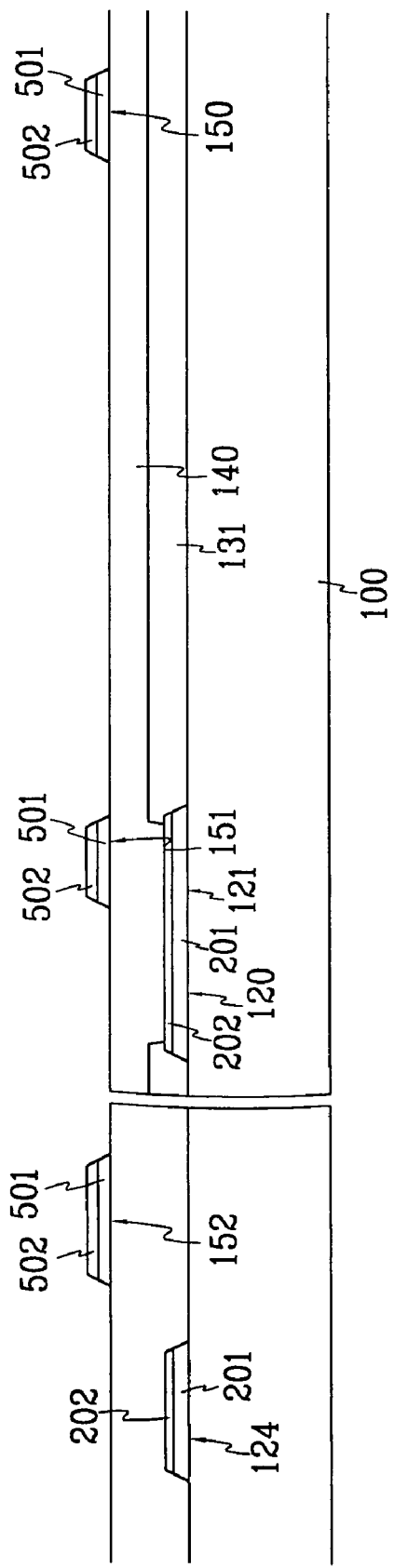
FIG. 22B is a cross sectional view of the thin film transistor array substrate taken along the XXIIb-XXIIb' line of FIG. 22A.

Referring to FIGS. 22A and 22B, an a-Si:C:O or a-Si:O:F layer is grown on the substrate 100 through chemical vapor deposition (CVD) to thereby form a buffer layer 140. In the case of the a-Si:C:O layer, a gaseous material such as $SiH(CH_3)_3$, $SiO_2(CH_3)_4$, $(SiH)_4O_4(CH_3)_4$, and $Si(C_2H_5O)_4$ is used as a basic source while introducing a mixture of an oxide agent such as $N_2O$ and $O_2$, and Ar or He. Furthermore, in the case of the a-Si:O:F layer, a gaseous material such as $SiH_4$ and $SiF_4$ with the addition of $O_2$ is introduced during the deposition process. $CF_4$ can be added as a subsidiary source for fluorine.

Thereafter, a physico-chemically stable material such as chrome, molybdenum, titanium, chrome nitride, and molybdenum nitride, and a low resistance conductive material such as aluminum, aluminum alloy, copper, and copper alloy are sequentially deposited onto the buffer layer 140 through sputtering, and patterned through photolithography to thereby form a gate line assembly. The gate line assembly includes gate lines 150, gate electrodes 151, and gate pads 152.

According to an embodiment of the present invention, the gate line assembly can be formed with a single-layered structure.

Figure 23:
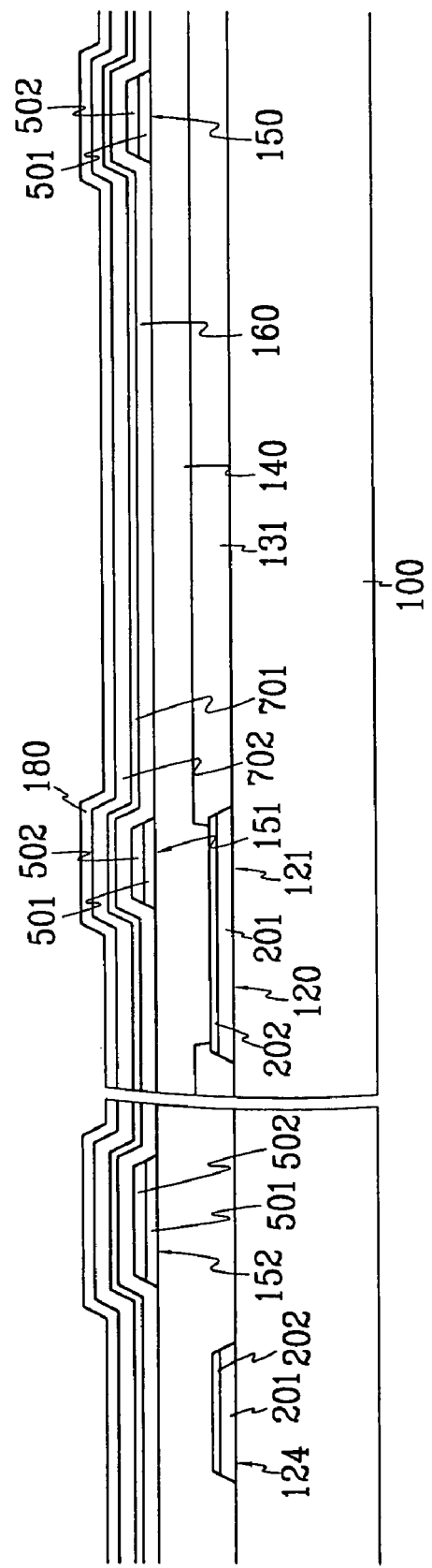
FIG. 23 illustrates the step of fabricating the thin film transistor array substrate following the step illustrated in FIG. 22A.

Referring to FIG. 23, a low temperature deposition gate insulating layer 160, a first amorphous silicon layer 701, a second amorphous silicon layer 702, and an impurities-doped amorphous silicon layer 180 are sequentially deposited onto the gate line assembly and the buffer layer 140.

The low temperature deposition gate insulating layer 160 can be formed with an organic insulating material, low temperature amorphous silicon oxide, low temperature amorphous silicon nitride that can be deposited at about 250° C. or less.

The first amorphous silicon layer 701 is formed with amorphous silicon exhibiting a relatively high band gap, and the second amorphous silicon layer 702 with amorphous silicon exhibiting a band gap lower than the first amorphous silicon layer 701. For instance, the band gap of the first amorphous silicon layer 701 may be established to be about 1.9 eV to about 2.1 eV, and the band gap of the second amorphous silicon layer 702 to be about 1.7 eV to about 1.8 eV. The first amorphous silicon layer 701 can be deposited through CVD while adding $CH_4$, $C_2H_2$, or $C_2H_6$ into the raw gaseous material of $SiH_4$ in an appropriate manner. For instance, when the deposition is performed while injecting $SiH_4$ and $CH_4$ into a CVD device by the ratio of about 1:9, an amorphous silicon layer containing about 50% of C while having a band gap of about 2.0 eV to about 2.3 eV can be deposited. In this way, the band gap of the amorphous silicon layer is influenced by the deposition conditions. The band gap can be easily controlled in the range of about 1.7 eV to about 2.5 eV depending upon the amount of addition of carbonaceous compounds.

The low temperature deposition gate insulating layer 160, the first amorphous silicon layer 701, the second amorphous silicon layer 702, and the impurities-doped amorphous silicon layer 180 can be sequentially deposited without breaking the vacuum state in the same CVD device.

Figure 24A:
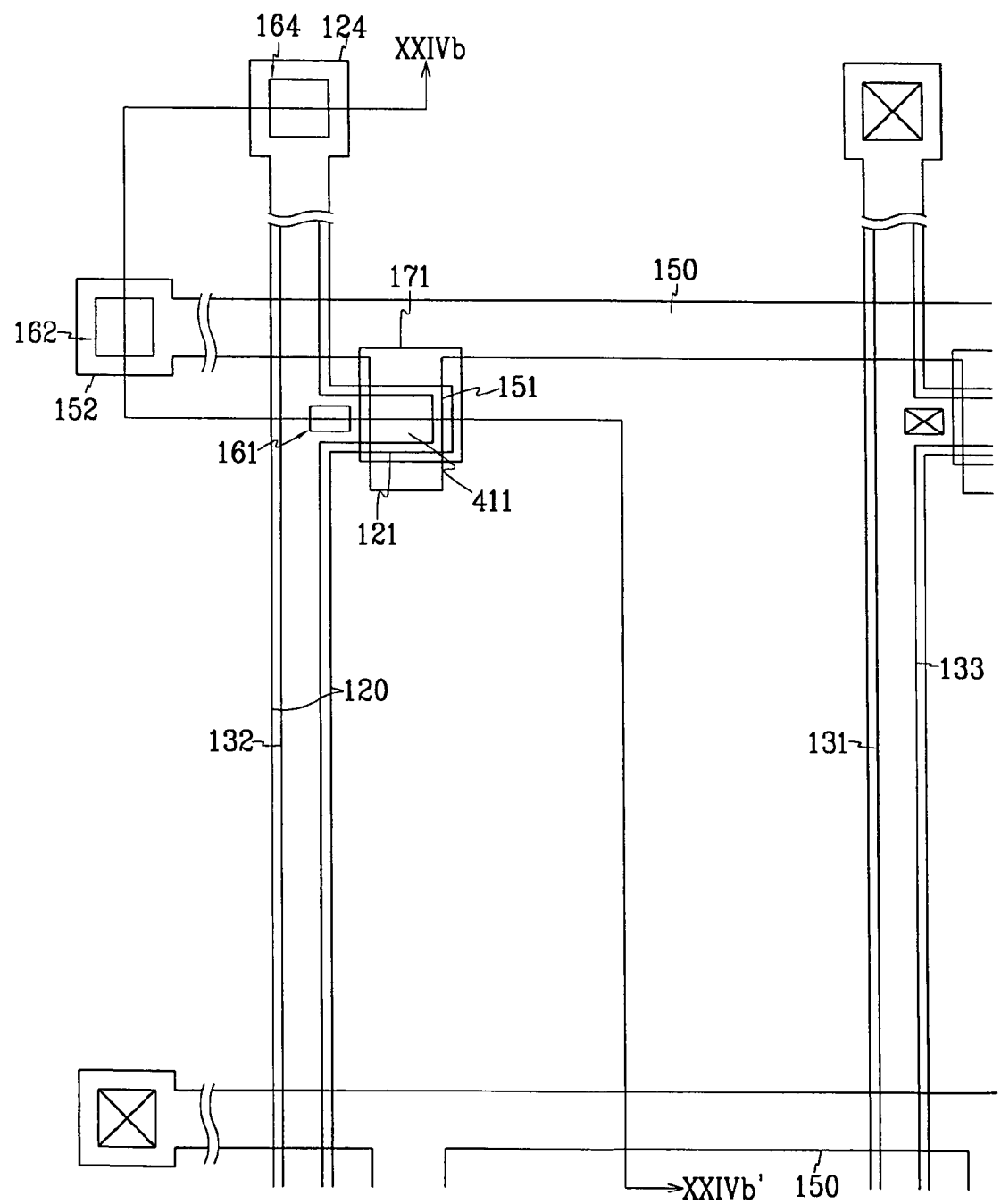
FIG. 24A illustrates the step of fabricating the thin film transistor array substrate following the step illustrated in FIG. 23.
Figure 24B:
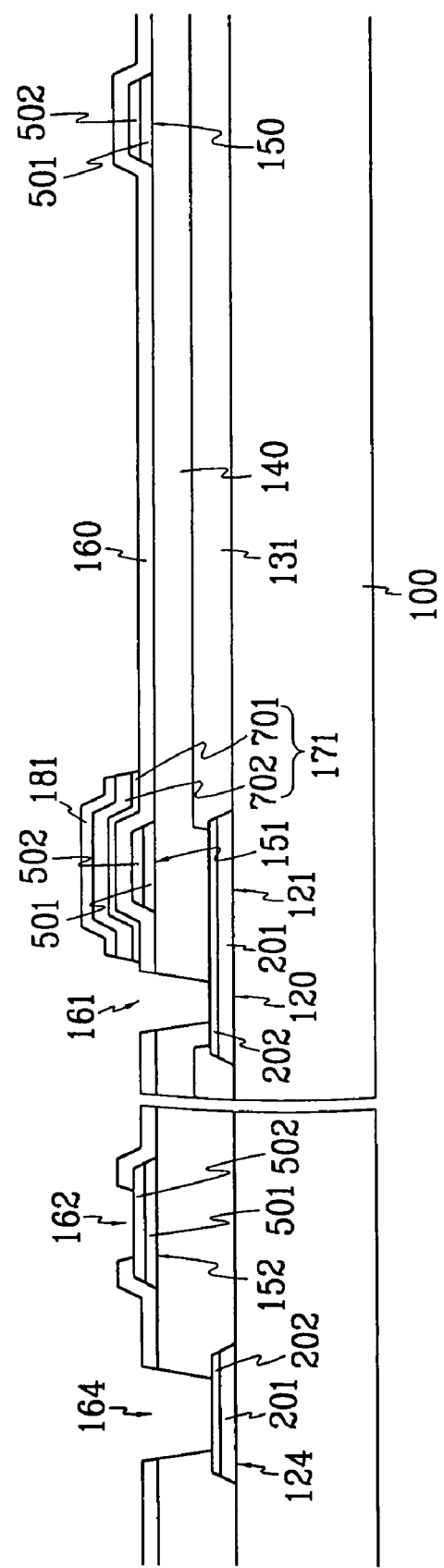
FIG. 24B is a cross sectional view of the thin film transistor array substrate taken along the XXIVb-XXIVb' line of FIG. 24A.

Thereafter, as shown in FIGS. 24A and 24B, the first amorphous silicon layer 701, the second amorphous silicon layer 702, and the impurities-doped amorphous silicon layer 180 are patterned through photolithography to thereby form an island-shaped semiconductor layer 171 and an ohmic contact layer 181. At the same time, contact holes 161, 162, and 164 are formed in the low temperature gate insulating layer 160 and the organic insulating layer 140 while exposing the data lines 120, the gate pads 152, and the data pads 124, respectively.

At this time, the first and the second amorphous silicon layers 701 and 702, and the impurities-doped amorphous silicon layer 180 should be all removed except for the regions over the gate electrodes 151. The first and the second amorphous silicon layer 701 and 702 and the impurities-doped amorphous silicon layer 180 as well as the gate insulating layer 160 should be removed at the regions over the gate pads 152. The first and the second amorphous silicon layers 701 and 702, the impurities-doped amorphous silicon layer 180 and the low temperature deposition gate insulating layer 160 as well as the organic insulating film 140 should be removed at the regions over the data lines 120 and the data pads 124.

The above process is performed through photolithography using one mask. For this purpose, a photoresist pattern differentiated in thickness is used for the mask. This will be explained with reference to FIGS. 25 and 26.

Figure 25:
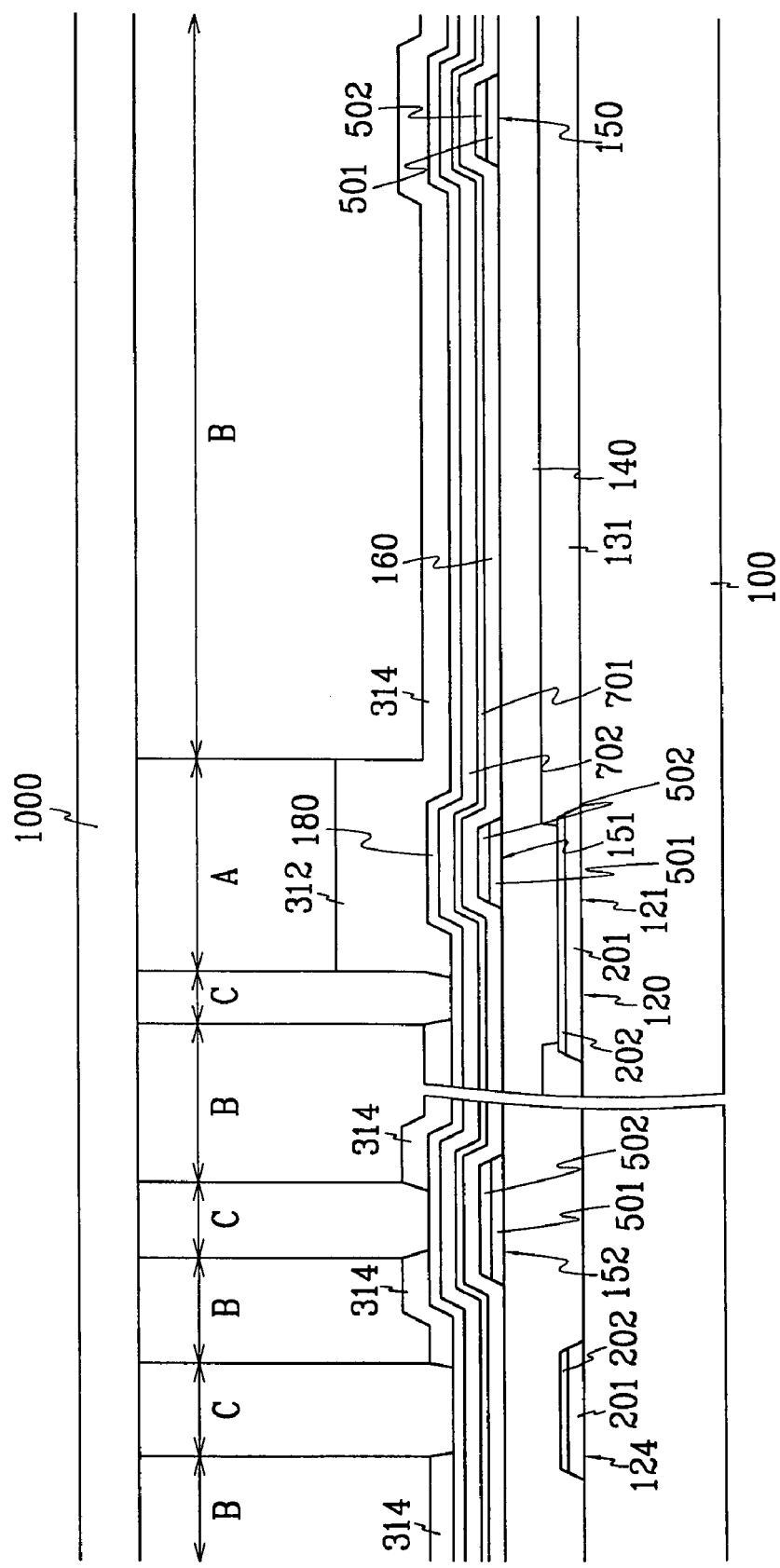
FIGS. 25 and 26 illustrate the sub-steps of fabricating the thin film transistor array substrate during the steps illustrated in FIGS. 23 and 24A.

As shown in FIG. 25, a photoresist film is coated onto the impurities-doped amorphous silicon layer 180 having a thickness of about 1 μm to about 2 μm, exposed to light through a mask, and developed to thereby form a photoresist pattern with first and second portions 312 and 314.

The first portion 312 of the photoresist pattern is placed over the gate electrodes 151 with a thickness larger than the second portion 314 thereof. The photoresist film over the data lines 120, the data pads 124 and the gate pads 152 is partially removed. The thickness of the second photoresist pattern portion 314 is about ½ or less of the thickness of the first photoresist pattern portion 312. For instance, the thickness of the second photoresist pattern portion 314 is about 4000 Å or less.

A mask 1000 is provided with a semitransparent film, or a slit or lattice pattern. If the mask 1000 is made a slit, it is preferable that the width of the slit is smaller than the width of light decomposition portion of the layer at the B area. When a positive photoresist film is exposed to light through the mask 1000, the decomposition degree of high molecules in the photoresist film is differentiated. When the light exposing stops when the high molecules at the C area directly exposed to light are completely decomposed, the high molecules at the B area are also decomposed at some degree. In case the light exposing time is too long, all of the molecules may be decomposed.

When the photoresist film is developed, the first photoresist pattern portion 312 where the high molecules are not nearly decomposed is left at the original thickness, the second photoresist pattern portion 314 where the high molecules are decomposed at some degree has a thickness smaller than that of the first photoresist pattern portion 312, and the remaining portion of the photoresist film at the C area where the high molecules are completely decomposed is removed. In this way, the photoresist pattern differentiated in thickness can be made.

Figure 26:
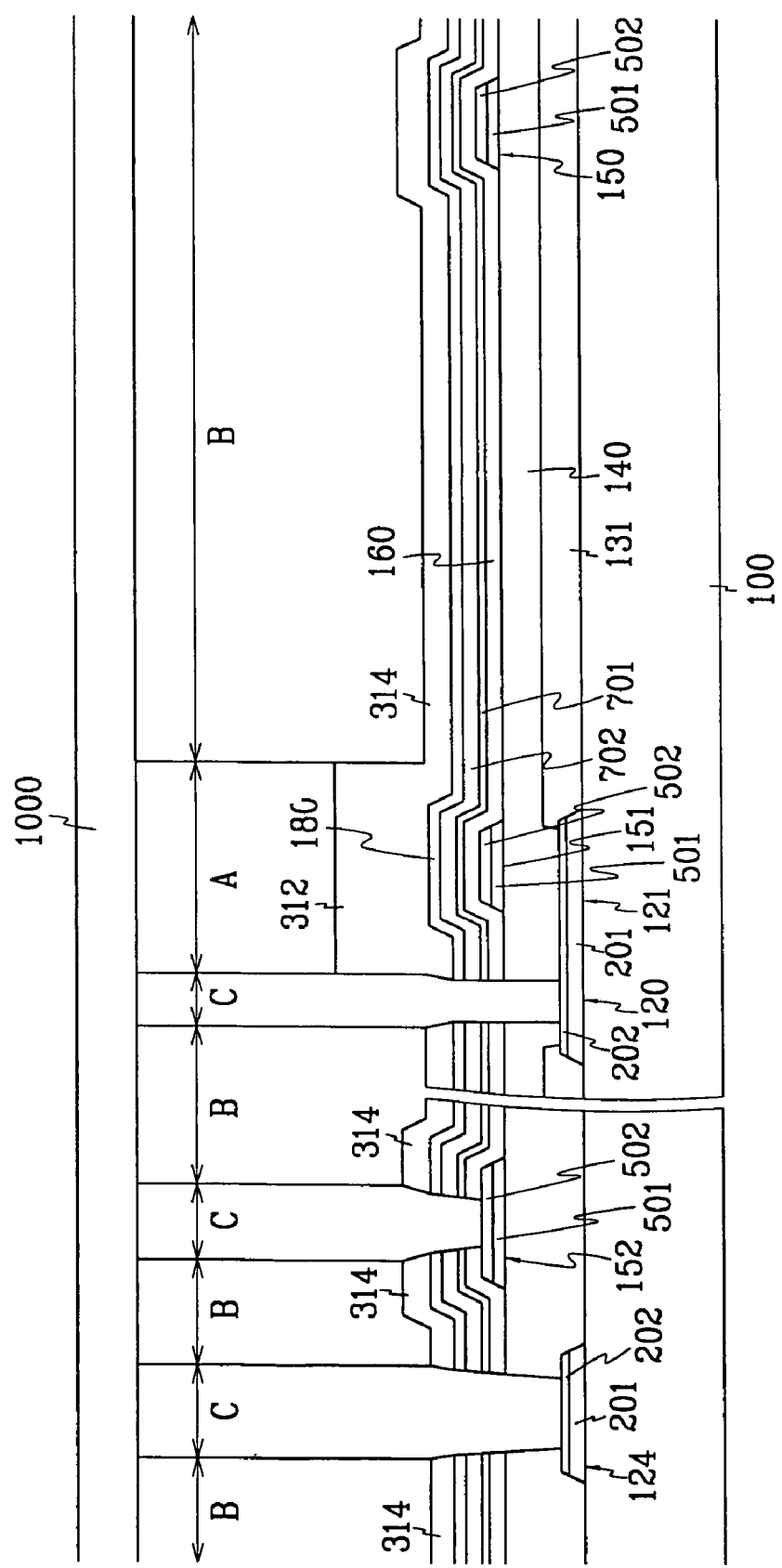

As shown in FIG. 26, the impurities-doped amorphous silicon layer 180, the second amorphous silicon layer 702, the first amorphous silicon layer 702 and the low temperature deposition gate insulating layer 160 are dry-etched using the photoresist pattern with the first and second portions 312 and 314 as etching masks to thereby form contact holes 162 for exposing the gate pads 152, and to expose the buffer layer 140 at the C area. Thereafter, the buffer layer 140 at the C area is dry-etched using the photoresist pattern with the first and second portions 312 and 314 as an etching mask to thereby form contact holes 161 and 164 for exposing the data lines 120 and the data pads 124.

The second photoresist pattern portion 314 is then completely removed. An ashing process using oxygen can be additionally performed to completely remove the photoresist residue of the second photoresist pattern portion 314.

Consequently, the second photoresist pattern portion 314 is removed while exposing the impurities-doped amorphous silicon layer 180. The first photoresist pattern portion 312 is left over while having a thickness reduced by the thickness of the second photoresist pattern portion 314.

Thereafter, the impurities-doped amorphous silicon layer 180 and the underlying first and second amorphous silicon layers 701 and 702 are etched using the first photoresist pattern portion 312 as an etching mask, and removed to thereby form an island-shaped semiconductor layer 171 and an island-shaped ohmic contact layer 181 on the low temperature deposition gate insulating layer 160 over the gate electrodes 151.

Finally, the first photoresist pattern portion 312 is removed. An ashing process using oxygen can be additionally performed to completely remove the photoresist residue of the first photoresist pattern portion 312.

Figure 27A:
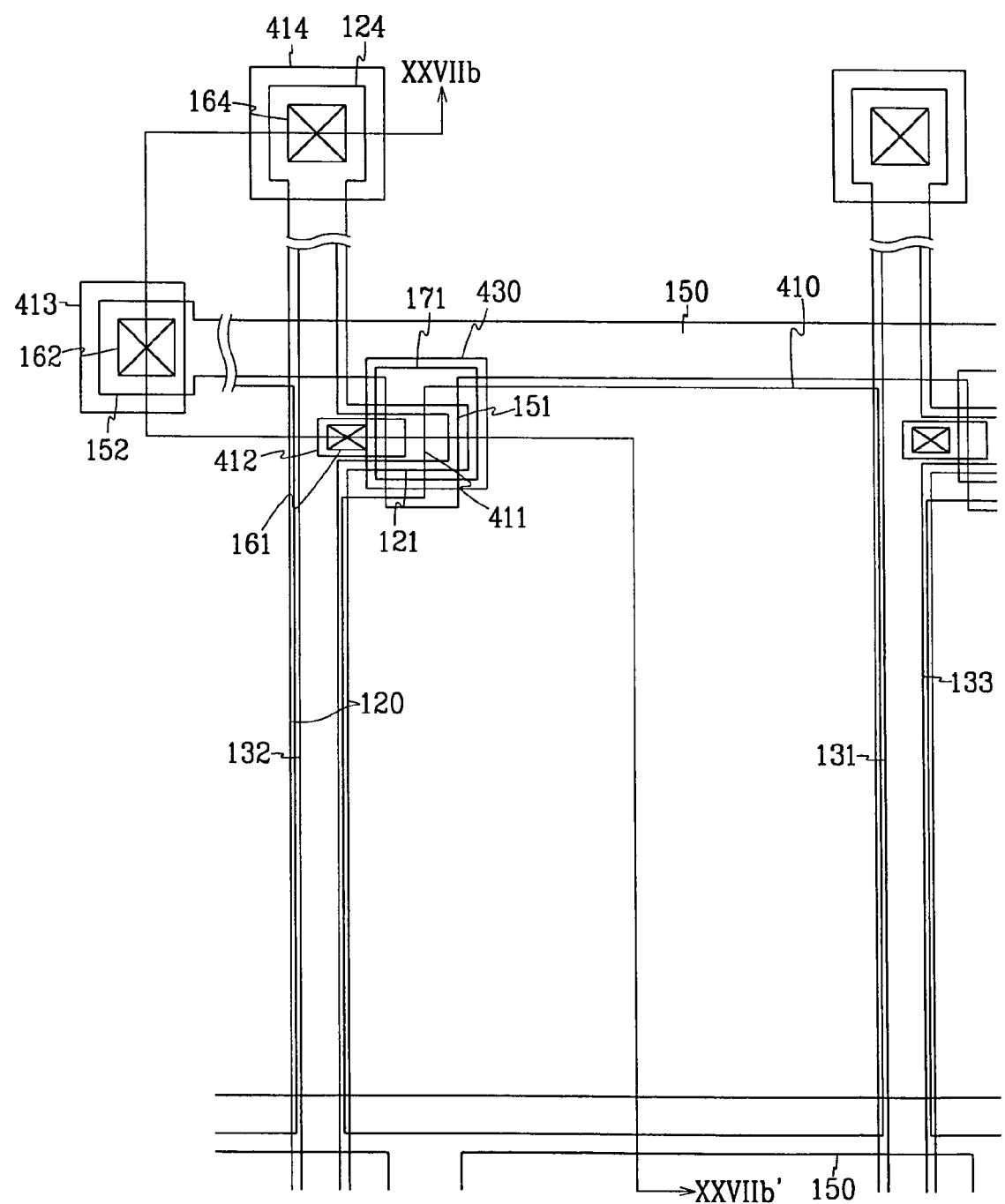
FIG. 27A illustrates the step of fabricating the thin film transistor array substrate following the step illustrated in FIG. 24A.
Figure 27B:
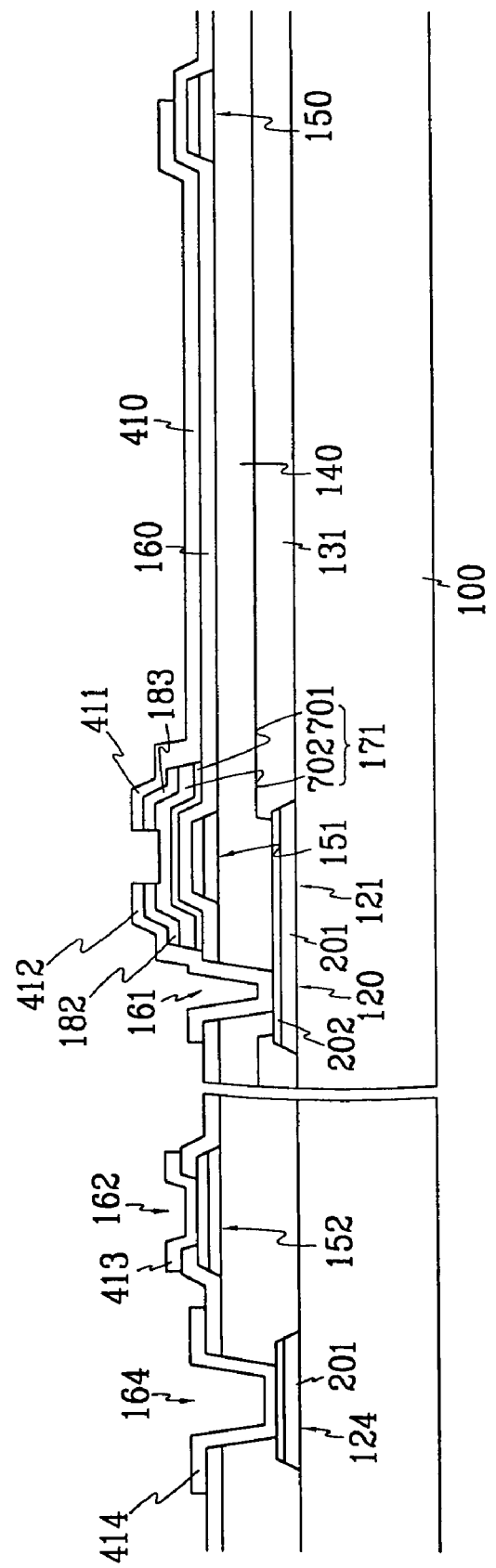
FIG. 27B is a cross sectional view of the thin film transistor array substrate taken along the XXVIIb-XXVIIb' line of FIG. 27A.

As shown in FIGS. 27A and 27B, an ITO layer is deposited onto the substrate 100, and patterned through photolithography to thereby form pixel electrodes 410, source electrodes 412, drain electrodes 411, subsidiary gate pads 413, and subsidiary data pads 414. Alternatively, IZO can be used instead of ITO.

Thereafter, the ohmic contact layer 181 is etched using the source electrodes 412 and the drain electrodes 411 as etching masks to thereby form ohmic contact patterns 182 and 183 while exposing the semiconductor layer 170 between the source electrodes 412 and the drain electrodes 411.

Finally, as shown in FIGS. 18 and 19, an insulating material such as silicon nitride and silicon oxide, and a photosensitive organic material including black pigment are sequentially deposited onto the substrate 100, exposed to light, and developed to thereby form a colored organic film 430. The insulating material is etched using the colored organic film 430 as an etching mask to thereby form a passivation layer 190. The colored organic layer film 430 intercepts incident light upon the thin film transistors. The colored organic film 430 can be formed over the gate line assembly or the data line assembly to prevent light leakage at the periphery of the gate line assembly or the data line assembly. Furthermore, the organic film 430 can be used as a spacer while being controlled in height.

In the meantime, a transparent conductive material such as ITO and IZO is deposited onto a top insulating substrate 200 to thereby form a common electrode 210.

In case the color organic film 430 is designed to entirely cover the gap between the pixel electrodes 410 and the respective metallic layers, it is not necessary to form a separate black matrix for light absorption on the top substrate 200.

Figure 28:
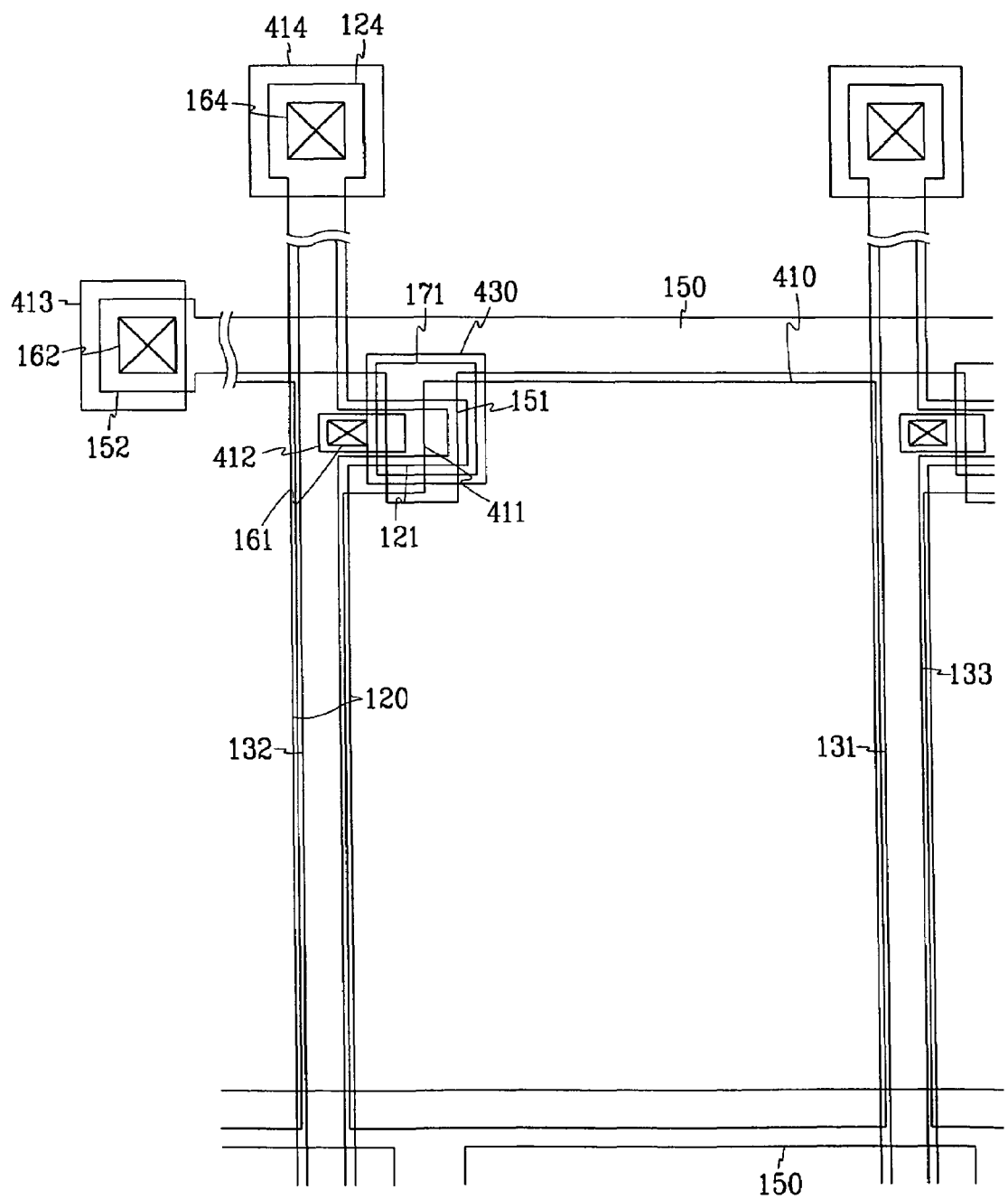
FIG. 28 is a plan view of a thin film transistor array substrate according to another preferred embodiment of the present invention.

FIG. 28 is a plan view of a thin film transistor array substrate according to a fourth preferred embodiment of the present invention. In this preferred embodiment, other components and structures of the thin film transistor array substrate are the same as those of the third preferred embodiment except that data line assembly 120, 121, and 124 and colored organic film 130 are differentiated.

In case gate lines 150 and pixel electrodes 410 are designed to be spaced apart from each other, it is necessary to cover the gap of light leakage between the pixel electrodes 410 and the gate lines 150. For this purpose, data lines 120 formed under color filters 131, 132 and 133 are partially extended toward the gate lines 150 such that they cover the gap between the gate lines 150 and the pixel electrodes 410. Furthermore, colored organic film 430 may cover the gap between the neighboring data lines 120.

Meanwhile, a vertical black matrix portion can be formed at the same plane as the gate line assembly 150, 151 and 152 with a material for the gate line assembly to prevent light leakage at the periphery of the screen area. Furthermore, a horizontal black matrix portion may be formed at the same plane as the data line assembly 120, 121, and 124 with a material for the data line assembly to prevent light leakage at the periphery of the screen area.

With the above structure, as the regions of light leakage are all covered by the data line assembly 120, 121, and 124, the gate line assembly and the spacer, it is not necessary to form a separate black matrix at the top substrate. Therefore, the opening ratio can be enhanced without the need of considering the alignment errors between the top substrate and the bottom substrate. Furthermore, a gate insulating 160 and a low dielectric buffer layer 140 are formed between the data lines 120 and the pixel electrodes 410 while minimizing the parasitic capacitance there. In this way, the opening ratio can be maximized while improving the characteristic of the display device.

As described above, the thin film transistors are made at lower temperatures. That is, to prevent damage to the color filters 131, 132 and 133 due to the high temperature processing, the gate insulating layer 160 is formed with a low temperature deposition insulating layer. Furthermore, to prevent deterioration in the characteristic of the channel induced in contact with the low temperature deposition gate insulating layer, the channel is not formed at the interface between the low temperature deposition gate insulating layer 160 and the semiconductor layer 171, but formed at the bulk side of the semiconductor layer 171.

The above-described structure can be applied for use in various ways. For instance, such a structure is well adapted for use in a plastic liquid crystal display developed for reducing the weight and enhancing the shock-absorption effect while requiring the low temperature processing conditions.

The low dielectric layer based on a-Si:C:O or a-Si:O:F can be used as an embossing insulating layer with protrusion and depression to prevent the interception of reflection light at the thin film transistor array substrate for a reflection type liquid crystal display or a semitransparent liquid crystal display.

Figure 29:
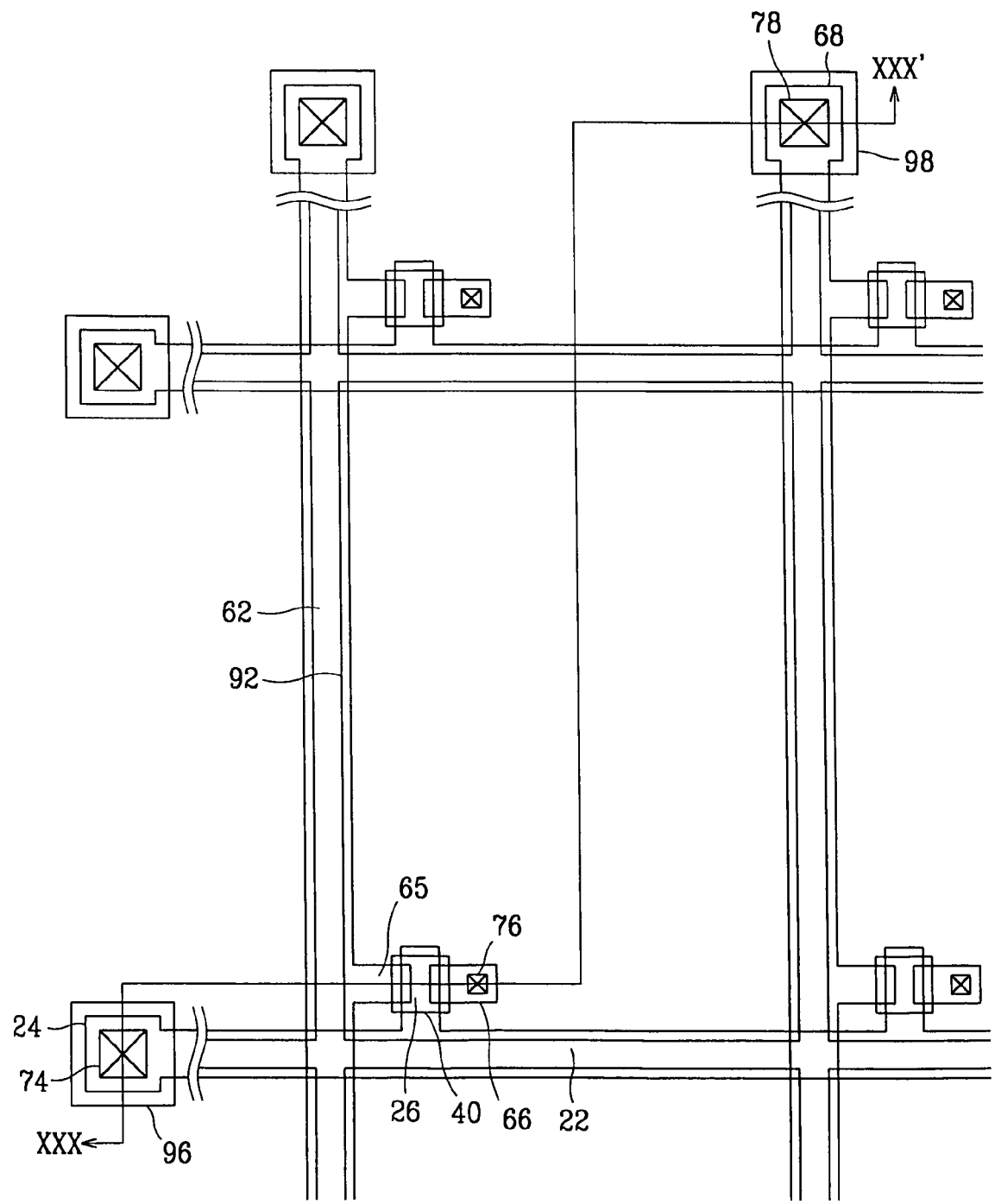
FIG. 29 is a plan view of a thin film transistor array substrate for a reflection type liquid crystal display according to a fifth preferred embodiment of the present invention.
Figure 30:
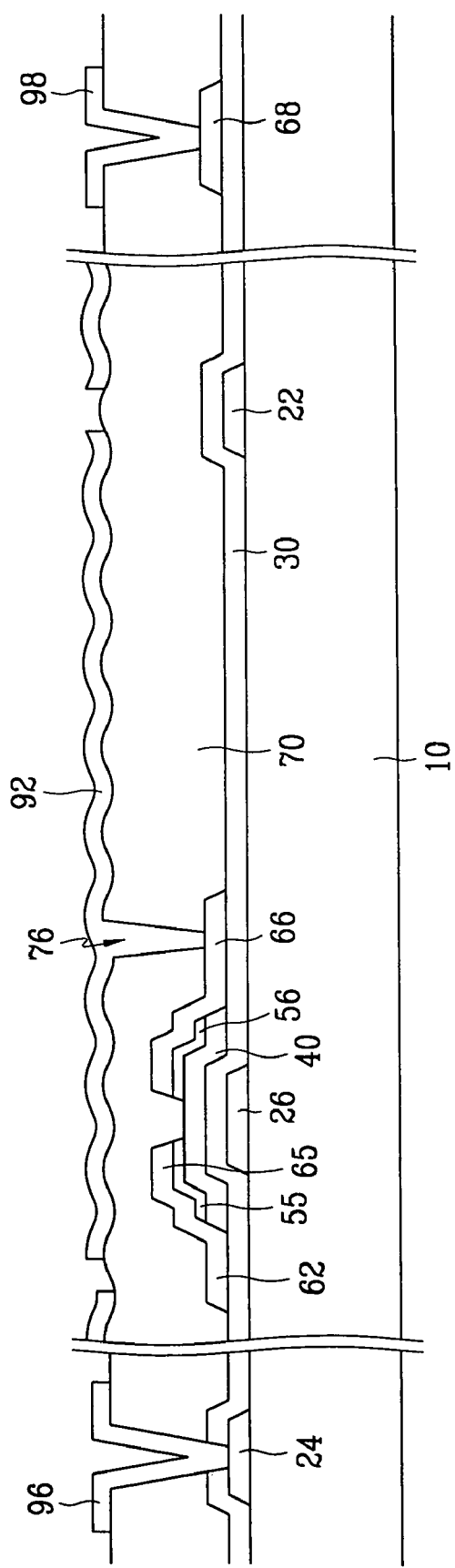
FIG. 30 is a cross sectional view of the thin film transistor array substrate taken along the XXX-XXX' line of FIG. 29.

FIG. 29 is a plan view of a thin film transistor array substrate for a reflection type liquid crystal display according to a fifth preferred embodiment of the present invention, and FIG. 30 is a cross sectional view of the thin film transistor array substrate taken along the XXX-XXX' line of FIG. 29.

A gate line assembly is formed on an insulating substrate 10 with a single-layered structure or a multiple-layered structure. The gate line assembly is formed with a low resistance material such as silver, silver alloy, aluminum, or aluminum alloy. The gate line assembly includes gate lines 22 proceeding in the horizontal direction, gate pads 24 connected to the gate lines 22 to receive gate signals from the outside and transmit the gate signals to the gate lines 22, and gate electrodes 26 for thin film transistors connected to the gate lines 22.

Storage capacitors (not shown) can be formed on the substrate 10 to receive common electrode voltages from the outside. The storage capacitors are overlapped with a reflective layer 92 to be formed layer, thereby forming storage capacitors for improving capacity of the pixel electrode potential storage.

A gate insulating layer 30 is formed at the substrate 10 with silicon nitride SiNx such that it covers the gate line assembly.

A semiconductor layer 40 is formed on the gate insulating layer 30 over the gate electrodes 26 with amorphous silicon. Ohmic contact layers 55 and 56 are formed on the semiconductor layer 40 with silicide, or n+hydrogenated amorphous silicon where n-type impurities are doped at high concentration.

A data line assembly is formed on the ohmic contact layers 55 and 56 and the gate insulating layer 30 while having a conductive layer formed with a low resistance conductive material such as aluminum and silver. The data line assembly includes data lines 62 crossing over the gate lines 22 while defining pixel regions, source electrodes 65 connected to the data lines 62 while having extended over the ohmic contact layer 55, data pads 68 connected to the one-sided ends of the data lines 62 to receive picture signals from the outside, and drain electrodes 66 facing the source electrodes 65 around the gate electrodes 26 while being separated from the source electrodes 65. The drain electrodes 66 are formed on the ohmic contact layer 56 while being extended inside of the pixel regions.

A passivation layer 70 is formed with a low dielectric layer on the data line assembly and the semiconductor layer 40 exposed through the data line assembly with a-Si:C:O or a-Si:O:F. The low dielectric layer is deposited through plasma enhanced chemical vapor deposition (PECVD). The passivation layer 70 has a pattern of protrusion and depression to maximize the reflection efficiency of a reflective layer 92 to be formed later.

The passivation layer 70 has contact holes 76 and 78 for exposing the drain electrodes 66 and the data pads 68, and contact holes 74 for exposing the gate pads 24 together with the gate insulating layer 30.

A reflective layer 92 is formed on the passivation layer 70 at the pixel regions while being electrically connected to the drain electrodes 66 through the contact holes 76. Subsidiary gate pads 96, and subsidiary data pads 98 are formed on the passivation layer 70 while being connected to the gate and the data pads 24 and 68 through the contact holes 74 and 78. The subsidiary gate and data pads 96 and 98 protect the gate and data pads 24 and 68, but can be dispensed.

A method of fabricating the thin film transistor array substrate will be now explained with reference to FIGS. 31A to 34B.

Figure 31A:
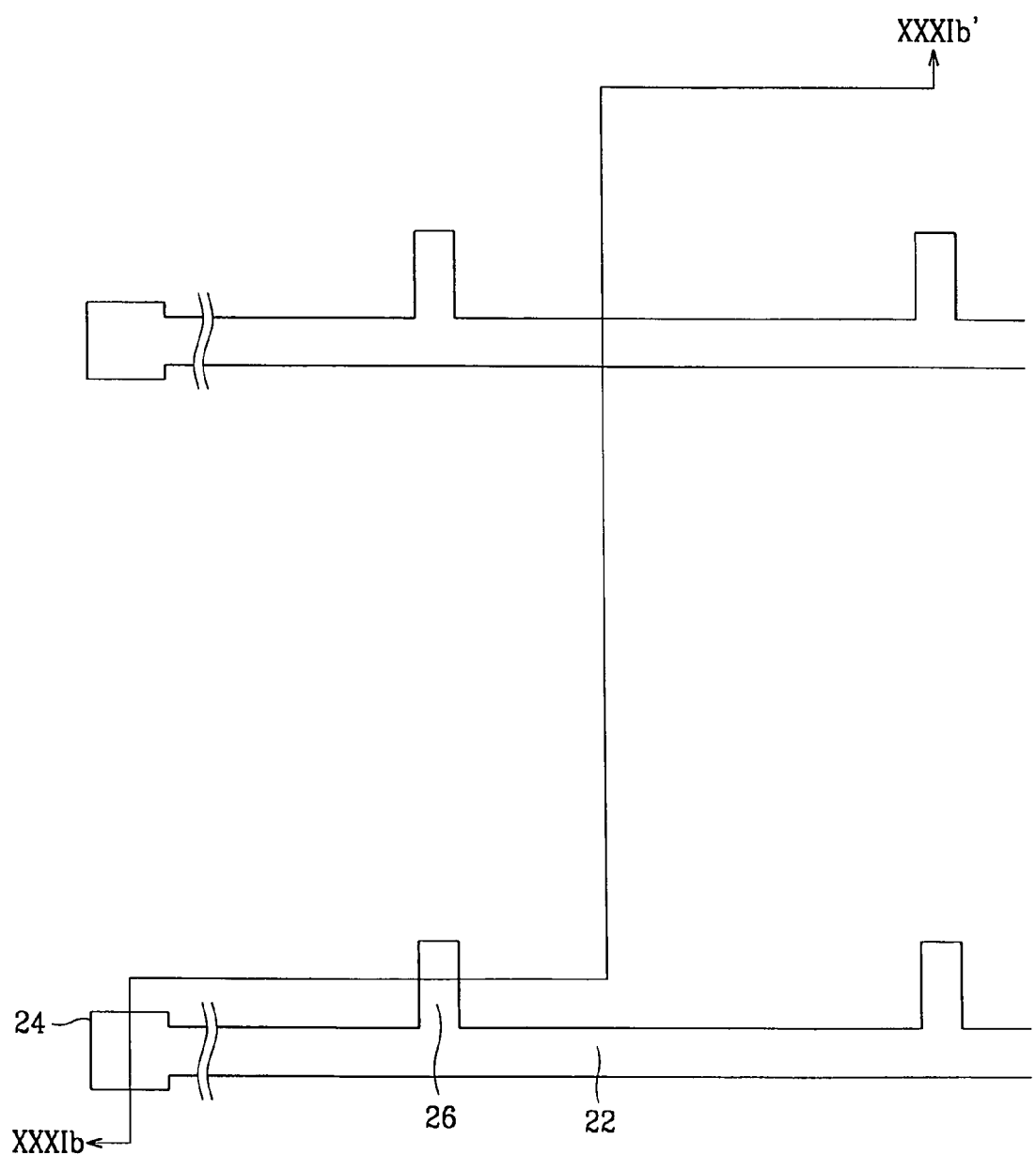
FIGS. 31A, 32A, 33A and 34A sequentially illustrate the steps of fabricating the thin film transistor array substrate shown in FIG. 29.
Figure 31B:
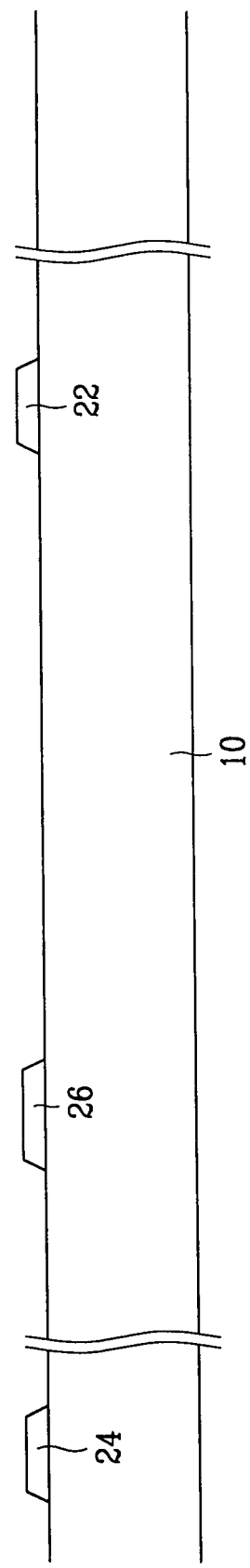
FIG. 31B is a cross sectional view of the thin film transistor array substrate taken along the XXXIb-XXXIb' line of FIG. 31A.

Referring to FIGS. 31A and 31B, a low resistance conductive material is deposited onto a substrate 10, and patterned through photolithography to thereby form a gate line assembly proceeding in the horizontal direction. The gate line assembly includes gate lines 22, gate electrodes 26, and gate pads 24.

Figure 32A:
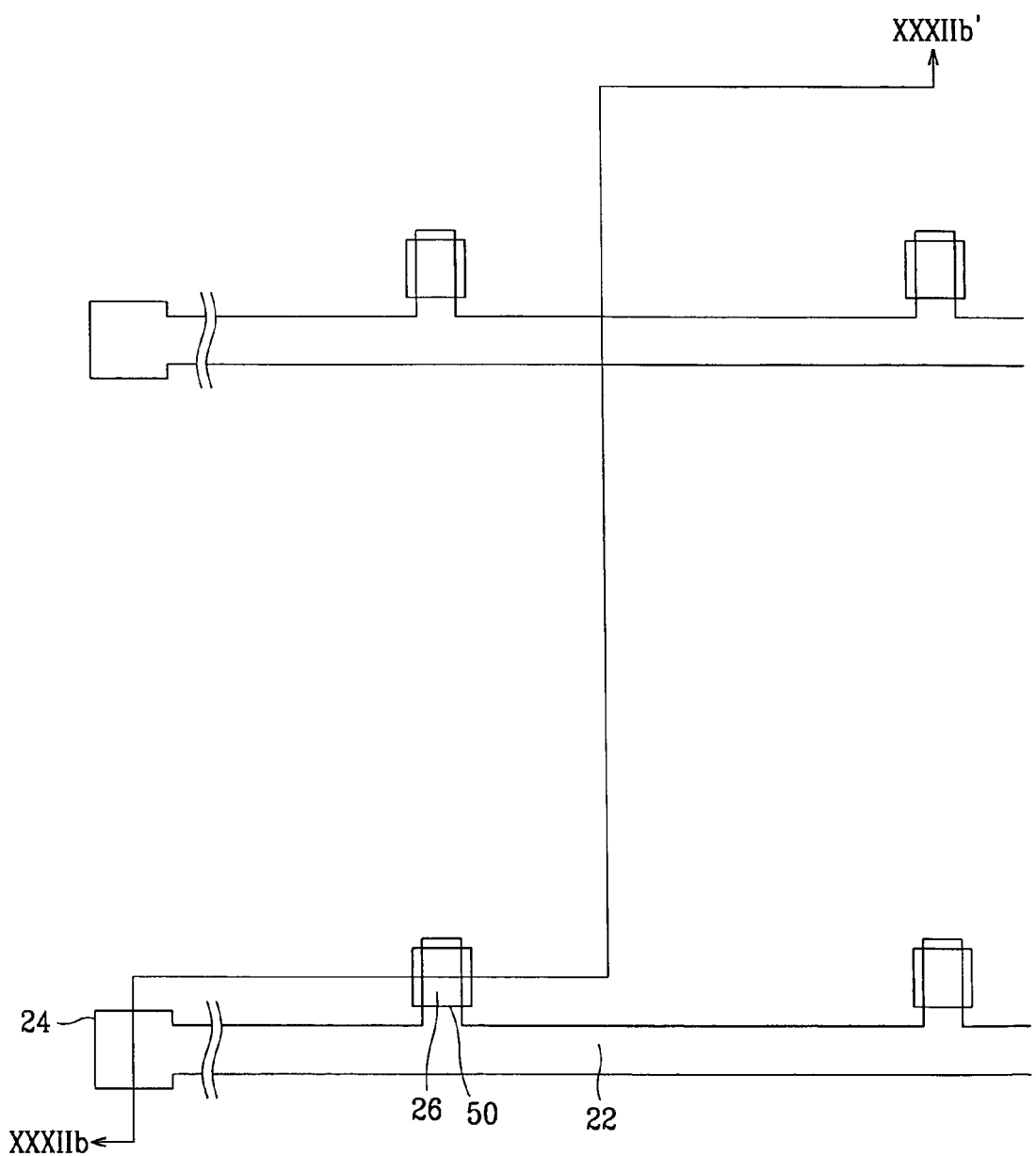
Figure 32B:
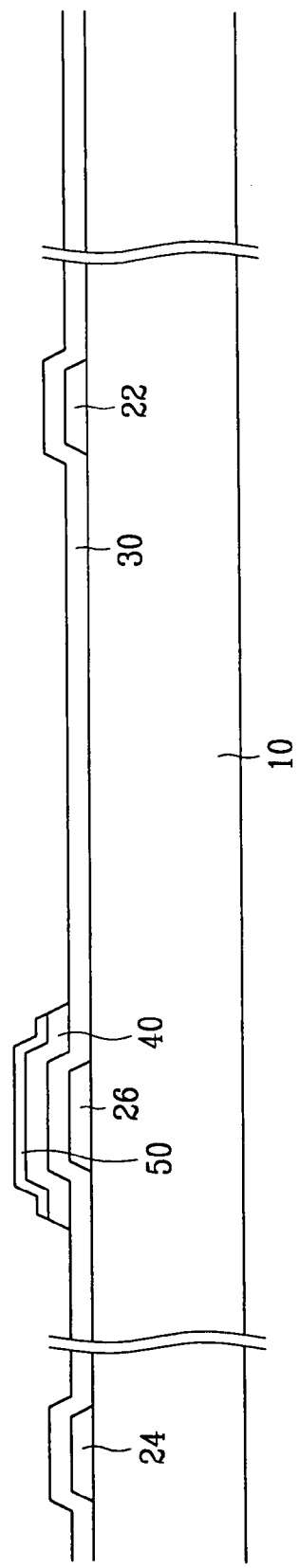
FIG. 32B is a cross sectional view of the thin film transistor array substrate taken along the XXXIIb-XXXIIb' line of FIG. 32A.

Thereafter, referring to FIGS. 32A and 32B, a silicon nitride gate insulating layer 30, an amorphous silicon semiconductor layer 40 and a doped amorphous silicon layer 50 are sequentially deposited onto the substrate 10 with the gate line assembly. The semiconductor layer 40, and the doped amorphous silicon layer 50 are patterned through photolithography to thereby form a semiconductor pattern 40 and an ohmic contact pattern 50 on the gate insulating layer 30 over the gate electrodes 24.

Figure 33A:
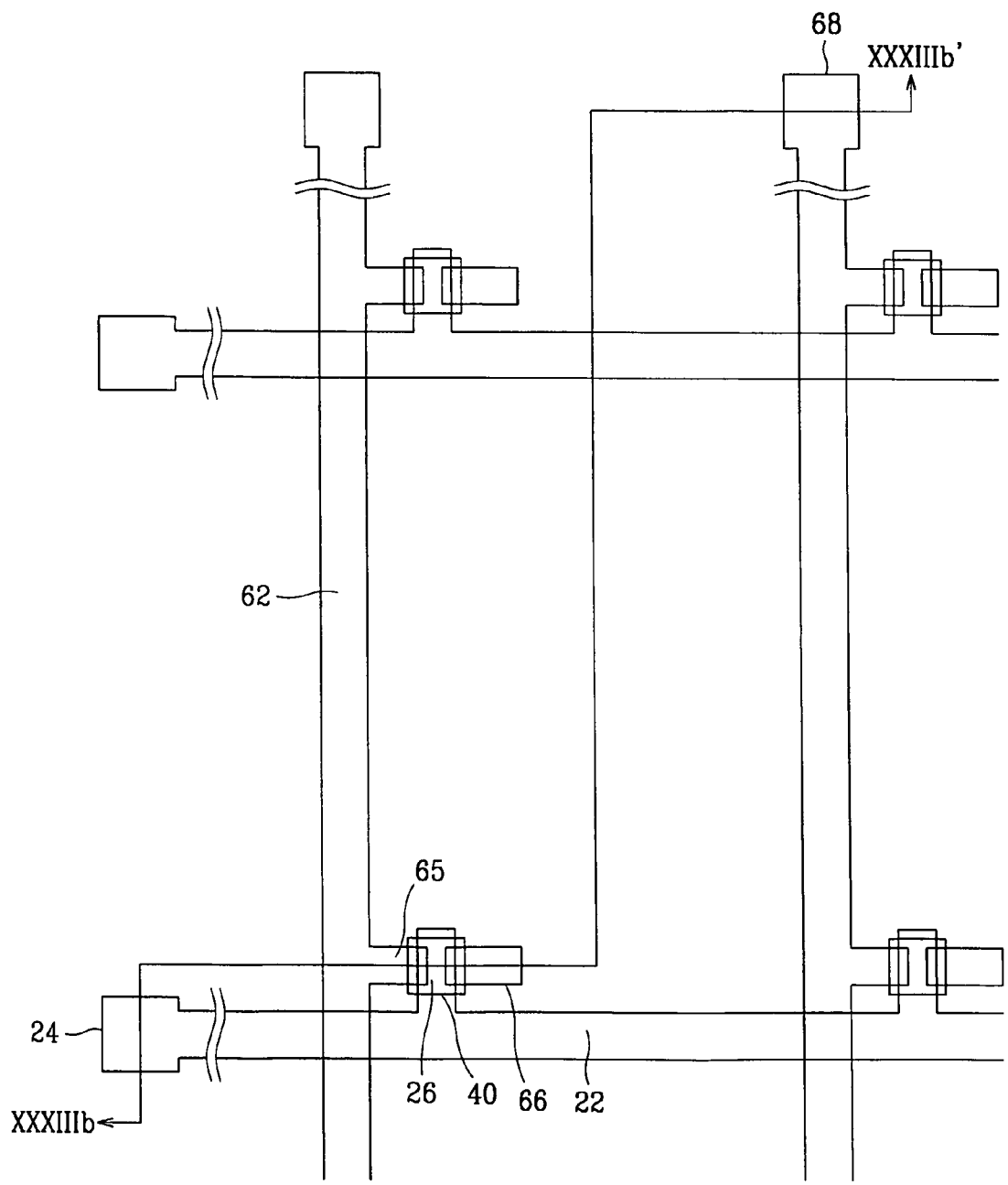
Figure 33B:
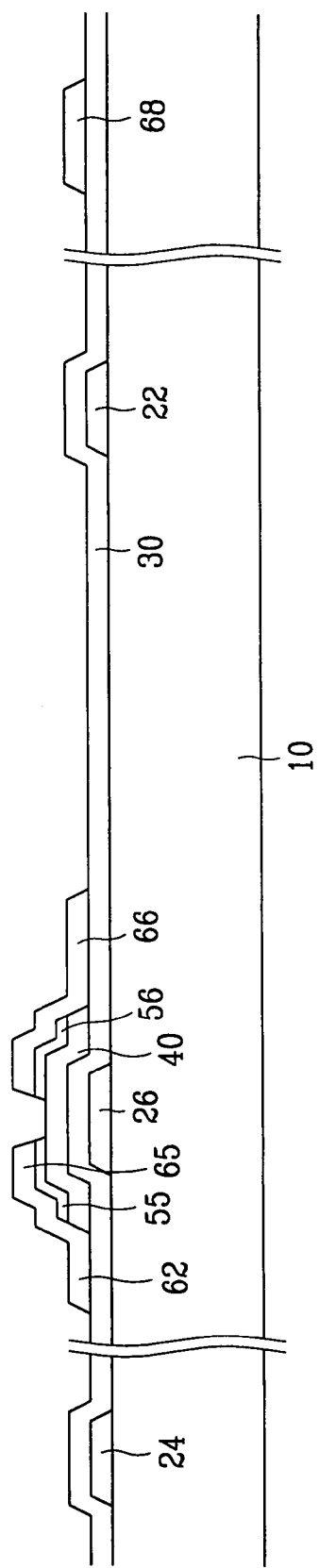
FIG. 33B is a cross sectional view of the thin film transistor array substrate taken along the XXXIIIb-XXXIIIb' line of FIG. 33A.

As shown in FIGS. 33A and 33B, a conductive layer is deposited onto the substrate 10, and patterned through photolithography to thereby form a data line assembly. The data line assembly includes data lines 62 crossing over the gate lines 22, source electrodes 65 connected to the data lines 62 while being extended over the gate electrodes 26, and data pads 68 connected to the one-sided ends of the data lines 62, and drain electrodes 66 facing the source electrodes 65 around the gate electrodes 26 while being separated from the source electrodes 65.

The ohmic contact pattern 50 exposed through the data line assembly is etched, and separated into two pattern portions with respect to the gate electrodes 26. To stabilize the surface of the semiconductor pattern 40, it is preferable that oxygen plasma is made with respect to the semiconductor pattern 40.

Figure 34A:
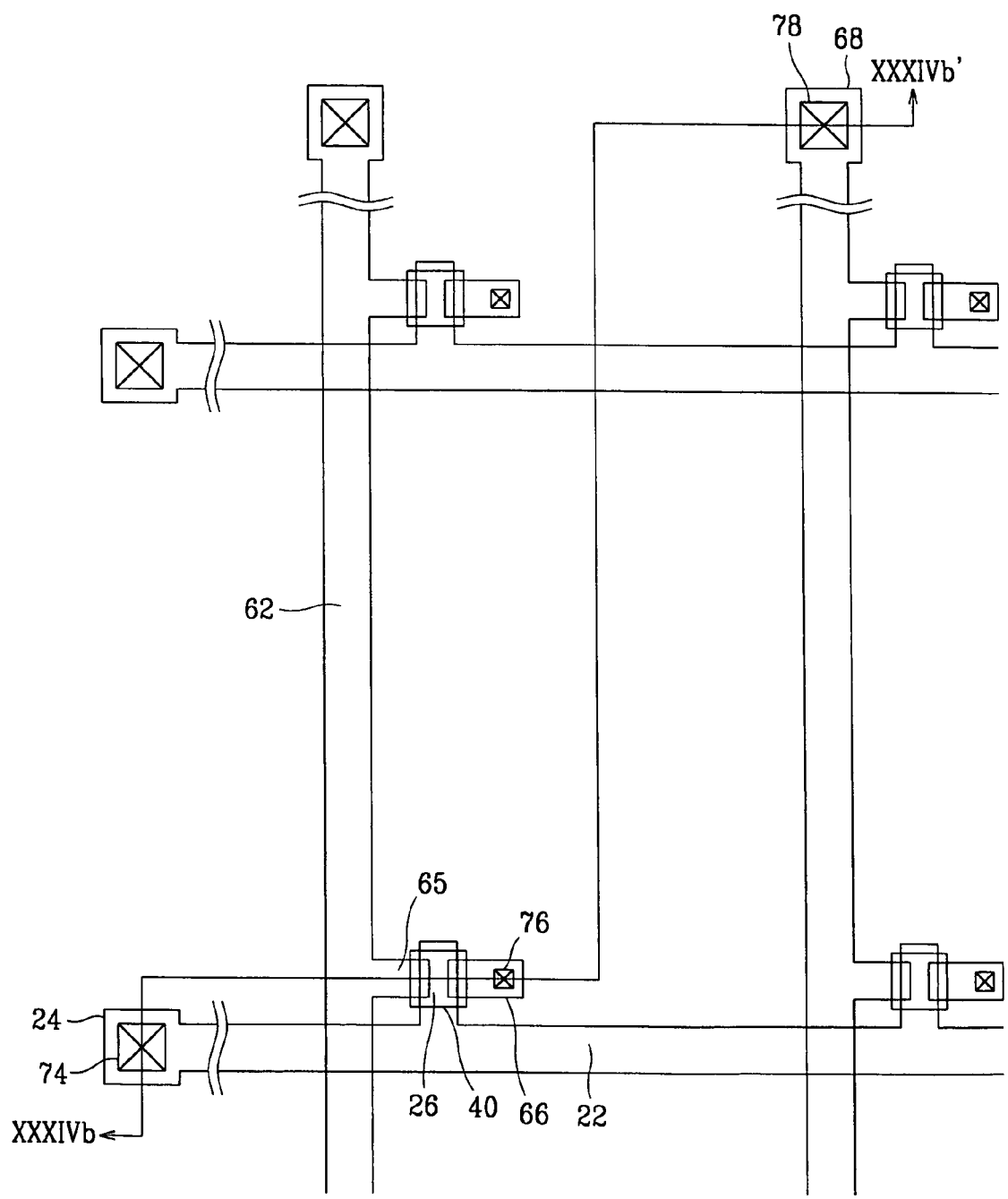
Figure 34B:
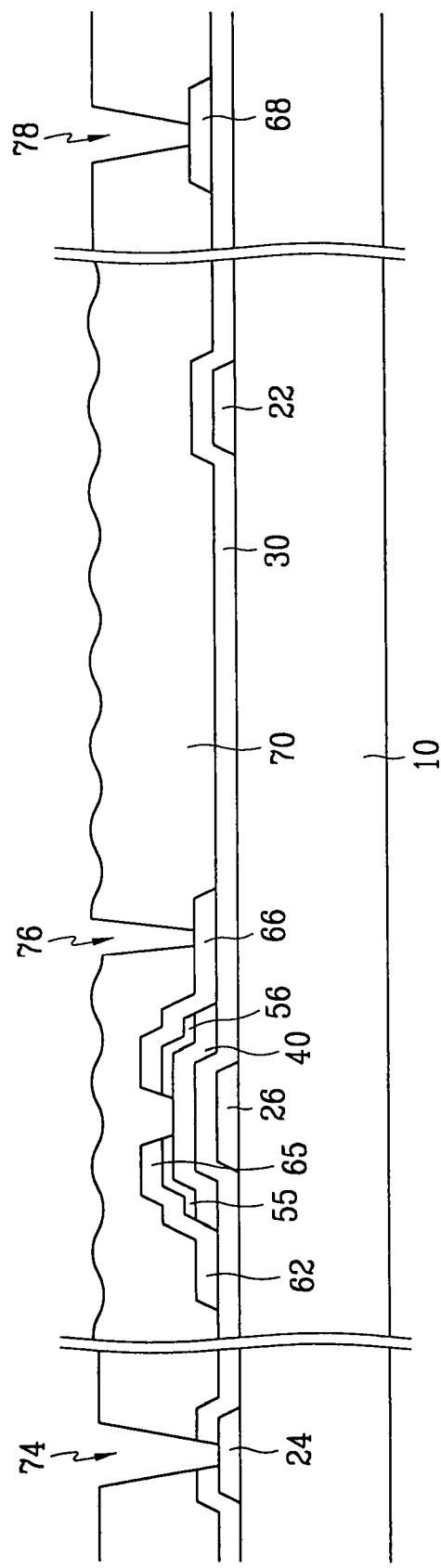
FIG. 34B is a cross sectional view of the thin film transistor array substrate taken along the XXXIVb-XXXIVb' line of FIG. 34A.

Thereafter, referring to FIGS. 34A and 34B, an a-Si:C:O or a-Si:O:F layer is grown through chemical vapor deposition (CVD) to thereby form a passivation layer 70. In the case of the a-Si:C:O layer, a gaseous material such as $SiH(CH_3)_3$, $SiO_2(CH_3)_4$, $(SiH)_4O_4(CH_3)_4$, and $Si(C_2H_5O)_4$ is used as a basic source while introducing a mixture of an oxide agent such as $N_2O$ and $O_2$, and Ar or He. Furthermore, in the case of the a-Si:O:F layer, a gaseous material such as $SiH_4$ and $SiF_4$ with the addition of $O_2$ is introduced during the deposition process. $CF_4$ can be added as a subsidiary source for fluorine. The passivation layer 70 is patterned through photolithography together with the gate insulating layer 30 to thereby form contact holes 74, 76 and 78 exposing the gate pads 24, the drain electrodes 66 and the data pads 68. At the same time, a pattern of protrusion and depression is formed on the passivation layer 70.

The half tone light exposing as employed in relation to the second preferred embodiment is made to form the contact holes 74, 76 and 78 and the pattern of protrusion and depression together. That is, a photoresist film is exposed to light through a mask with a slit or lattice pattern or a semitransparent film, and developed such that the photoresist film portion at the area of contact holes 74, 76, and 78 is entirely removed while exposing the passivation layer 70, the photoresist film portion at the area of a protrusion pattern is left over with a small thickness, and the photoresist film portion at the area of a depression pattern is left over with a large thickness.

Thereafter, the passivation layer 70 and the gate insulating layer 30 are etched using the photoresist pattern as an etching mask to thereby form contact holes 74, 76, and 78, and the thin photoresist pattern portion is removed through ashing. At this time, the thick photoresist pattern portion is also partially removed through the ashing while being reduced in thickness.

The passivation layer 70 is etched for a predetermined period of time to thereby form protrusion portions. The etching time is determined in consideration of the etching rate of the passivation layer 70, and the depth of the protrusion portions.

As shown in FIGS. 29 and 30, a conductive layer is deposited onto the substrate 10 with a reflective conductive material such as silver and aluminum, and patterned through photolithography to thereby form a reflective layer 92 connected to the drain electrodes 66 through the contact holes 76, and subsidiary gate and data pads 96 and 98 connected to the gate and the data pads 24 and 68 through the contact holes 74 and 78, respectively.

Figure 35:
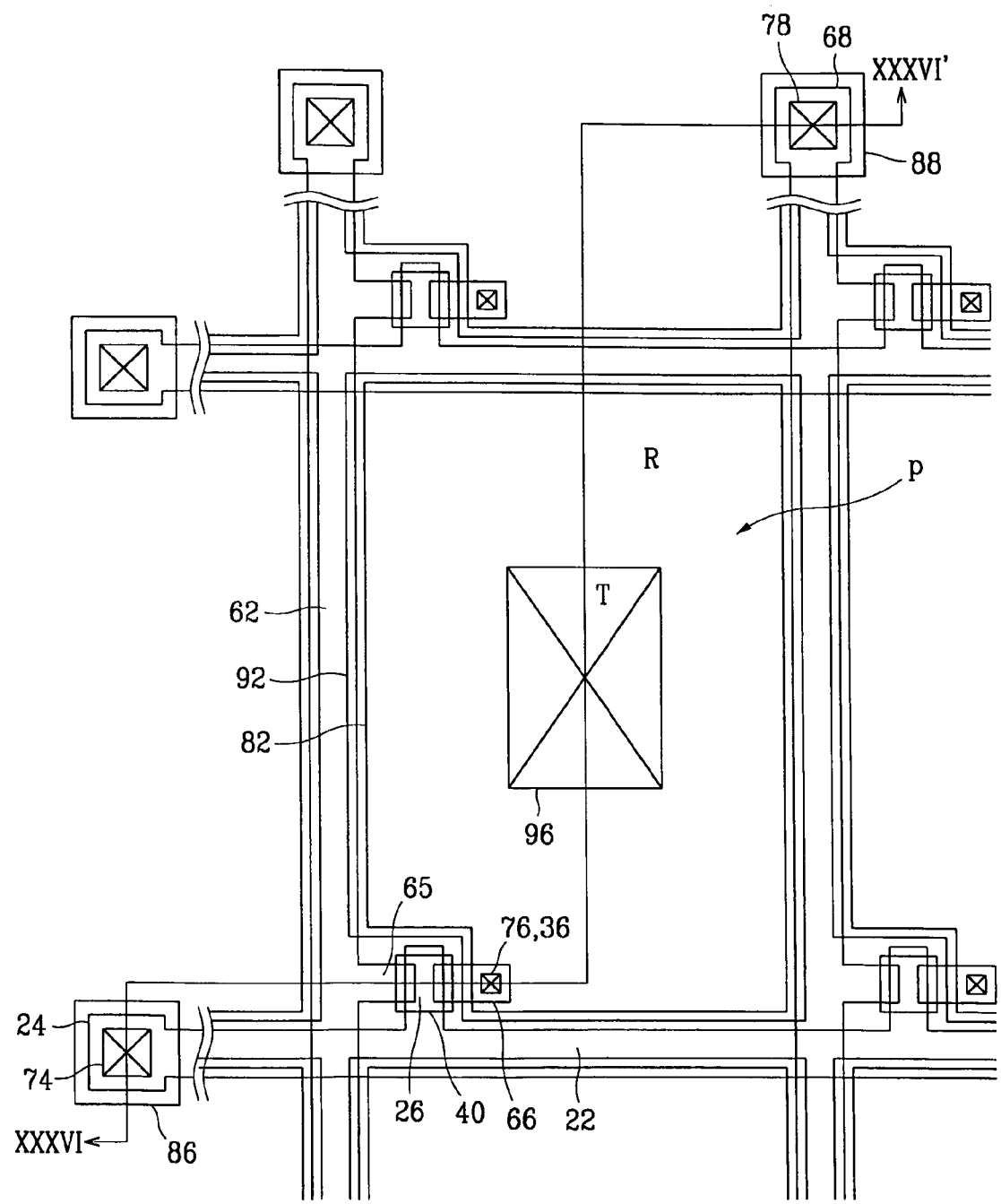
FIG. 35 is a plan view of a thin film transistor array substrate for a semi-transparent liquid crystal display according to another preferred embodiment of the present invention.
Figure 36:
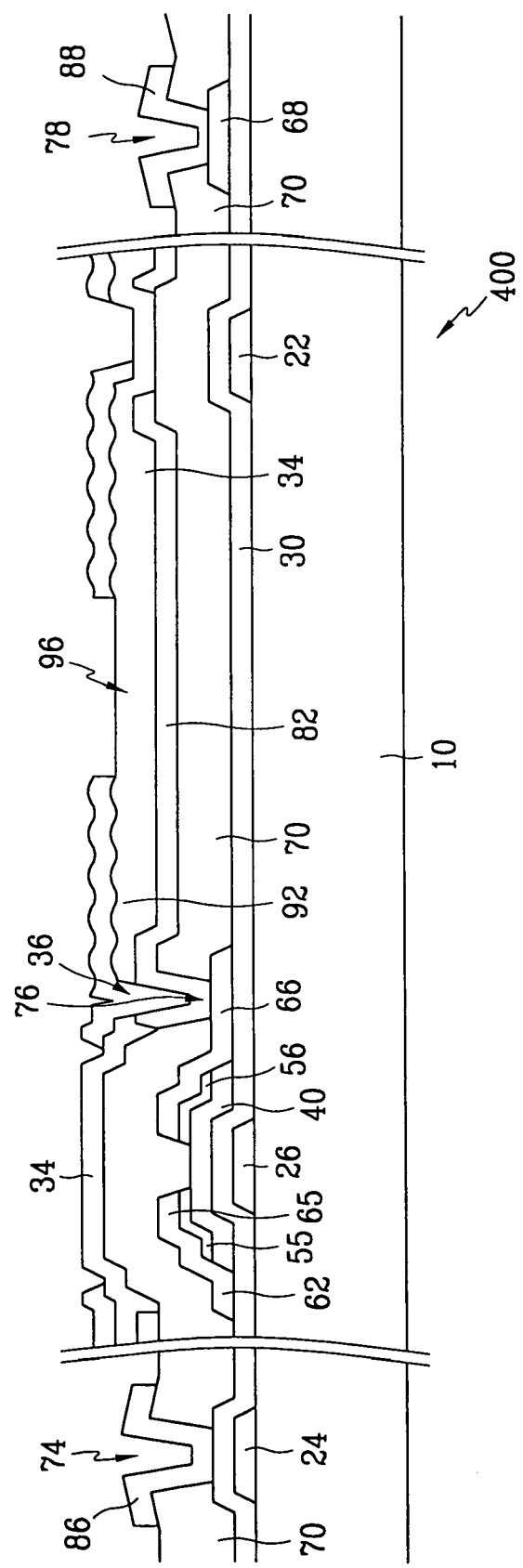
FIG. 36 is a cross sectional view of the thin film transistor array substrate taken along the XXXVI-XXXVI' line of FIG. 35.

FIG. 35 is a plan view of a thin film transistor array substrate for a semitransparent liquid crystal display according to a sixth preferred embodiment of the present invention, and FIG. 36 is a cross sectional view of the thin film transistor array substrate taken along the XXXVI-XXXVI' line of FIG. 35.

A gate line assembly is formed on an insulating substrate 10 with a single-layered structure or a multiple-layered structure. The gate line assembly is formed with a low resistance material such as silver, silver alloy, aluminum, or aluminum alloy. The gate line assembly includes gate lines 22 proceeding in the horizontal direction, gate pads 24 connected to the gate lines 22 to receive gate signals from the outside and transmit gate signals to the gate lines 22, and gate electrodes 26 for thin film transistors connected to the gate lines 22. In case the gate line assembly has a multiple-layered structure, it preferably includes a pad material having good contact characteristic with other materials.

A gate insulating layer 30 is formed on the substrate 10 with silicon nitride $SiN_x$ such that it covers the gate line assembly.

A semiconductor layer 40 is formed on the gate insulating layer 30 over the gate electrodes 26 with amorphous silicon. Ohmic contact layers 55 and 56 are formed on the semiconductor layer 40 with silicide, or $n^+$ hydrogenated amorphous silicon where n-type impurities are doped at high concentration.

A data line assembly is formed on the ohmic contact layers 55 and 56 and the gate insulating layer 30 while having a conductive layer formed with a low resistance conductive material such as aluminum and silver. The data line assembly includes data lines 62 crossing over the gate lines 22 while defining pixel regions, source electrodes 65 connected to the data lines 62 while being extended over the ohmic contact layer 55, data pads 68 connected to the one-sided ends of the data lines 62 to receive picture signals from the outside, and drain electrodes 66 facing the source electrodes 65 around the gate electrodes 26 while being separated from the source electrodes 65.

A passivation layer 70 is formed with a low dielectric layer on the data line assembly and the semiconductor layer 40 exposed through the data line assembly with a-Si:C:O or a-Si:O:F. The low dielectric layer is deposited through plasma enhanced chemical vapor deposition (PECVD). The a-Si:C:O or a-Si:O:F layer has a dielectric constant of about 4 or less. Therefore, the passivation layer 70 has a lower dielectric constant, there is minimal parasitic capacitance, even if it has a thin thickness. Furthermore, the passivation layer 70 involves good adhesion characteristics and step coverage characteristics in relation to other layers. As the passivation layer 70 is based on a low dielectric film, it has excellent thermostabiliy compared to that based on an organic insulating film. In addition, the a-Si:C:O or a-Si:O:F layer deposited through PECVD exhibits an advantage in the processing time as the deposition rate or etching rate related thereto is rapid by about four to about ten times compared to that related to a conventional silicon nitride layer.

The passivation layer 70 has contact holes 76 and 78 exposing the drain electrodes 66 and the data pads 68, and contact holes 74 exposing the gate pads 24 together with the gate insulating layer 30.

Transparent electrodes 82 are formed on the passivation layer 70 at the pixel regions while being electrically connected to the drain electrodes 66 through the contact holes 76. Furthermore, subsidiary gate and data pads 86 and 88 are formed on the passivation layer 70 while being connected to the gate and the data pads 24 and 68 through the contact holes 74 and 78. The transparent electrodes 82 and the subsidiary gate and data pads 86 and 88 are formed with indium tin oxide (ITO) or indium zinc oxide (IZO).

An inter-layered insulating layer 34 is formed on the transparent electrodes 82 while having contact holes 36 partially exposing the transparent electrodes 82. The inter-layered insulating layer 34 is formed with a-Si:C:O or a-Si:O:F. The a-Si:C:O or a-Si:O:F layer (the low dielectric CVD layer) is deposited through plasma enhanced chemical vapor deposition (PECVD). It is preferable that the inter-layered insulating layer 34 has a pattern of protrusion and depression to maximize the reflection efficiency of a reflective layer 92 to be formed later.

A reflective layer 92 is formed on the inter-layered insulating layer 34 with light transmission windows 96 at transmission mode regions T while being electrically connected to the transparent electrodes 82 through the contact holes 36. The reflective layer 92 is formed with a high reflective conductive material such as aluminum, aluminum alloy, silver, silver alloy, molybdenum, and molybdenum alloy. The reflective layer 92 forms pixel electrodes in association with the transparent electrodes 82. The light transmission windows 96 of the reflective layer 92 can be formed with various shapes. A plurality of windows 96 can be formed at one pixel region. Even if a pattern of protrusion and depression is formed at the inter-layered insulating layer 34, it is preferable that such a pattern of protrusion and depression is not formed at the area of the windows 96.

The transparent electrodes 82 and the reflective layer 92 are overlapped with the front gate lines 22 to thereby form storage capacitors. If needed, a storage capacitor line assembly can be formed at the same plane as the gate line assembly to obtain the required storage capacitance.

A method of fabricating the thin film transistor array substrate will be now explained in detail.

In this preferred embodiment, the procedures of processing are the same as those related to the fifth preferred embodiment up to the step of forming a data line assembly and hence, illustrated in FIGS. 31A to 33B.

Figure 37A:
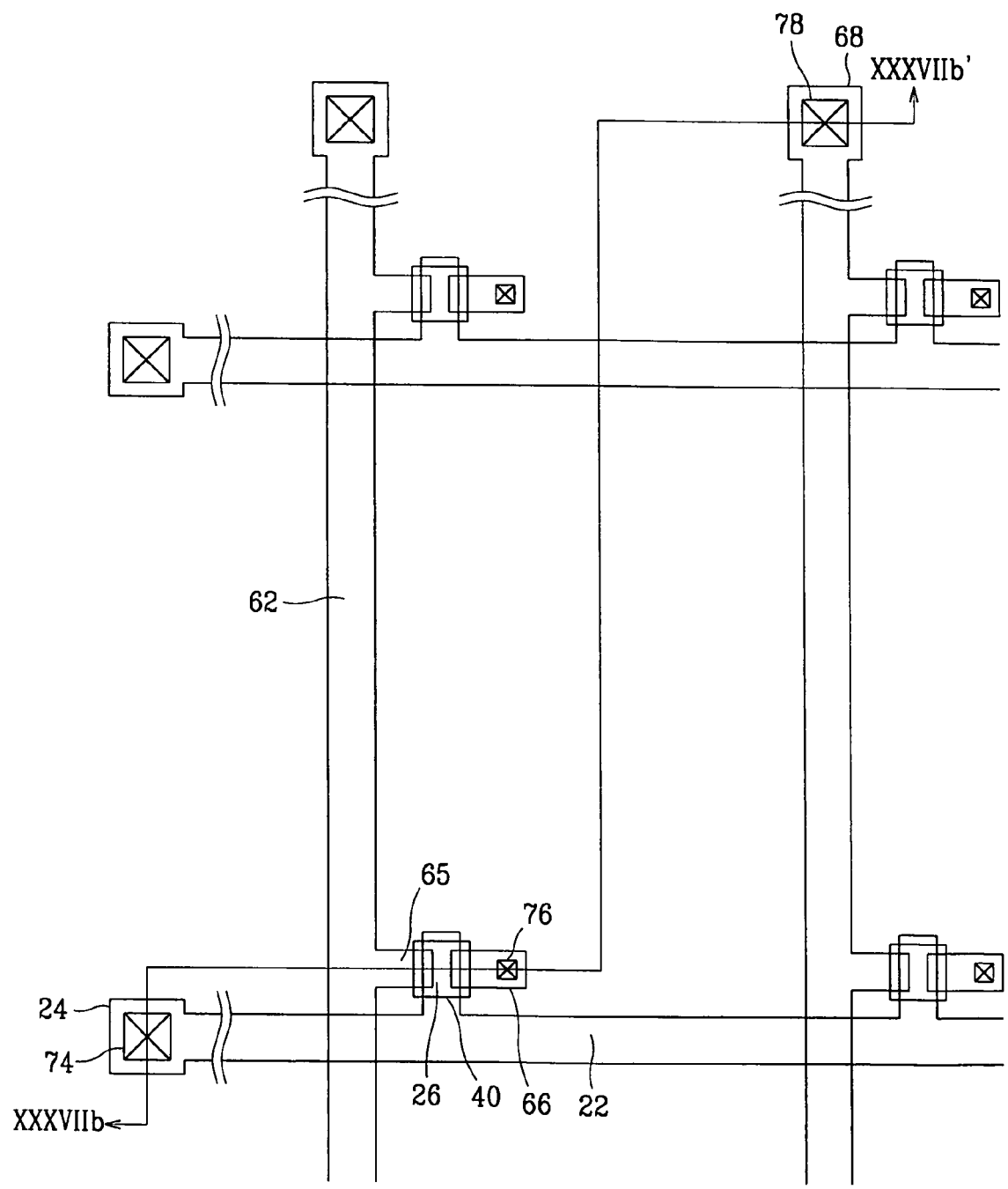
FIGS. 37A, 38A and 39A sequentially illustrate the steps of fabricating the thin film transistor array substrate shown in FIG. 35.
Figure 37B:
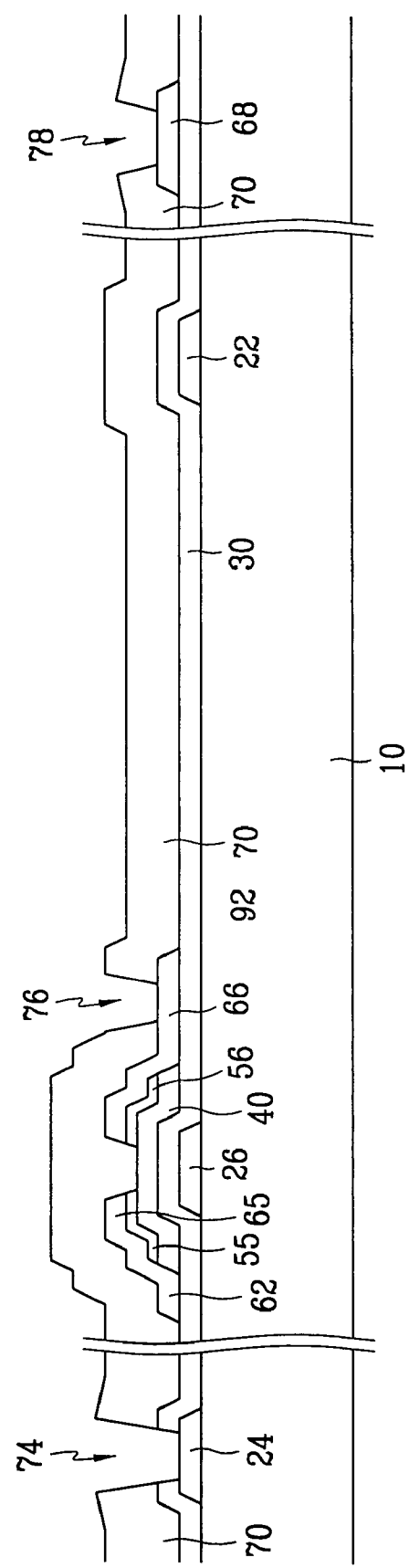
FIG. 37B is a cross sectional view of the thin film transistor array substrate taken along the XXXVIIb-XXXVIIb' line of FIG. 37A.

After the data line assembly is formed, referring to FIGS. 37A and 37B, an a-Si:C:O or a-Si:O:F layer is grown on the data line assembly through chemical vapor deposition (CVD) to thereby form a passivation layer 70. The passivation layer 70 is then patterned through photolithography together with the gate insulating layer 30 to thereby form contact holes 74, 76 and 78 exposing the gate pads 24, the drain electrodes 66, and the data pads 68. In this process, dry etching is used.

Figure 38A:
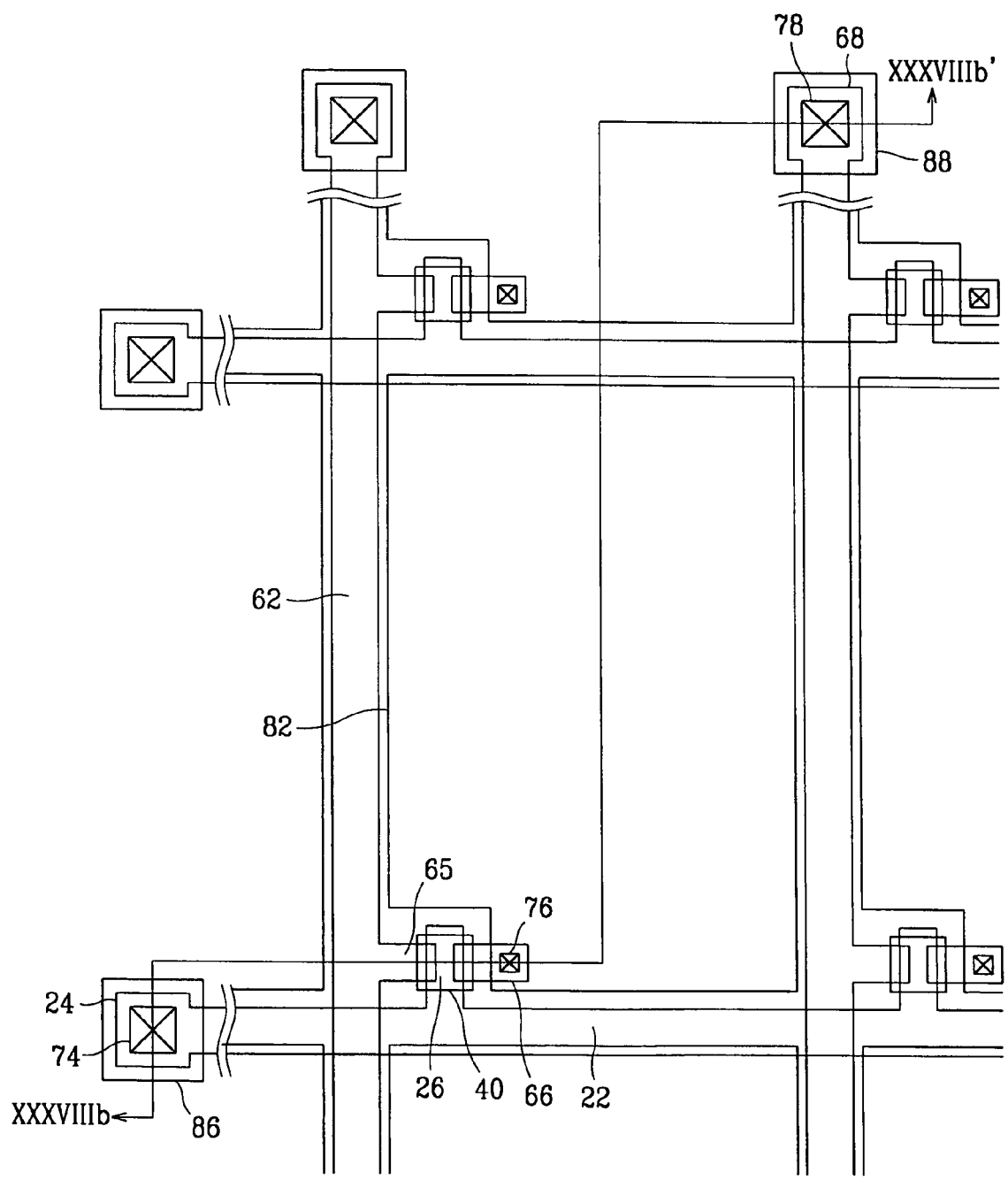
Figure 38B:
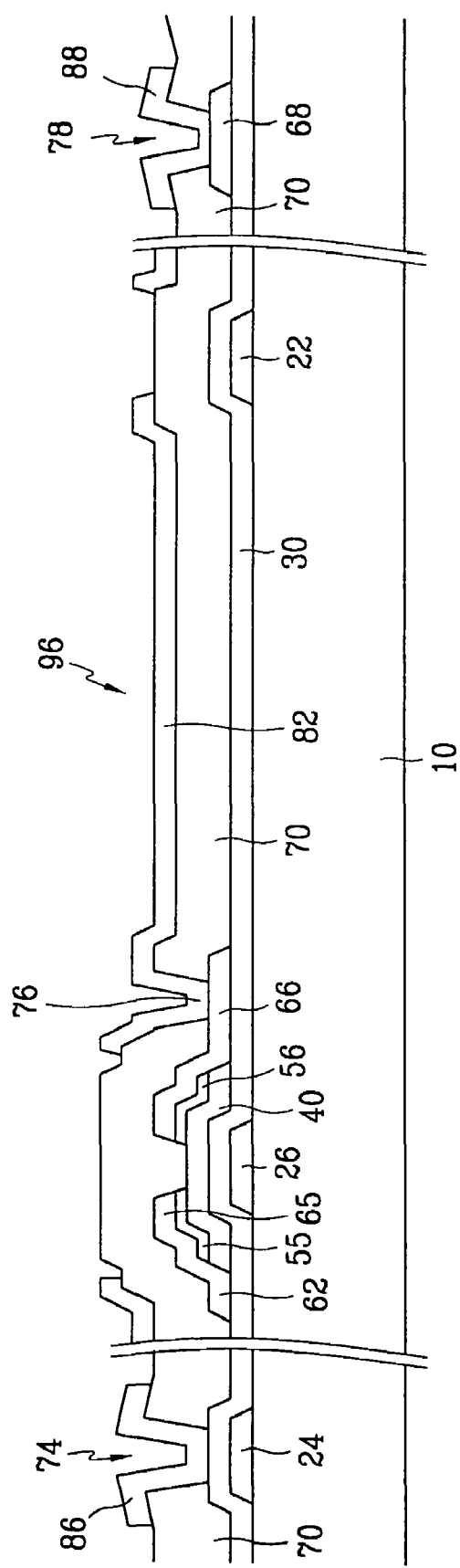
FIG. 38B is a cross sectional view of the thin film transistor array substrate taken along the XXXVIIIb-XXXVIIIb' line of FIG. 38A.

Thereafter, referring to FIGS. 38A and 38B, an ITO or IZO layer is deposited onto the substrate 10, and etched through photolithography to thereby form transparent electrodes 82, and subsidiary gate and data pads 86 and 88. The transparent electrodes 82 are connected to the drain electrodes 66 through the contact holes 76. The subsidiary gate and data pads 86 and 88 are connected to the gate and data pads 24 and 68 through the contact holes 74 and 78.

Figure 39A:
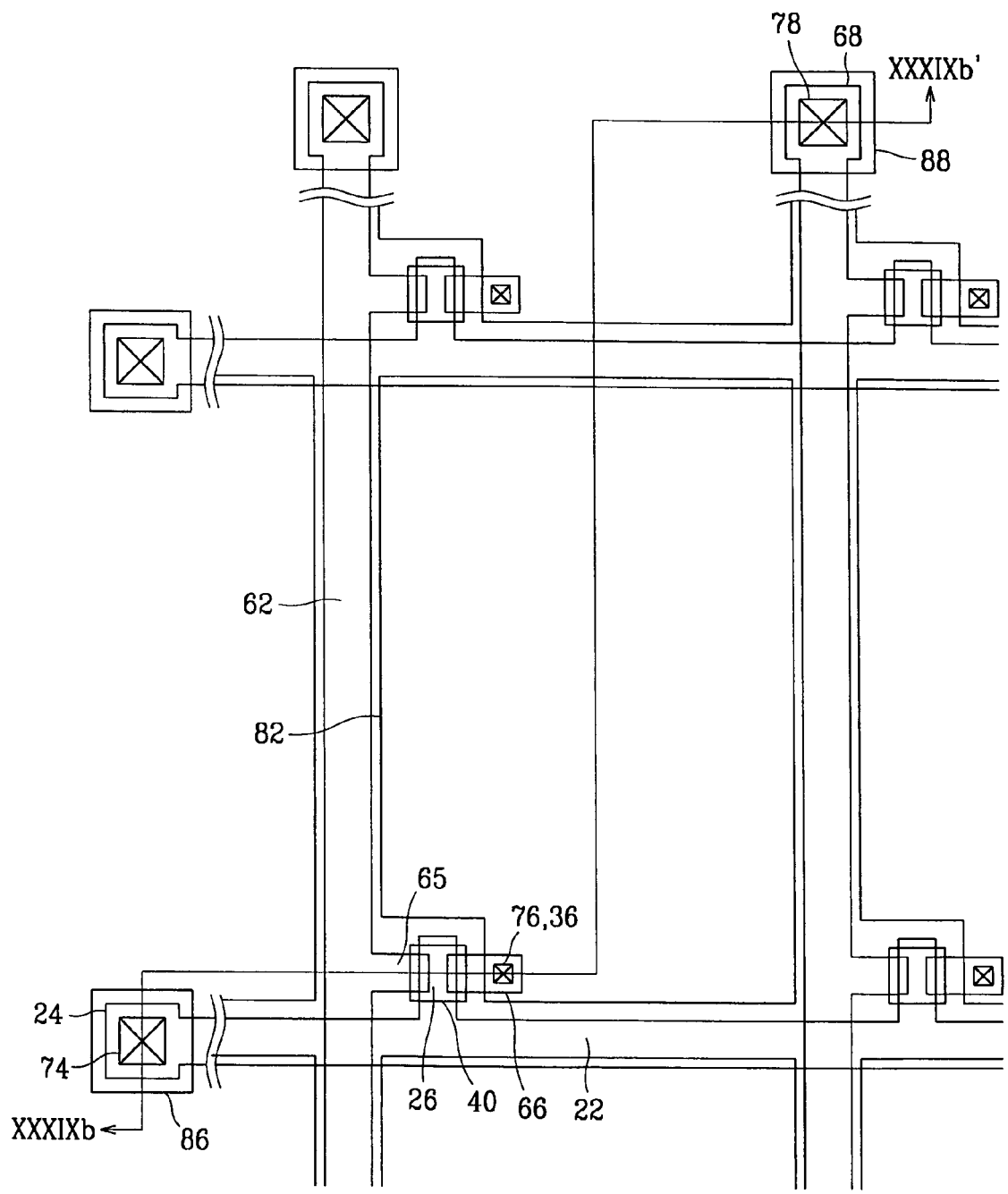
Figure 39B:
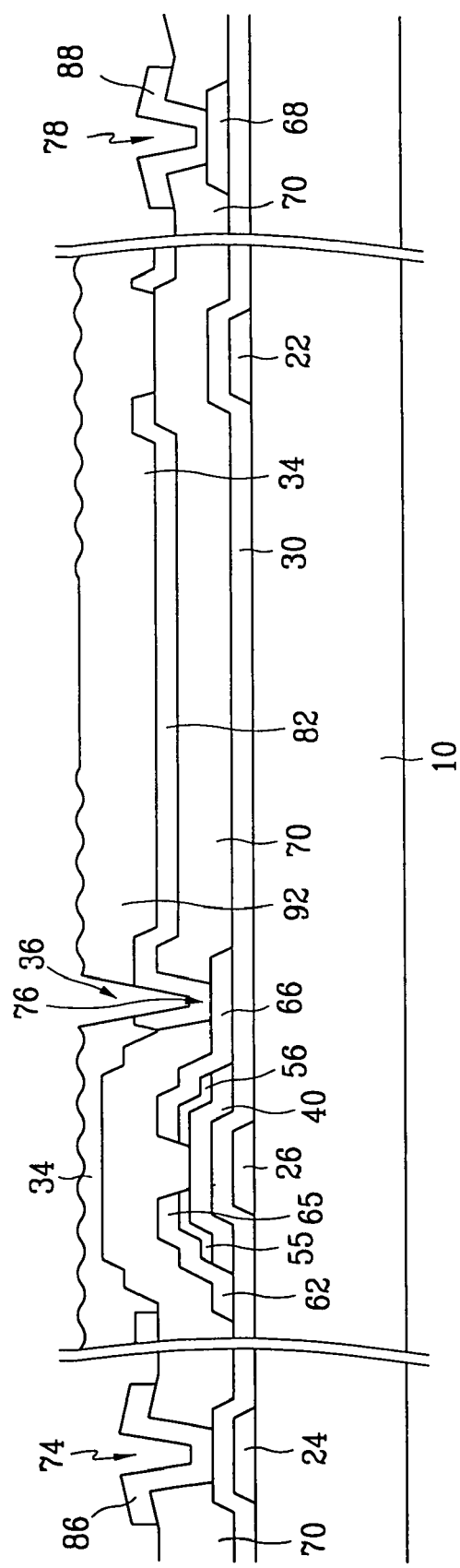
FIG. 39B is a cross sectional view of the thin film transistor array substrate taken along the XXXIXb-XXXIXb' line of FIG. 39A.

Referring to FIGS. 39A and 39B, an a-Si:C:O or a-Si:O:F layer is grown through chemical vapor deposition (CVD), and patterned through photolithography to thereby form an inter-layered insulating layer 34 with contact holes 36 exposing the transparent electrodes 82. At this time, a pattern of protrusion and depression can be formed at the inter-layered insulating layer 34. In this case, a half tone light exposing is made as in the process of patterning the passivation layer according to the fifth preferred embodiment.

Finally, as shown in FIGS. 35 and 36, a conductive layer based on a high reflective material such as aluminum, silver and molybdenum is deposited, and patterned to thereby form a reflective layer 92 with light transmission opening windows 96.

The a-Si:C:O or a-Si:O:F layer can be also used to form a gate insulating layer.

Figure 40:
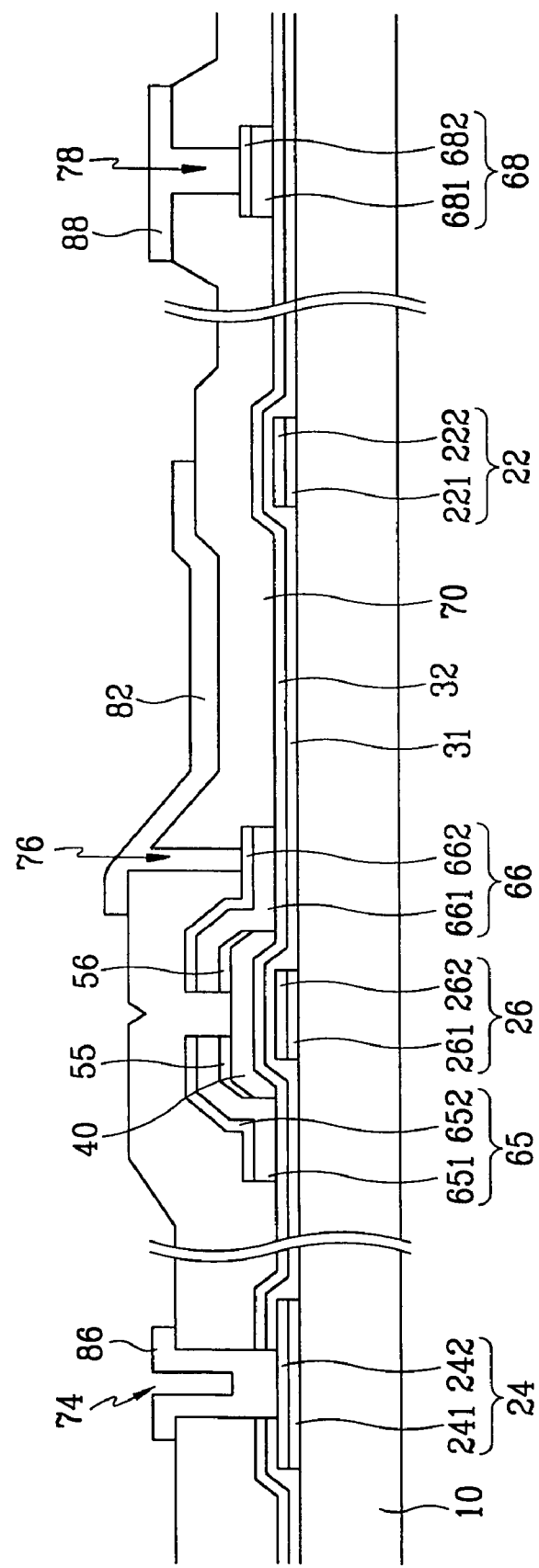
FIG. 40 is a cross sectional view of a thin film transistor array substrate according to another preferred embodiment of the present invention.

FIG. 40 is a cross sectional view of a thin film transistor array substrate according to a seventh preferred embodiment of the present invention. In this preferred embodiment, other components and structures of the thin film transistor array substrate are the same as those in the first preferred embodiment except that the gate insulating layer has a double-layered structure. The gate insulating layer includes an a-Si:C:O or a-Si:O:F layer 31, and a silicon nitride layer 32. The a-Si:C:O or a-Si:O:F layer 31 is formed through PECVD.

The gate insulating layer should have a dense membranous structure in consideration of its interface characteristics with respect to the amorphous silicon semiconductor layer 40. As the membranous structure of the gate insulating layer is denser, the rate of deposition thereof becomes slower, increasing the processing time. Meanwhile, it is known that thin film transistors operate when the dense membranous structure of the gate insulating layer is maintained up to the thickness of about 500 Å from its interface surface in contact with the semiconductor layer 40. Accordingly, when the top layer portion of the gate insulating layer is formed with an a-Si:C:O or a-Si:O:F layer involving a rapid deposition rate and the bottom layer portion thereof with a silicon nitride layer involving a dense membranous structure, the capacity of the thin film transistors is not deteriorated while the processing time is reduced. The a-Si:C:O layer involves a deposition rate about four to about ten times greater than that of the silicon nitride layer. The a-Si:C:O layer, and the silicon nitride layer are sequentially deposited in a vacuum state.

Such a gate insulating layer with a low dielectric CVD layer portion and a silicon nitride layer portion can be applied for use in the thin film transistor array substrates according to the second to the sixth preferred embodiments.

As described above, the passivation layer is formed using a low dielectric CVD layer while minimizing or avoiding the problem of parasitic capacitance. This structure can serve to enhance the opening ratio, and to reduce the processing time. Furthermore, the problems of high material cost, poor thermostability, and weak adhesive strength in a conventional organic insulating layer are avoided.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array substrate comprising:
   an insulating substrate;
   a first signal line formed on the insulating substrate;
   a first insulating layer formed on the first signal line;
   a semiconductor pattern formed on the first insulating layer;
   a second signal line formed on the semiconductor pattern and crossing over the first signal line;
   a thin film transistor including a gate electrode, a source electrode, and a drain electrode, the gate electrode connected to the first signal line and the source electrode connected to the second signal lines;
   a second insulating layer formed on the thin film transistor having a first contact hole exposing the drain electrode; and
   a first pixel electrode formed on the second insulating layer and connected to the drain electrode through the first contact hole,
   wherein the first insulating layer includes a first layer having a dielectric constant of about 4 or less, and a second layer being a silicon nitride layer, the second insulating layer has a thickness of equal to or thinner than 500 Å, the first layer of the first insulating layer is formed of a-Si:C:O, and the semiconductor pattern is formed of amorphous silicon.

2. The thin film transistor array substrate of claim 1, wherein the first layer is a bottom layer and the second layer is a top layer.

3. The thin film transistor array substrate of claim 2, wherein the second insulating layer has a dielectric constant of about 4 or less, is formed of an a-Si:C:O layer, and the a-Si:C:0 layer is formed through plasma enhanced chemical vapor deposition (PECVD) using a gaseous material selected from the group consisting of $SiH(CH_3)_3$, $SiO_2(CH_3)_4$, $(SiH)_4O_4(CH_3)_4$, and $Si(C_2H_5O)_4$ and an oxide agent of $N_2O$ or $O_2$.

4. The thin film transistor array substrate of claim 2, wherein the second insulating layer has a dielectric constant of about 4 or less, is formed of an a-Si:O:F layer and the a-Si:O:F layer is formed through plasma enhanced chemical vapor deposition (PECVD) by introducing a material selected from the group consisting of $SiH_4$ and $SiF_4$ with $CF_4$ and $O_2$ added.

5. The thin film transistor array substrate of claim 1, further comprising:
   a storage capacitor line formed at the same plane as the first signal line;
   a storage capacitor semiconductor pattern overlapped with the storage capacitor line while being placed at the same plane as the semiconductor pattern; and
   a storage capacitor conductive pattern formed on the storage capacitor semiconductor pattern while having substantially the same outline as the storage capacitor semiconductor pattern,
   wherein the storage capacitor conductive pattern is partially connected to the first pixel electrode.

6. The thin film transistor array substrate of claim 1, wherein the second insulating layer has a dielectric constant of about 4 or less, and is formed of a- Si:C:O.

7. The thin film transistor array substrate of claim 6, wherein the second insulating layer is formed through plasma enhanced chemical vapor deposition (PECVD) using a gaseous material selected from the group consisting of $SiH(CH_3)_3$, $SiO_2(CH_3)_4$, $(SiH)_4O_4(CH_3)_4$, and $Si(C_2H_5O)_4$ and an oxide agent of $N_2O$ or $O_2$.

8. The thin film transistor array substrate of claim 1, further comprising a color filter formed between the insulating substrate and the first signal line, and a third insulating layer formed between the color filter and the first signal line, wherein the third insulating layer is formed of a-Si:C:O, wherein the first pixel electrode is made of an optically transparent and electrically conductive material.

9. The thin film transistor array substrate of claim 8, wherein the third insulating layer is formed through plasma enhanced chemical vapor deposition (PECVD) using a gaseous material selected from the group consisting of $SiH(CH_3)_3$, $SiO_2(CH_3)_4$, $(SiH)_4O_4(CH_3)_4$, and $Si(C_2H_5O)_4$ and an oxide agent of $N_2O$ or $O_2$.

* * * * *